(12) United States Patent  
Harai et al.

(10) Patent No.: US 9,112,182 B2  
(45) Date of Patent: Aug. 18, 2015

(54) LIGHT-EMITTING ELEMENT AND ILLUMINATING APPARATUS

(75) Inventors: Kenichi Harai, Chiyoda-ku (JP); Hiroyasu Inoue, Chiyoda-ku (JP)

(73) Assignee: ZEON CORPORATION, Tokyo (JP)

( * ) Notice: Subject to any disclaimer, the term of this patent is extended or adjusted under 35 U.S.C. 154(b) by 55 days.

(21) Appl. No.: 14/007,774

(22) PCT Filed: Mar. 27, 2012

(86) PCT No.: PCT/JP2012/057961  
§ 371 (c)(1), (2), (4) Date: Sep. 26, 2013

(87) PCT Pub. No.: WO2012/133425  
PCT Pub. Date: Oct. 4, 2012

(65) Prior Publication Data  
US 2014/0014938 A1  Jan. 16, 2014

(30) Foreign Application Priority Data

Mar. 29, 2011  (JP) .................................. 2011-073307  
Mar. 30, 2011  (JP) .................................. 2011-076217

(51) Int. Cl.  
*H01L 33/00* (2010.01)  
*H01L 51/52* (2006.01)

(52) U.S. Cl.  
CPC ........ *H01L 51/5271* (2013.01); *H01L 51/5262* (2013.01); *H01L 51/5275* (2013.01); *H01L 2251/5323* (2013.01); *H01L 2251/5361* (2013.01)

(58) Field of Classification Search  
None  
See application file for complete search history.

(56) References Cited

U.S. PATENT DOCUMENTS

2005/0169008 A1  8/2005  Okazaki  
2005/0212989 A1  9/2005  Kashiwagi et al.  
(Continued)

FOREIGN PATENT DOCUMENTS

| EP | 1462828 A2 | 9/2004 |
|---|---|---|
| JP | 8-83688 A | 3/1996 |

(Continued)

OTHER PUBLICATIONS

International Search Report for PCT/JP2012/057961 mailed on Jul. 3, 2012.

(Continued)

*Primary Examiner* — David Vu  
*Assistant Examiner* — Cuong Nguyen  
(74) *Attorney, Agent, or Firm* — Birch, Stewart, Kolasch & Birch, LLP

(57) ABSTRACT

A light-emitting device comprising: an organic electroluminescence element that has a light-emitting surface and emits light from the light-emitting surface; and a structure layer that is provided directly or indirectly on the light-emitting surface of the organic electroluminescence element, wherein the structure layer has a concavo-convex structure on a surface of the structure layer, the surface being opposite to the organic electroluminescence element, the concavo-convex structure including a first streak array extending in a first direction that is parallel to the surface, a second streak array extending in a second direction that is parallel to the surface and intersects the first direction, and a third streak array extending in a third direction that is parallel to the surface and intersects the first direction and the second direction, the concavo-convex structure includes flat surface portions parallel to the light-emitting surface and an inclined surface portion that is inclined with respect to the light-emitting surface, and a projected area formed by projecting the inclined surface portion upon a plane parallel to the flat surface portions in a direction perpendicular to the flat surface portions is 0.1 times or less times a total area of the flat surface portions.

10 Claims, 25 Drawing Sheets

(56) References Cited

U.S. PATENT DOCUMENTS

| | | |
|---|---|---|
| 2009/0116221 A1 | 5/2009 | Sato et al. |
| 2010/0177500 A1 | 7/2010 | Ohkawa et al. |
| 2012/0068596 A1 | 3/2012 | Inoue et al. |

FOREIGN PATENT DOCUMENTS

| | | |
|---|---|---|
| JP | 3560375 B2 | 6/2004 |
| JP | 2005-221516 A | 8/2005 |
| JP | 2009-151955 A | 7/2009 |
| JP | 2010-27428 A | 2/2010 |
| JP | 2010-164715 A | 7/2010 |
| WO | WO 02/103813 A1 | 12/2002 |
| WO | WO 2004/017106 A1 | 2/2004 |
| WO | WO 2010-143706 A1 | 12/2010 |

OTHER PUBLICATIONS

Written Opinion of the International Searching Authority for PCT/JP2012/057961 mailed on Jul. 3, 2012. (Japanese).

Extended European Search Report for European Application No. 12765852.4, dated Nov. 24, 2014.

LIGHT-EMITTING ELEMENT AND ILLUMINATING APPARATUS

FIELD

The present invention relates to a light-emitting device and a lighting apparatus including the light-emitting device. More specifically, the present invention relates to a light-emitting device including an organic electroluminescence element (appropriately referred to hereinbelow as an "organic EL element"), and a lighting apparatus including the light-emitting device.

BACKGROUND

A light-emitting device including an organic EL element can be configured to have a planar shape and can emit light of white color or a color close thereto. The light-emitting device including an organic EL element may thus be used as light sources of lighting apparatuses for illuminating space such as a living environment, or may be used in applications for backlight devices of display devices.

Currently known organic EL elements, however, have insufficiently low efficiency for the aforementioned illumination purposes. Thus there is a demand for improving light extraction efficiency of the organic EL elements. A known method for improving the light extraction efficiency of an organic EL element is to provide a variety of types of concavo-convex structures on a light-emitting surface of a single side emission type organic EL element. For example, it has been proposed to provide a structure layer having a concavo-convex structure on a light-emitting surface of an organic EL element (see Patent Literature 1). This concavo-convex structure can achieve favorable collection of light to improve the aforementioned light extraction efficiency.

Furthermore, studies have been made regarding light-emitting devices of see-through type in which transparent electrodes are employed as the electrodes of an organic EL element and thereby the other side of the light-emitting device can be observed therethrough (see Patent Literature 2).

Technologies of Patent Literatures 3 and 4 have also been known.

CITATION LIST

Patent Literature

Patent Literature 1: WO2004/017106
Patent Literature 2: Japanese Patent Publication No. 3560375 B
Patent Literature 3: Japanese Patent Application Laid-Open No. 2010-164715 A
Patent Literature 4: Japanese Patent Application Laid-Open No. 2005-221516 A

SUMMARY

Technical Problem

In addition to ones of single side emission type, light-emitting devices with an organic EL element include light-emitting devices of double side emission type where light is extracted from both surfaces. Since there is a demand for high-efficiency light extraction also for the light-emitting devices of double side emission type, the present inventor has conducted an experiment wherein a concavo-convex structure is provided on a light-emitting device of double side emission type in the same manner as that of a light-emitting device of single side emission type. However, it was found out that mere application of a concavo-convex structure designed for a light-emitting device of single side emission type to a light-emitting device of double side emission type does not result in expected performance.

Each layer included in a light-emitting device of double side emission type is usually configured so that light can pass therethrough. Therefore an ordinary light-emitting device of double side emission type has a see-through feature so that the other side of the light-emitting device can be observed therethrough. By having such a see-through feature, the light-emitting device can have a highly valuable design, and can be applicable to a wide variety of uses. Therefore, the see-through feature is one of the advantages of the light-emitting device of double side emission type. It is therefore desirable to avoid losing the ability of the light-emitting device to enable observation of the other side through the device even if a concavo-convex structure is provided to extract light with high efficiency.

On the other hand, from the viewpoint of improving the light extraction efficiency, a light-emitting device of single side emission type is configured to include a reflecting layer (such as a reflecting electrode) so that light that has been emitted from the organic EL element to a surface opposite to a light-emitting surface is reflected by the reflecting layer. Therefore, light that has entered from outside into the light-emitting device of single side emission type is also reflected by the reflecting layer. Thus the other side of the light-emitting device cannot be observed therethrough. From such a reason, unlike the light-emitting device of double sided emission type, generally no studies has been developed on see-through feature of the prior-art concavo-convex structure formed on the light-emitting device of single side emission type. Consequently, provision of the prior-art concavo-convex structure to the light-emitting device of double side emission type usually results in high haze, and the other side of the light-emitting device can not be observed therethrough.

An example of the shape of the concavo-convex structure provided to the light-emitting surface of the organic EL element is a shape including a streak array extending in a certain direction. When the concavo-convex structure for the light-emitting device of double side emission type includes such a streak array, the streak array is sometimes visually recognized depending on the observation angle. For example, when the concavo-convex structure is observed at an inclined polar angle with respect to the light-emitting surface of the organic EL element, streaks are sometimes visually recognized along the extending direction of the streak array. In particular, when there are two groups of streak arrays in a grid-shaped configuration, streaks of the streak arrays in certain areas are sometimes visually recognized, which in turn results in the observation of unevenness of reflected light on the surface of the concavo-convex structure. Such unevenness may be referred to hereinbelow as "grid unevenness resulting from the streak arrays". Grid unevenness resulting from the streak arrays is caused by irradiation of light from outside of the light-emitting device which is then reflected at the concavo-convex structure, and then observed as unevenness. Thus it is expected that the grid unevenness would disappear if the streaks of the streak arrays become non-recognizable. The grid unevenness resulting from the streak arrays which is discussed as a problem does not mean that the visually-recognized reflected light has an intensity larger or higher than that of the surrounding, but means that the reflected light has unevenness in visibility such that streaks of the aforementioned streak arrays are visible and the extending directions of the streak arrays are recognizable.

The present invention has been developed in view of the foregoing, and it is a first object thereof to provide a light-emitting device from which light can be extracted with high efficiency while maintaining see-through feature and whose streaks of streak arrays are not easily recognizable, and a lighting apparatus including the light-emitting device.

By the way, the applicant of the present application has proposed, in Japanese Patent Application No. 2010-147787, a concavo-convex structure suited to a light-emitting device of see-through type in order to also improve the light extraction efficiency of the light-emitting device of see-through type as described above.

An example of the surface shape of a concavo-convex structure provided to the light-emitting surface of the organic EL element is a shape in which concave portions or convex portions are arranged in a discretely dispersed manner on a flat surface. In the concavo-convex structure of such a shape, surface portions where the concave portions or convex portions are not formed may include surface portions of band shape extending in an in-plane direction (which may be referred to hereinbelow as "band-shaped surface potions"). When the concavo-convex structure provided to a light-emitting device of see-through type includes such band-shaped surface portions, the band-shaped surface portions are sometimes visually recognized depending on the observation angle. For example, when the concavo-convex structure is observed at an inclined polar angle with respect to the light-emitting surface of the organic EL element, streaks are sometimes visually recognized along the extending direction of the band-shaped surface portions. In particular, when the band-shaped surface portions are in a grid-shaped configuration, streaks of the band-shaped surface portions in certain areas are sometimes visually recognized, which in turn results in the observation of unevenness of reflected light on the surface of the concavo-convex structure. Such unevenness may be referred to hereinbelow as "grid unevenness resulting from the band-shaped surface portions". Grid unevenness resulting from the band-shaped surface portions is caused by irradiation of light from outside of the light-emitting device which is then reflected at the concavo-convex structure, and then observed as unevenness. Thus it is expected that the grid unevenness would disappear if the streaks of the band-shaped surface portions become non-recognizable. The grid unevenness resulting from the band-shaped surface portions which is discussed as a problem does not mean that the visually-recognized reflected light has an intensity larger or higher than that of the surrounding, but means that the reflected light has unevenness in visibility such that streaks of the aforementioned band-shaped surface portions are visible and the extending directions of the band-shaped surface portions are recognizable.

The present invention has been achieved in view of the foregoing, and it is a second object thereof to provide a light-emitting device of see-through type which has a high light extraction efficiency and whose streaks of band-shaped surface portions are not easily recognizable.

Means for Solving the Problems

The present inventor has conducted intensive studies in view of the aforementioned first object. As a result, the present inventor has found out that, in a light-emitting device having a concavo-convex structure on a light-emitting surface thereof, when the concavo-convex structure includes three or more groups of streak arrays extending in different directions and an area ratio between flat surface portions and inclined surface portions of the concavo-convex structure is controlled, it is possible to achieve a light-emitting device whose streaks of the streak arrays are less visible and from which light can be extracted with high efficiency while maintaining see-through feature. The present inventor has thus completed a first aspect of the invention.

That is, the first aspect of the invention is as follows:

(1) A light-emitting device comprising: an organic electroluminescence element that has a light-emitting surface and emits light from the light-emitting surface; and a structure layer that is provided directly or indirectly on the light-emitting surface of the organic electroluminescence element, wherein the structure layer has a concavo-convex structure on a surface of the structure layer, the surface being opposite to the organic electroluminescence element, the concavo-convex structure including a first streak array extending in a first direction that is parallel to the surface, a second streak array extending in a second direction that is parallel to the surface and intersects the first direction, and a third streak array extending in a third direction that is parallel to the surface and intersects the first direction and the second direction, the concavo-convex structure includes flat surface portions parallel to the light-emitting surface and an inclined surface portion that is inclined with respect to the light-emitting surface, and a projected area formed by projecting the inclined surface portion upon a plane parallel to the flat surface portions in a direction perpendicular to the flat surface portions is 0.1 times or less times a total area of the flat surface portions.

(2) The light-emitting device according to (1), wherein a maximum value of a height difference between the flat surface portions of the concavo-convex structure is 22 or smaller.

(3) The light-emitting device according to (1) or (2), wherein the inclined surface portion is inclined at an inclination angle of 80° or larger and smaller than 90° with respect to the flat surface portions.

(4) The light-emitting device according to any one of (1) to (3), wherein a maximum value of a height difference between the flat surface portions is 0.1 μm or larger.

(5) A lighting apparatus comprising the light-emitting device according to any one of (1) to (4).

The present inventor has conducted intensive studies in view of the aforementioned second object. As a result, the present inventor has found out that, in a concavo-convex structure layer provided on a light-emitting surface of an organic EL element, by controlling an area ratio between flat surface portions and inclined surface portions that the concavo-convex structure layer has, it is possible to achieve highly efficient light extraction while maintaining see-through feature. The present inventor has also found out that, when the flat surface portion of the concavo-convex structure layer includes band-shaped surface portions, by giving variation to the width of the band-shaped surface portions along a direction in which the band-shaped surface portion extends, streaks of the band-shaped surface portions are not easily recognizable. A second aspect of the present invention has been completed on the basis of these findings.

That is, the second aspect of the invention is as follows:

(6) A light-emitting device comprising: an organic electroluminescence element of double side emission type that includes a first transparent electrode layer, a light-emitting layer, and a second transparent electrode layer in this order; and a light-emitting surface structure layer that is provided directly or indirectly on at least one surface of the organic electroluminescence element, wherein the light-emitting surface structure layer has a concavo-convex structure on a surface opposite to the organic electroluminescence element, the concavo-convex structure including flat surface portions parallel to the one surface of the electroluminescence element and an inclined surface portion inclined with respect to the flat surface portions, the flat surface portions include a band-shaped surface portion extending in one direction, the band-shaped surface portion has a width that varies along a direction in which the band-shaped surface portion extends, and a projected area formed by projecting the inclined surface portion upon a plane parallel to the flat surface portions in a direction perpendicular to the flat surface portions is 0.1 times or less times a total area of the flat surface portions.

(7) The light-emitting device according to (6), wherein a maximum value of a height difference between the flat surface portions of the concavo-convex structure is 22 μm or smaller.

(8) The light-emitting device according to (6) or (7), wherein the inclined surface portion is inclined at an inclination angle of 80° or larger and smaller than 90° with respect to the flat surface portions.

(9) The light-emitting device according to any one of (6) to (8), wherein a maximum value of a height difference between the flat surface portions is 0.1 μm or larger.

(10) A lighting apparatus comprising the light-emitting device according to any one of (6) to (9).

Advantageous Effects of Invention

According to the first aspect of the invention, it is possible to achieve a light-emitting device from which light can be extracted with high efficiency while maintaining see-through feature and whose streaks of the streak arrays are not easily recognizable, and a lighting apparatus including the light-emitting device.

According to the second aspect of the invention, it is possible to achieve a light-emitting device of see-through type which has a high light extraction efficiency and whose streaks of the band-shaped surface portions are not easily recognizable, and a lighting apparatus including the light-emitting device.

DESCRIPTION OF EMBODIMENTS

The present invention will be described in detail hereinbelow by way of embodiments and exemplifications. However, the present invention is not limited to the following embodiments and exemplifications, and may be implemented with arbitrary modifications without departing from the scope of claims equivalents thereto. In the flowing description, being "along" a direction means being "in parallel with" the direction.

I. Description of Embodiments According to First Invention

I.1. Embodiment I-1

Figure 1:
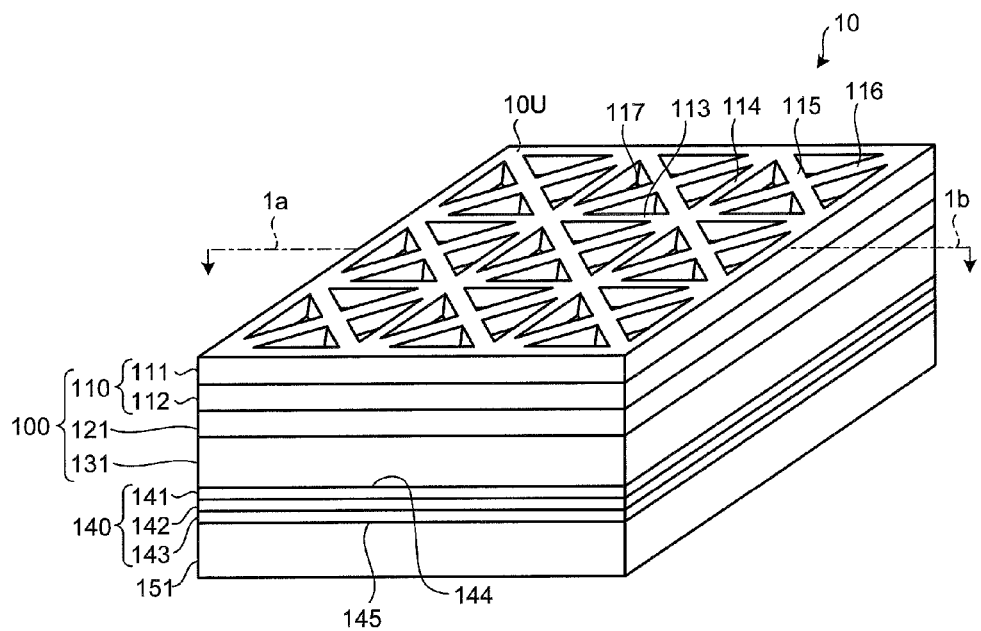
FIG. 1 is a perspective view schematically illustrating a light-emitting device according to Embodiment I-1 of the present invention.
Figure 2:
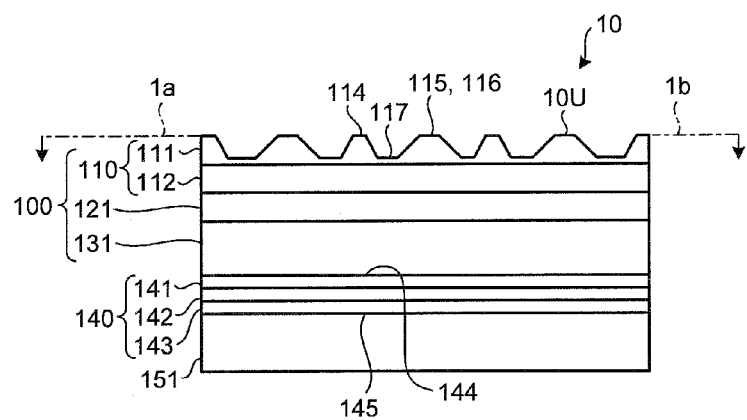
FIG. 2 is a view for explaining the light-emitting device according to embodiment I-1 of the present invention, and is a cross-sectional view schematically illustrating a cross section of the light-emitting device shown in FIG. 1 taken along a plane that includes line 1a-1b and is perpendicular to a light-emitting surface.

FIGS. 1 and 2 are both views for explaining a light-emitting device according to embodiment I-1 of the present invention. FIG. 1 is a perspective view schematically illustrating the light-emitting device. FIG. 2 is a cross-sectional view schematically illustrating a cross section of the light-emitting device shown in FIG. 1, taken along a plane that includes line 1a-1b and is perpendicular to a light-emitting surface.

As shown in FIG. 1, the light-emitting device 10 according to embodiment I-1 of the present invention is a device having a structure of rectangular flat plate shape, and includes an organic EL element 140 of double side emission type. The organic EL element 140 includes at least a first electrode layer 141, a light-emitting layer 142, and a second electrode layer 143 in this order. Moreover, in the present embodiment, the first electrode layer 141 and the second electrode layer 143 are both transparent electrode layers. Light generated in the light-emitting layer 142 passes through the first electrode layer 141 and the second electrode layer 143 and then goes out through surfaces 144 and 145, respectively. In the following description of the first aspect of the invention, the surfaces 144 and 145 therefore may be referred to as "light-emitting surfaces".

On at least one light-emitting surface 144 of the organic EL element 140, a light-emitting surface structure layer 100 serving as a structure layer according to the first aspect of the invention is provided. In the present embodiment, the light-emitting surface structure layer 100 is directly provided in contact with the light-emitting surface 144. However, the light-emitting surface structure layer 100 may also be provided indirectly on the light-emitting surface 144 through a layer such as a bonding layer or a light diffusion layer.

The light-emitting device 10 of the present embodiment may further include constituent components other than the aforementioned members. In the present embodiment, a sealing substrate 151 is provided on the light-emitting surface 145, shown as the lower surface in the figure, of the organic EL element 140.

Consequently, the light-emitting device 10 includes the sealing substrate 151, the organic EL element 140, and the light-emitting surface structure layer 100 in this order, and is configured so that light goes out through a surface 10U which is the surface of the light-emitting surface structure layer 100 being opposite to the organic EL element 140, and light also goes out through a surface 10D which is the surface of the sealing substrate 151 being opposite to the organic EL element 140. Since the aforementioned surfaces 10U and 10D are located at the outermost positions of the light-emitting device 10 and light goes out to the outside of the light-emitting device 10 through the surfaces 10U and 10D, the surfaces 10U and 10D may be referred to as "light-emitting surfaces".

[I.1.1. Organic EL Element]

As exemplified by the organic EL element 140, an organic EL element usually includes two or more electrode layers, and a light-emitting layer which is provided between these electrode layers and emits light when a voltage is applied thereto from the electrode layers.

The organic EL element usually has a structure that is obtained by forming on a substrate the layers constituting the organic EL element, such as the electrode layers and the light-emitting layer, and then providing a sealing member covering those layers so that the substrate and the sealing member seal the layers such as the light-emitting layer.

The light-emitting layer is not particularly limited, and a known light-emitting layer may be appropriately selected. The light-emitting material in the light-emitting layer is not limited to one species, and two or more species may be used in combination at any ratio. The number of light-emitting layers is not limited to one, either. One type of layers or a plurality of types of layers may be used in combination in order to be adapted to its use as a light source. This can enable emission of white light or light of a color close to white.

The electrode layers of the organic EL element according to the first aspect of the invention are both transparent electrode layers made of a transparent material. As used herein, being "transparent" means having a light transmittance suitable for use as an optical member. For example, electrode layers having a high light transmittance so that the entire light-emitting device 10 has a desired total light transmittance, which will be described later, may be used as the transparent electrode layers. Provision of the transparent electrode layers having such high transparency can improve the extraction efficiency of the light generated in the light-emitting layer, and realizes a light-emitting device through which the other side of the device can be clearly observed. As the material for the transparent electrode layers, one species thereof may be solely used. Alternatively two or more species thereof may be used in combination at any ratio. Furthermore, the transparent electrode layer may be a layer having monolayer structure including only one layer, or may be a layer having multilayer structure including two or more layers.

In addition to the light-emitting layer 142, the organic EL element 140 may further include other layers (not shown) between the electrode layer 141 and the electrode layer 143. Examples thereof may include a hole injection layer, a hole transport layer, an electron transport layer, and an electron injection layer. The organic EL element 140 may further include optional constituent components such as wiring for applying electricity to the electrode layers 141 and 143 and a peripheral structure for sealing the light-emitting layer 142.

Materials for constituting the electrode layers and the layer(s) interposed between the electrode layers are not particularly limited. Specific examples of such materials may include the following.

Examples of the material for the transparent electrode layer may include ITO (indium tin oxide).

Examples of the material for the hole injection layer may include starburst type aromatic diamine compounds.

Examples of the material for the hole transport layer may include triphenyl diamine derivatives.

Examples of the host material for a yellow light-emitting layer may include triphenyl diamine derivatives. Examples of the dopant material for the yellow light-emitting layer may include tetracene derivatives.

Examples of the material for a green light-emitting layer may include pyrazoline derivatives.

Examples of the host material for a blue light-emitting layer may include anthracene derivatives.

Examples of the dopant material for the blue light-emitting layer may include perylene derivatives.

Examples of the material for a red light-emitting layer may include europium complexes.

Examples of the material for the electron transport layer may include aluminum quinoline complexes (Alq).

Examples of the material for the reflecting electrode layer may include a stack of lithium fluoride and aluminum layers that is produced by sequentially depositing these layers by vacuum deposition.

The aforementioned layers and other light-emitting layers may be suitably combined to form a light-emitting layer which is referred to as multi-layer type or tandem type which emits light having complementary colors. Examples of combinations of complementary colors may include yellow/blue, and green/blue/red.

[I.1.2. Light-Emitting Surface Structure Layer]

The light-emitting surface structure layer 100 is a layer provided on the light-emitting surface 144 of the organic EL element 140. A surface of this light-emitting surface structure layer 100 opposite to the organic EL element 140 is the light-emitting surface 10U. The light-emitting surface 10U is a surface exposed on the outermost surface of the light-emitting device 10, and serves as the light-emitting surface of the light-emitting device 10. That is, the surface serves as a light-emitting surface when light goes out from the light-emitting device 10 to the outside of the device.

In a macroscopic view, the light-emitting surface 10U is a surface parallel to the light-emitting surface 144 of the organic EL element 140 and is parallel to the main surface of the light-emitting device 10. In a microscopic view, however, the light-emitting surface 10U has a concavo-convex structure, and sections corresponding to the surfaces of the concave portions or convex portions can thus form non-parallel angles with respect to the light-emitting surface 144. In the following description of the first aspect of the invention, unless otherwise specified, being parallel to or perpendicular to the light-emitting surface means being parallel to or perpendicular to the light-emitting surface in a macroscopic view, with the concave portions or convex portion being neglected. In the following explanation, unless otherwise specified, the light-emitting device 10 will be described as placed with the light-emitting surface 10U facing upward and in parallel with a horizontal direction.

Furthermore, a constituent component being "parallel" or "perpendicular" may include errors within the range of not impairing the effects of the present invention, e.g., within the range of ±5°.

The light-emitting surface structure layer 100 includes a multi-layered body 110 which includes a concavo-convex structure layer 111 and a substrate film layer 112, a supporting substrate 131 which serves as a substrate, and a bonding layer 121 which bonds the multi-layered body 110 and the supporting substrate 131.

The concavo-convex structure layer 111 is a layer located at the top surface of the light-emitting device 10 (i.e., the outermost layer on the light-emitting surface side of the light-emitting device 10). This concavo-convex structure layer 111 has a concavo-convex structure including a first streak array 113, a second streak array 114, a third streak array 115, and a fourth streak array 116. As used herein, a "streak array" refers to a group of plural rows of concave portions or convex portions continuously extending over a certain length in a certain direction. Therefore, the direction in which a streak array extends therefore refers to a direction in which the concave portions or convex portions included in the streak array extend. For example, a streak array may include only concave portions formed in a groove shape, may include only convex portions formed in a ridge shape, or may include a combination of these. In the present embodiment, each of the first to fourth streak arrays 113 to 116 is formed of convex portions relatively protruding from the surrounding. Consequently, in positions between the first to fourth streak arrays 113 to 116, there exist relatively indented concave portions 117. In the concavo-convex structure layer 111 of the present embodiment, the concavo-convex structure includes the first to fourth streak arrays 113 to 116 including convex portions and the concave portions 117. The concave-convex structure defines the light-emitting surface 10U.

The drawings in the present description are only schematic representations, and the first to fourth streak arrays 113 to 116 shown on the light-emitting surface 10U include only a small number of convex portions. In an actual light-emitting device, the light-emitting surface 10U of a single light-emitting device may include a much larger number of convex portions.

(Description of Concavo-Convex Structure)

The concavo-convex structure of the light-emitting surface 10U will be described hereinbelow in detail with reference to the drawings.

Figure 3:
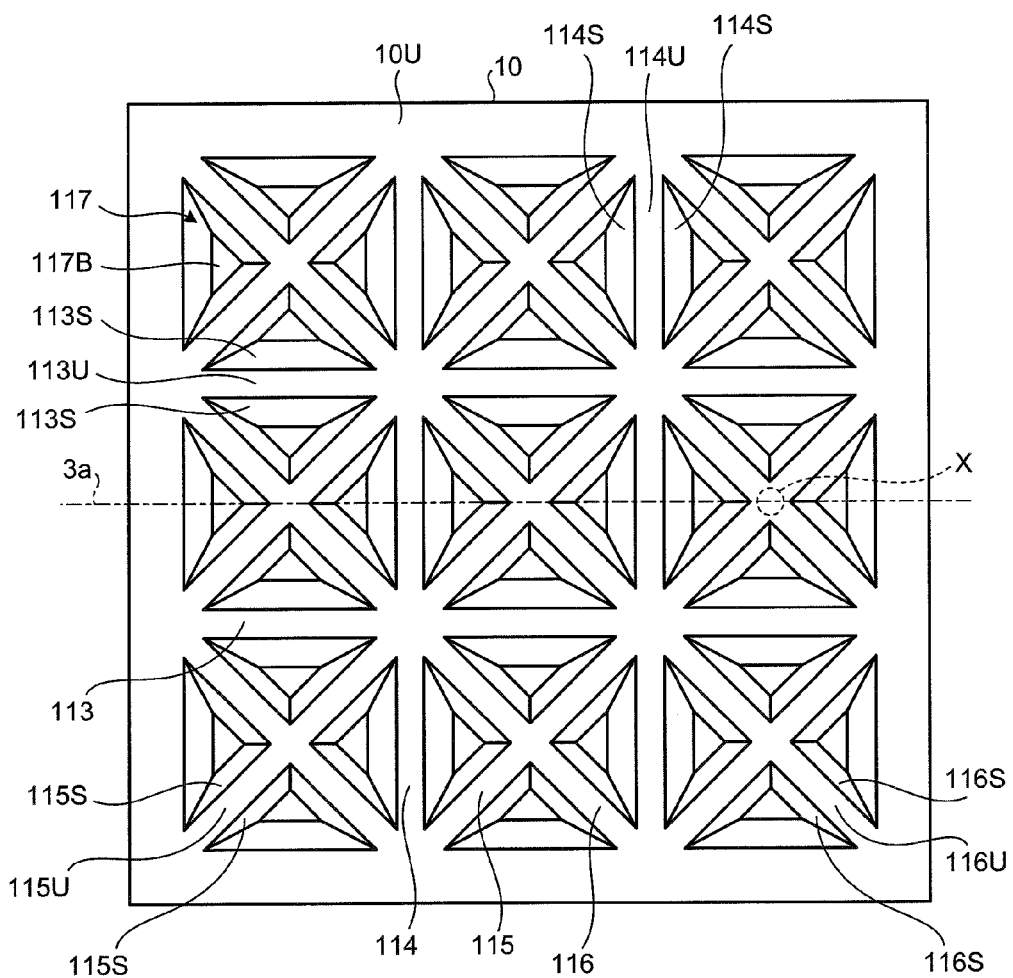
FIG. 3 is an enlarged plan view schematically illustrating the appearance of the light-emitting surface of the light-emitting device according to embodiment I-1 of the present invention as viewed in the thickness direction of the light-emitting device.
Figure 4:
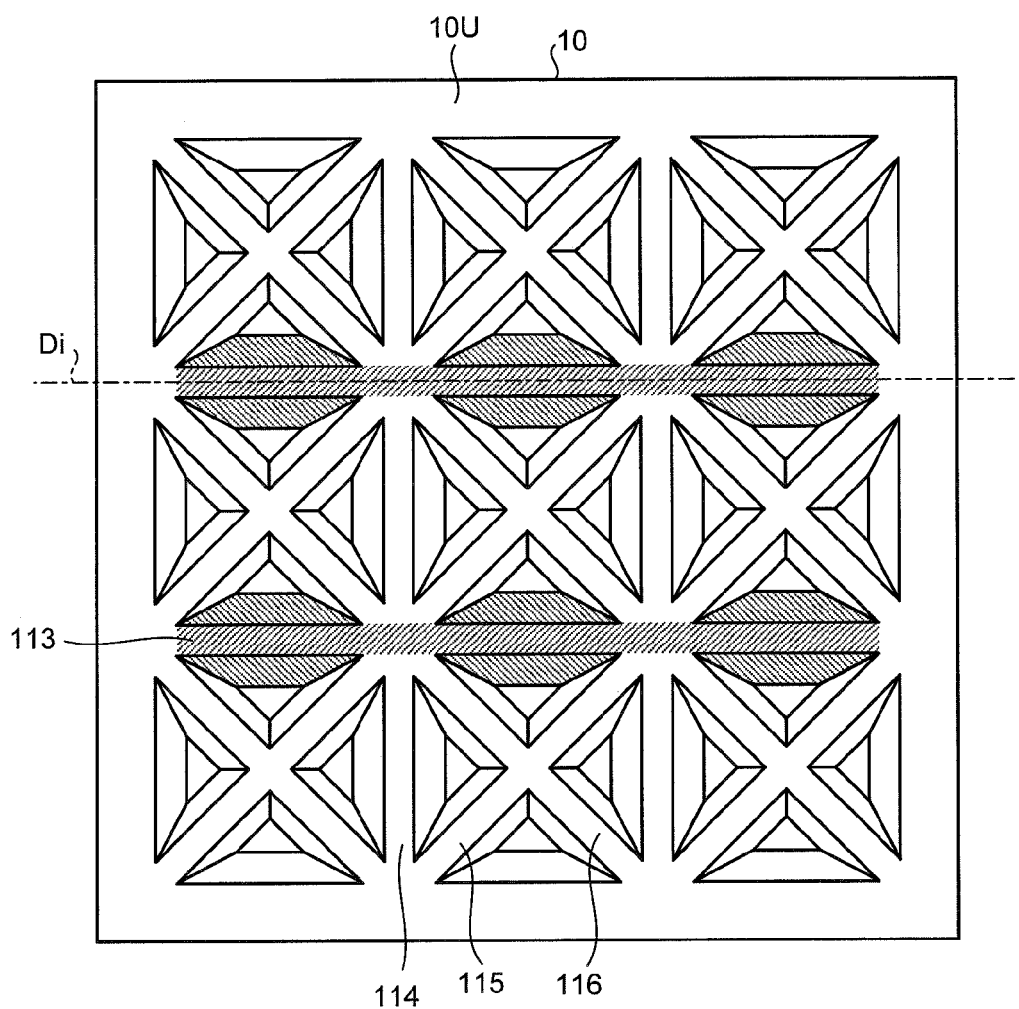
FIG. 4 is an enlarged plan view schematically illustrating the appearance of the light-emitting surface of the light-emitting device according to embodiment I-1 of the present invention as viewed in the thickness direction of the light-emitting device.
Figure 5:
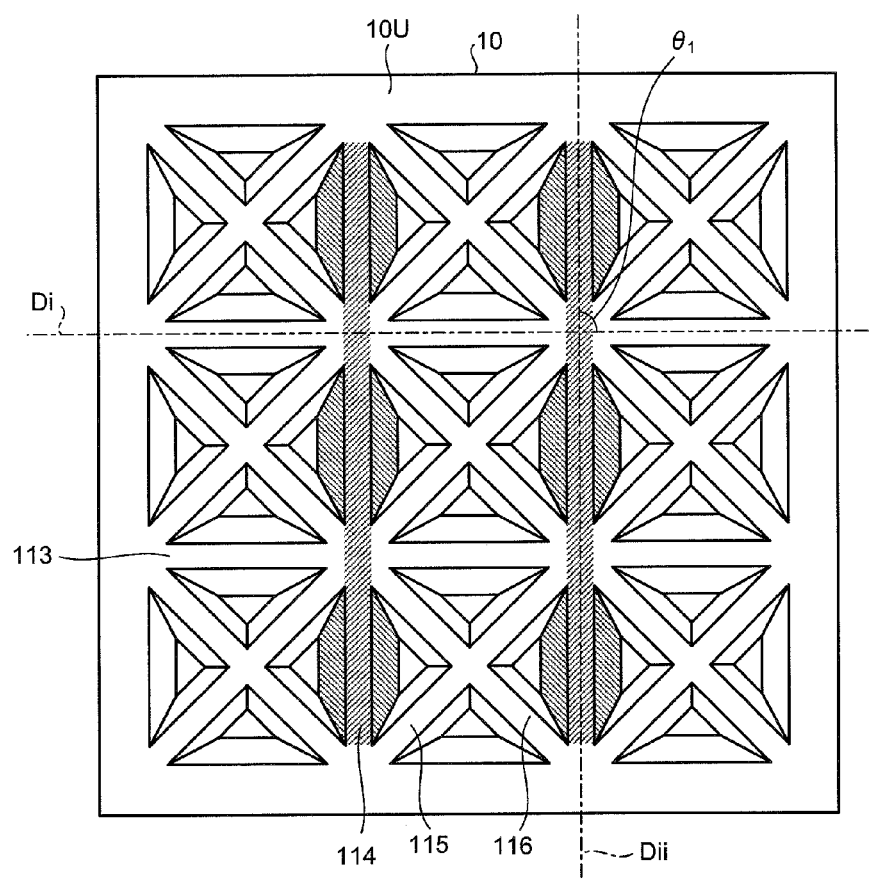
FIG. 5 is an enlarged plan view schematically illustrating the appearance of the light-emitting surface of the light-emitting device according to embodiment I-1 of the present invention as viewed in the thickness direction of the light-emitting device.
Figure 6:
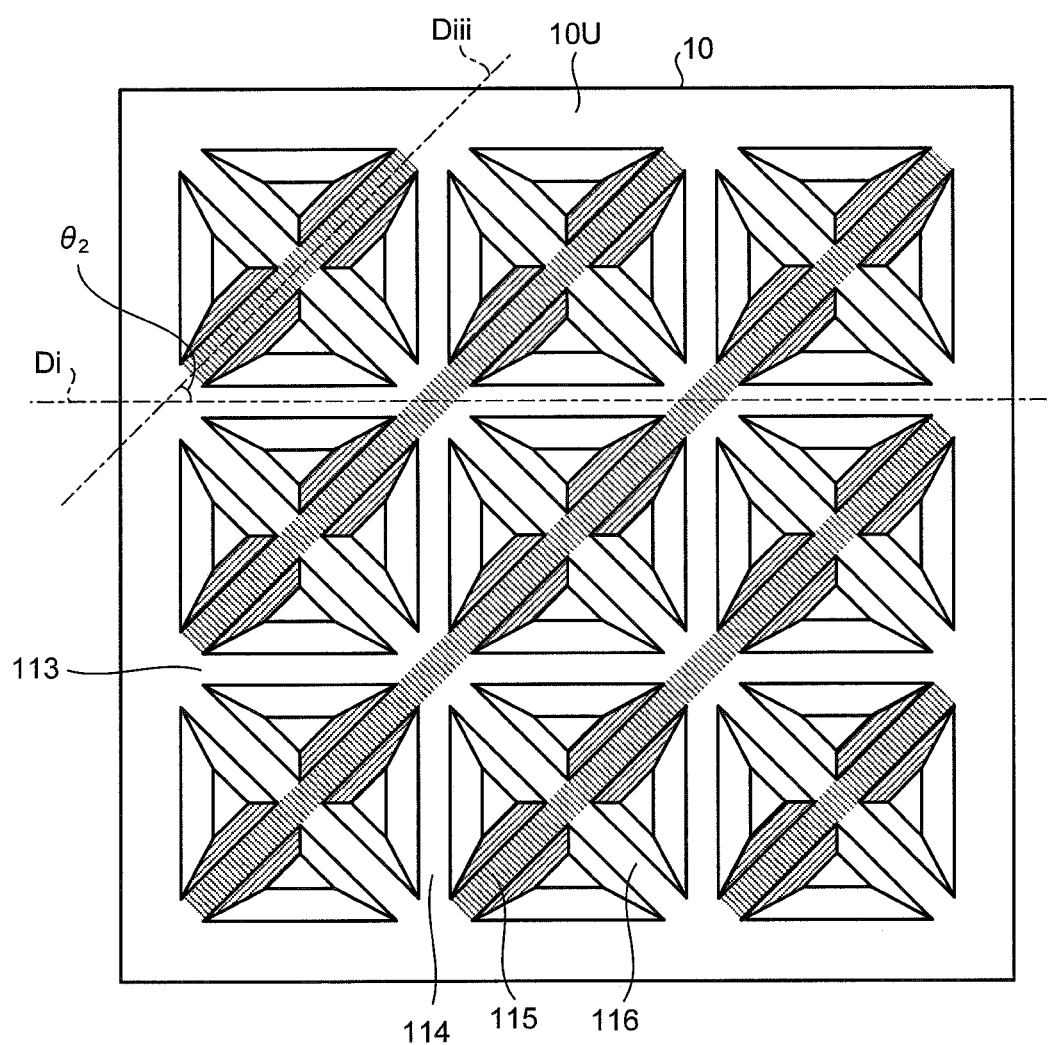
FIG. 6 is an enlarged plan view schematically illustrating the appearance of the light-emitting surface of the light-emitting device according to embodiment I-1 of the present invention as viewed in the thickness direction of the light-emitting device.
Figure 7:
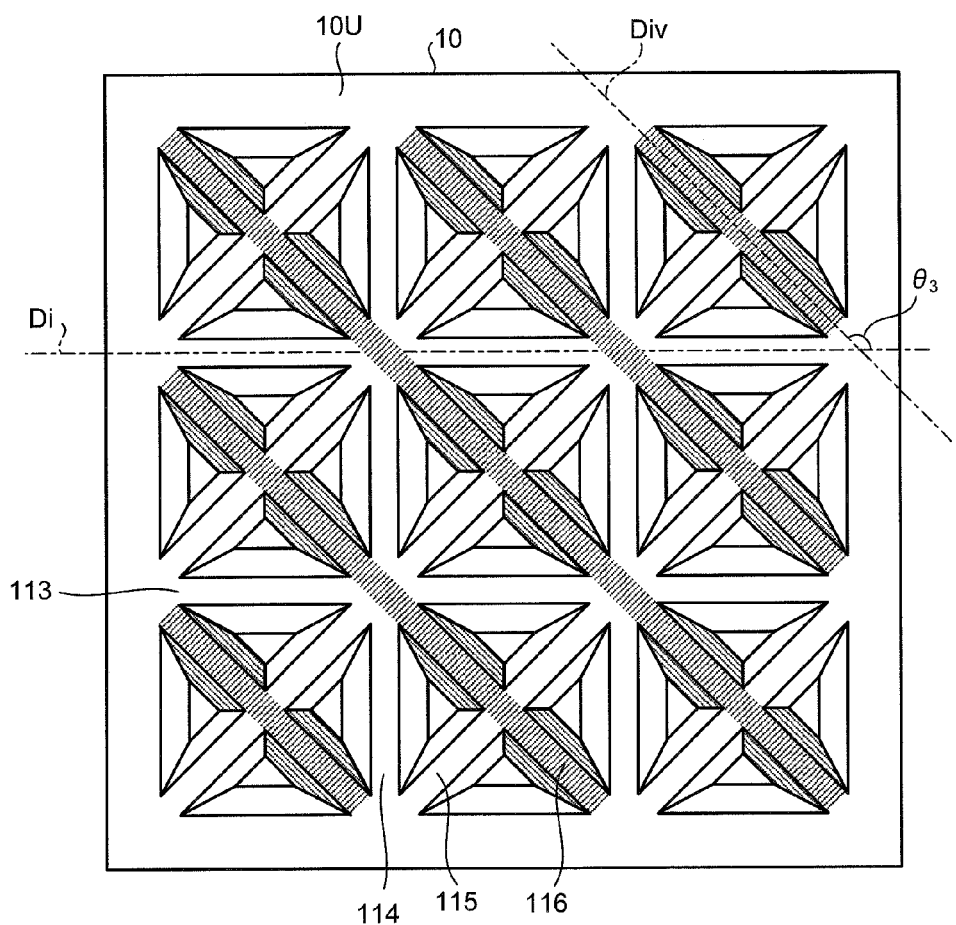
FIG. 7 is an enlarged plan view schematically illustrating the appearance of the light-emitting surface of the light-emitting device according to embodiment I-1 of the present invention as viewed in the thickness direction of the light-emitting device.
Figure 8:
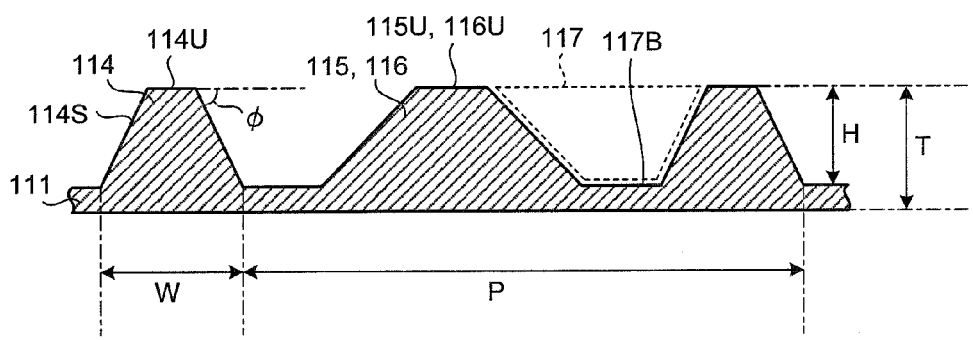
FIG. 8 is a partial cross-sectional view schematically illustrating a cross section of part of a concavo-convex structure layer according to embodiment I-1 of the present invention, taken along a plane that includes line 3a of FIG. 3 and is perpendicular to the light-emitting surface.

FIGS. 3 to 7 are enlarged plan views schematically illustrating the appearance of the light-emitting surface 10U of the light-emitting device 10 according to embodiment I-1 of the present invention as viewed in the thickness direction of the light-emitting device 10. FIG. 8 is a partial cross-sectional view schematically illustrating a cross section of part of the concavo-convex structure layer 111 according to embodiment I-1 of the present invention, taken along a plane that includes line 3a of FIG. 3 and is perpendicular to the light-emitting surface 10U. In FIG. 3, line 3a is a line that passes through a point X where the third streak array 115 and the fourth streak array 116 intersect and through concave portions 117 and is parallel to the direction in which the first streak array 113 extends. In FIG. 4, the first streak array 113 is shown with hatching. In FIG. 5, the second streak array 114 is shown with hatching. In FIG. 6, the third streak array 115 is shown with hatching. In FIG. 7, the fourth streak array 116 is shown with hatching. Furthermore, in the following description of the first aspect of the invention, the "thickness direction" refers to the thickness direction of the light-emitting device 20 unless otherwise specified.

As shown in FIG. 3, the light-emitting surface structure layer 100 has four groups of streak arrays extending in directions parallel to the light-emitting surface 10U, i.e., the first streak array 113, the second streak array 114, the third streak array 115, and the fourth streak array 116 on the light-emitting surface 10U. The first streak array 113, the second streak array 114, the third streak array 115, and the fourth streak array 116 extend in directions parallel to the light-emitting surface 10U. The directions in which the first streak array 113, the second streak array 114, the third streak array 115, and the fourth streak array 116 extend are not parallel to each other but intersect each other. That is, when the direction in which the first streak array 113 extends is defined as a first direction, the second streak array 114 extends in a second direction that intersects the first direction, the third streak array 115 extends in a third direction that intersects the first direction and the second direction, and the fourth streak array 116 extends in a fourth direction that intersects the first direction, the second direction, and the third direction.

In the light-emitting device 10 of the present embodiment, such provision of the streak arrays 113 to 116 extending in three or more different directions can make streaks of the streak arrays 113 to 116 less recognizable when the light-emitting surface 10U is observed. The reason why the visual recognition of the first to fourth streak arrays 113 to 116 can be prevented is not clear, although a study by the present inventor suggests the following reason.

In most of cases, a prior-art light-emitting device having a concavo-convex structure has, even if any, only one or two groups of streak arrays. With one or two groups of streak arrays, the surface shape of the light-emitting surface has high regularity when viewed in the thickness direction. Due to such high regularity, visibility of reflected light from the light-emitting surface also has a certain regularity, and this regularity is considered to be the cause of visual recognition of streaks of the streak arrays. Moreover, if the surface shape of the light-emitting surface has high regularity as in the prior art, periodic structures of inclined surface portions of the streak arrays cause interference and diffraction. Intensification and attenuation of light by such interference and diffraction are also considered to be the cause of visual recognition of streaks of the streak arrays. In contrast thereto, if the streak arrays 113 to 116 extending in three or more different directions are provided as in the light-emitting device 10, regularity of the surface shape of the light-emitting surface 10U is reduced, which is considered to have effect to suppress the visual recognition of the first to fourth streak arrays 113 to 116 as streaks.

Furthermore, if an observer views a light-emitting device having a prior-art concavo-convex structure in different azimuth angles, the light-emitting surface of the light-emitting device varies in visibility, including color and brightness. As a result, visibility of the light-emitting device has sometimes changed greatly depending on the position of the user. In contrast thereto, with the provision of the streak arrays 113 to 116 extending in three or more different directions, the light-emitting device 10 of the present embodiment can usually suppress such a change in visibility depending on the azimuth angle in which the observer views the light-emitting device. The reason why such a change in visibility depending on the azimuth angle in which the observer views the light-emitting device can be reduced is not clear, although a study by the present inventor suggests the following reason.

In a prior-art light-emitting device, as described above, recesses and projections are often formed along only one or two orthogonal in-plane directions. Optical characteristics (such as brightness and color tone) observed in an azimuth angle therefore vary greatly with the observing azimuth angle. That can be the reason why a large change in visibility depending on the azimuth angle has been observed. In contrast thereto, the streak arrays 113 to 116 extending in three or more different directions are provided on the light-emitting surface 10U as in the present embodiment, the concavo-convex structure of the light-emitting surface 10U has a low regularity and will not change much in the optical characteristics regardless of the observing azimuth angle. This is considered to have effect to make the visibility depending on the azimuth angle uniform. If the streak arrays 113 to 116 increase in number, the streak arrays 113 to 116 diffuse more light than those in prior art. Such light diffusion is also considered to be the factor contributing to smaller changes in visibility depending on the azimuth angle.

If the light-emitting surface of a prior-art light-emitting device has flat surface portions, unevenness has sometimes been observed on the light-emitting surface because of interference of light reflected at the flat surface portions. However, if the streak arrays 113 to 116 extending in three or more different directions are provided on the light-emitting surface 10U as in the present embodiment, interference due to flat surface portions 113U to 116U and 117B can be diffused, to thereby suppress the occurrence of unevenness due to the interference.

The angles formed between the directions in which the respective streak arrays 113 to 116 extend may be arbitrarily set unless the effects of the present invention are significantly impaired. Specifically, the directions in which the respective streak arrays 113 to 116 extend desirably intersect at an angle of usually 4° or larger, preferably 15° or larger, and more preferably 22.5° or larger, and usually 176° or smaller, preferably 165° or smaller, and more preferably 157.5° or smaller. This can effectively make streaks of the streak arrays 113 to 116 less recognizable in an instance wherein the four groups of streak arrays are present. Usually this also can effectively suppress changes in visibility depending on the azimuth angle in which the observer views the light-emitting device.

The aforementioned explanation was about an instance with four groups of streak arrays. In an instance with N groups of streak arrays (N is an integer equal to or larger than 3), the extending direction of the m-th streak array represented by a general expression may preferably be in a range of:

$$180°/N \times (m-1) \pm 180°/1.1N,$$

more preferably in a range of $180°/N \times (m-1) \pm 180°/1.5N$, and particularly preferably in a range of $180°/N \times (m-1) \pm 180°/2N$.

Here, m represents an integer of not smaller than 1 and not larger than N. The aforementioned general expression represents the angle of the extending direction of the m-th streak array with respect to a reference direction defined as an angle of 0°.

In the present embodiment, as shown in FIG. 4, the first streak array 113 is formed so as to extend in the first direction Di which is parallel to the light-emitting surface 10U. As shown in FIG. 5, the second streak array 114 is formed so as to extend in the second direction Dii which forms an angle of $\theta_1$ with respect to the first direction Di in which the first streak array 113 extends. As shown in FIG. 6, the third streak array 115 is formed so as to extend in the third direction Diii which forms an angle of $\theta_2$ with respect to the first direction Di in which the first streak array 113 extends. Furthermore, as shown in FIG. 7, the fourth streak array 116 is formed so as to extend in the fourth direction Div which forms an angle of $\theta_3$ with respect to the first direction Di in which the first array 113 extends. The aforementioned angles $\theta_1$ to $\theta_3$ each may be larger than 0° and smaller than 180°. From the viewpoint of effectively making streaks of the streak arrays 113 to 116 less visible and effectively suppressing a change in visibility depending on the azimuth angle in which the observer views the light-emitting device, the angles $\theta_1$ to $\theta_3$ are usually not smaller than 4° and smaller than 176°. The angles $\theta_1$ to $\theta_3$ are different from each other and are preferably different from each other by 4° or larger as described above. In the present embodiment, $\theta_1$ is set to 90°, $\theta_2$ is set to 45°, and $\theta_3$ is set to 135°.

Cross sections of the first to fourth streak arrays 113 to 116 taken along respective planes orthogonal to the directions in which the streak arrays 113 to 116 extend may have, e.g., a rectangular shape or a semicircular shape. Polygonal shapes with three or more sides are particularly preferred because the streak arrays 113 to 116 can be easily molded with high mold releasability and the intended optical characteristics are highly dependent on the angles of inclined surface portions 113S to 116S. That the intended optical characteristics are highly dependent on the angles of the inclined surface portions 113S to 116S means, e.g., that the collection of light is facilitated when the angles of the inclined surface portions 113S to 116S are about 45°, and that color tone of the light emitted from the device can be easily made uniform when the angles are 55° or larger. Particularly, from the viewpoint of improving the chipping resistance of the streak arrays 113 to 116 to improve the durability of the concavo-convex structure layer 111, it is preferable that the cross sections have polygonal shapes with four or more sides. As used herein, the shape of the cross section of a streak array refers to the shape of the concave portions or convex portions (in the present embodiment, convex portions) constituting the streak array in the aforementioned cross section of the streak array.

In the present embodiment, as shown in FIG. 8, the cross sections of the first to fourth streak arrays 113 to 116 taken along the respective planes orthogonal to the directions in which the streak arrays 113 to 116 extend all have a quadrilateral trapezoid (specifically, isosceles trapezoid). Consequently, as shown in FIG. 3, the first to fourth streak array 113 to 116 each have flat surface portions 113U to 116U as most protruding portions. The flat surface portions 113U to 116U correspond to the upper base of the aforementioned trapezoid. The first to fourth streak arrays 113 to 116 also have pairs of inclined surface portions 113S to 116S corresponding to the non-parallel opposing sides of the trapezoid. The flat surface portions 113U to 116U are interposed between the inclined surface portions 113S to 116S.

As used herein, an "inclined surface portion" is a surface inclined with respect to the light-emitting surface 10U, i.e., a surface that forms a non-parallel angle with respect to the light-emitting surface 10U. The angle of an inclined surface portion refers to the angle that the inclined surface portion forms with respect to the light-emitting surface 10U. On the other hand, the flat surface portions 113U to 116U are flat surfaces parallel to the light-emitting surface 10U. The flat surface portions 113U to 116U have the effect of improving the durability of the concavo-convex structure as described above. In addition, the flat surface portions 113U to 116U gives variation to the reflecting directions the light that has been emitted from the organic EL element 140 and repetitively reflected until extracted into the air, to thereby improve the light extraction efficiency. The light that has been emitted from the organic EL element 140 which was unable to be extracted from the flat surface portions 113U to 116U can be extracted to the outside from the inclined surface portions 113S to 116S. Therefore the provision of the inclined surface portions 113S to 116S can improve the light extraction efficiency of the light-emitting device 10.

As described above, each of the first to fourth streak arrays 113 to 116 includes a plurality of convex portions, and such convex portions are disposed at predetermined intervals. Therefore, the concave portions 117 that are recessed relative to their surroundings are present between the streak arrays 113 to 116. That is, the light-emitting surface 10U includes a plurality of concave portions 117 disposed therein, and the concave portions 117 are formed in a discretely dispersed manner separated by the streak arrays 113 to 116.

As shown in FIG. 8, the bottoms of the concave portions 117 constitute flat surface portions 117B which are flat surfaces parallel to the light-emitting surface 10U. If dust and chippings are accumulated in the concave portions 117, reduction in the light extraction efficiency may occur, and a bright spot may be generated. However, since the bottoms of the concave portions 117 are the flat surface portions 117B having a flat shape, the dust, chippings, etc. are less likely to be accumulated in the concave portions 117.

Figure 9:
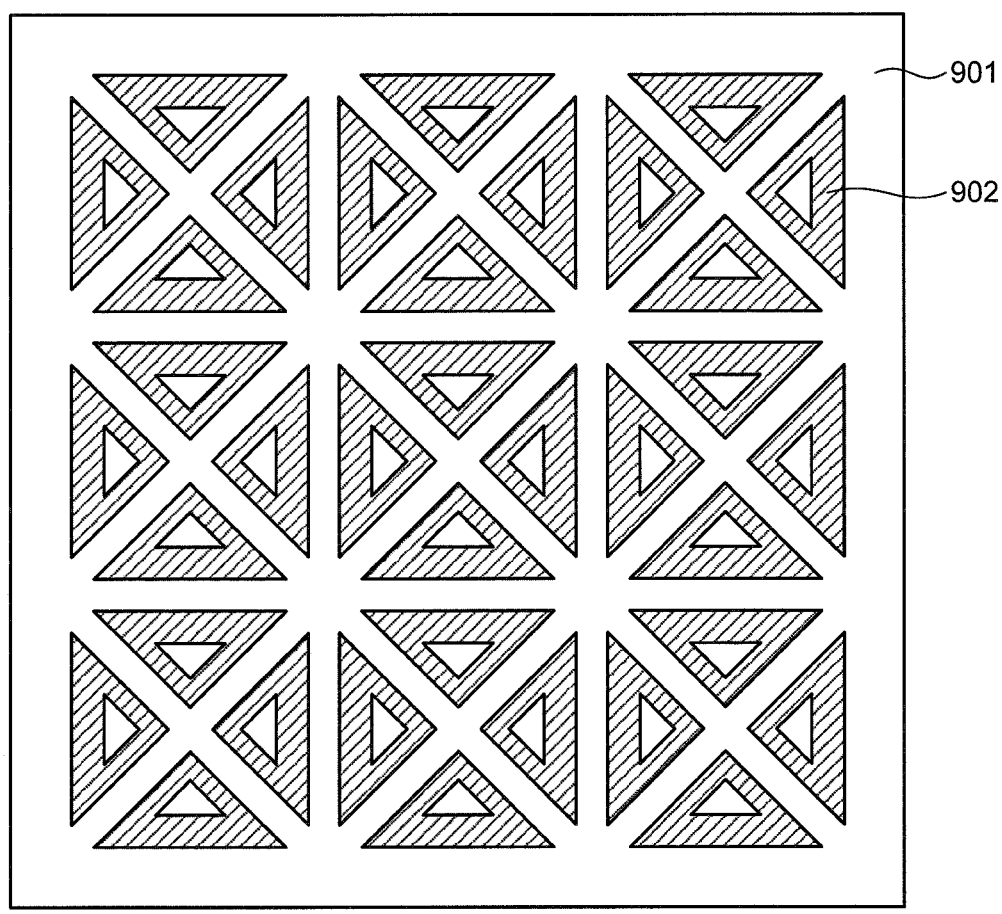
FIG. 9 is a projection view schematically illustrating the appearance of inclined surface portions of the light-emitting surface of the light-emitting device according to embodiment I-1 of the present invention, projected upon a plane parallel to flat surface portions in a direction perpendicular to the flat surface portions.

FIG. 9 is a projection view schematically illustrating the appearance of the inclined surface portions 113S to 116S of the light-emitting surface 10U of the light-emitting device 10 according to embodiment I-1 of the present invention, projected upon a plane 901 parallel to the flat surface portions 113U to 116U and 117B in a direction perpendicular to the flat surface portions 113U to 116U and 117B. In the present embodiment, the direction perpendicular to the flat surface portions 113U to 116U and 117B coincides with the direction perpendicular to the light-emitting surface 10U and a direction parallel to the thickness direction of the light-emitting device 10. The plane 901 parallel to the flat surface portions 113U to 116U and 117B is a plane parallel to the light-emitting surface 10U. Note that the aforementioned plane 901 parallel to the flat surface portions 113U to 116U and 117B is not a plane that the light-emitting device 10 has, but is a projection plane that is assumed in order to measure the projected area of the inclined surface portions 113S to 116S. In FIG. 9, projection images 902 of the inclined surface portions 113S to 116S of the light-emitting surface 10U of the light-emitting device 10, projected upon the plane 901 parallel to the flat surface portions 113U to 116U and 117B in the direction perpendicular to the flat surface portions 113U to 116U and 117B are shown with hatching.

As shown in FIG. 9, in the light-emitting device 10 of the present embodiment, the projected area formed by projecting the inclined surface portions 113S to 116S upon the plane 901 parallel to the flat surface portions 113U to 116U and 117B in the direction perpendicular to the flat surface portions 113U to 116U and 117B is usually 0.1 times or less times, preferably 0.05 times or less times, and more preferably 0.01 time or less times the total area of the flat surface portions 113U to 116U and 117B. The lower limit of the ratio of the projected area of the inclined surface portions 113S to 116S with respect to the total area of the flat surface portions 113U to 116U and 117B is usually 0.0001 times or more times, preferably 0.0005 times or more times, and more preferably 0.001 times or more times.

As a result, the other side of the light-emitting device 10 can be observed therethrough. If a concavo-convex structure provided on a prior-art light-emitting device of single side emission type is applied to a light-emitting device of double side emission type, haze thereof usually increases due to high proportion of the inclined surface portions. As a result, the other side of the light-emitting device can not be observed therethrough. In contrast, by confining the proportion of the projected area of the inclined surface portions 113S to 116S with respect to the total area of the flat surface portions 113U to 116U and 117B within the aforementioned range, it is possible to suppress increase of haze due to the concavo-convex structure when viewed in the direction perpendicular to the light-emitting surface 10U. Consequently, according to the light-emitting device 10 of the present embodiment, the see-through feature is not impaired despite the presence of the concavo-convex structure because increase of haze can be suppressed.

As shown in FIG. 8, the maximum value of the height difference H between the flat surface portions 113U to 116U and 117B of the light-emitting surface 10U is preferably 22 μm or smaller, and may be 21.5 μm or smaller, or 21.0 μm or smaller. The lower limit is usually 0.1 μm or larger, and may be 0.15 μm or larger, or 0.2 μm or larger. As used herein, the height difference refers to a distance in the thickness direction. The height difference H between the flat surface portions 113U to 116U and the flat surface portions 117B according to the present embodiment therefore refers to the height of the convex portions included in the first to fourth streak arrays 113 to 116, and also refers to the depth of the concave portions 117.

By setting the maximum value of the height difference H between the flat surface portions 113U to 116U and 117B within such a range, the other side of the light-emitting device 10 can be observed therethrough even when viewed in a direction (inclined direction) inclined with respect to the normal direction of the light-emitting surface 10U. Higher area ratio of the inclined surface portions 113S to 116S tends to cause larger haze when the light-emitting surface 10U is observed in an inclined direction. On the other hand, if the ratio of the projected area of the inclined surface portions 113S to 116S with respect to the total area (entire area) of the flat surface portions 113U to 116U and 117B falls within the aforementioned range and the maximum value of the height difference H between the flat surface portions 113U to 116U and 117B falls within the aforementioned range, it is possible to suppress an increase of the haze when viewed in an inclined direction. This can prevent the see-through feature from being impaired even when the light-emitting device 10 is viewed in an inclined direction.

As shown in FIG. 8, the inclined surface portions 113S to 116S are preferably inclined at an inclination angle φ of usually 80° or larger, preferably 81° or larger, and more preferably 82° or larger, and usually smaller than 90°, preferably 89° or smaller, and more preferably 88° or smaller with respect to the flat surface portions 113U to 116U and 117B. That is, the inclined surface portions 113S to 116S each are a surface not parallel to the flat surface portions 113U to 116U and 117B. The angles Φ formed between these inclined surface portions 113S to 116S and the flat surface portions 113U to 116U and 117B preferably fall within the aforementioned range. Such large inclination angles Φ of the inclined surface portions 113S to 116S can stably enhance the light extraction efficiency. As compared to an instance wherein the inclination angle φ is small, a large inclination angle φ can reduce the projected area with respect to each of the inclined surface portions 113S to 116S. Therefore, by having such a feature, the other side of the light-emitting device 10 can be more clearly observed therethrough when viewed in the thickness direction perpendicular to the light-emitting surface 10U. The thickness direction perpendicular to the light-emitting surface 10U is the front direction of the light-emitting device 10. Since the other side of the light-emitting device 10 is frequently observed therethrough from such a front direction, the aforementioned advantage is practically useful.

In the present embodiment, all the inclined surface portions 113S to 116S are set to the same inclination angle φ. This is not restrictive, and the inclined surface portions 113S to 116 may have different inclination angles.

The thickness T of the concavo-convex structure layer 111 is preferably set to an appropriate range in relation to the maximum value of the height difference H of the flat surface portions 113U to 116U and 117B described above. For example, when the concavo-convex structure layer 111 is made of a hard material which is advantageous in maintaining the durability of the concavo-convex structure layer 111, it is preferable to reduce the thickness T of the concavo-convex structure layer 111, because thereby the flexibility of the light-emitting device 10 can be improved, so that the concavo-convex structure layer 111 can be easily handled in the production process of the light-emitting device 10. Specifically, the difference between "the maximum value of the height difference H of the flat surface portions 113U to 116U and 117B" and "the thickness T of the concavo-convex structure layer 111" is preferably 0 to 30

In the first to fourth streak arrays 113 to 116, the size of, e.g, the width W and the pitch P of the concave portions or convex portions included in each of the first to fourth streak arrays 113 to 116 may be arbitrary set unless the effects of the present invention are significantly impaired. For example, the width W is usually 1 μm or larger and preferably 2 μm or larger, and usually 60 μm or smaller and preferably 50 μm or smaller. The pitch P is usually 0.5 μm or larger and preferably 1 μm or larger, and usually 2 mm or smaller and preferably 1 mm or smaller.

The size of each of the concave portions or convex portions included in the first to fourth streak arrays 113 to 116, such as the height (i.e., the height difference between the flat surface portions 113U to 116U and 117B) H, the width W, and the pitch P, may be constant. Alternatively they may vary according to, e.g., the position in the extending direction. In the present embodiment, the convex portions in all the streak arrays 113 to 116 have constant size along the extending directions.

The concave portions or convex portions included in the same streak arrays 113 to 116 may have the same size or different size. In the present embodiments, all the convex portions included in the same streak arrays 113 to 116 have constant size.

The concave portions or convex portions included in different streak arrays 113 to 116 may have the same size or different size. In the present embodiment, the convex portions in all the streak arrays 113 to 116 have a constant height H and a constant width W. The size of pitches P are adjusted so that the third streak array 115 and the fourth streak array 116 both pass points where the first streak array 113 and the second streak array 114 intersect. When the concave portions 117 are observed in the thickness direction, all the concave portions 117 have the same shapes and all the concave portions 117 have a triangular flat surface portion 117B at the bottom.

(Description of Materials for Multi-Layered Body)

The light-emitting surface structure layer 100 may be composed of a plurality of layers, or may be composed of a single layer. From the viewpoint of easily obtaining a light-emitting surface structure layer 100 having desired characteristics, a plurality of layers are preferably included. In the present embodiment, as shown in FIG. 1, the light-emitting surface structure layer 100 includes the multi-layered body 110 which is the combination of the concavo-convex structure layer 111 and the substrate film layer 112. With such a structure, a light-emitting surface structure layer 100 having high performance can be easily obtained.

The concavo-convex structure layer 111 and the substrate film layer 112 are usually formed from a resin composition including a transparent resin. As used herein, that a transparent resin is "transparent" means that the transparent resin has a light transmittance suitable for use as an optical member. In the present embodiment, each layer constituting the light-emitting surface structure layer 100 may have a light transmittance suitable for use as an optical member. For example, the entire light-emitting surface structure layer 100 may have a total light transmittance of 80% or higher.

The transparent resin is not particularly limited. A variety of resins that can form a transparent layer may be used. Examples thereof may include thermoplastic resins, thermosetting resins, ultraviolet curable resins, and electron beam-curable resins. Of these, thermoplastic resins can be easy deformed by heat, and ultraviolet curable resins have high curability and high efficiency. Therefore, these resins are preferable because therewith the concavo-convex structure layer 111 can be efficiently formed.

Examples of the thermoplastic resins may include polyester-based, polyacrylate-based, and cycloolefin polymer-based resins. Examples of the ultraviolet curable resins may include epoxy-based, acrylic-based, urethane-based, ene/thiol-based, and isocyanate-based resins. Among such resins, resins having a plurality of polymerizable functional groups may be suitably used. As the aforementioned resins, one species thereof may be solely used, or two or more thereof may be used in combination at any ratio.

Particularly, a material having high hardness after curing is preferable as the material of the concavo-convex structure layer 111 constituting the multi-layered body 110, because with such a material the concavo-convex structure of the light-emitting surface 10U can be easily formed, and abrasion resistance of the concavo-convex structure can be easily achieved. Specifically, it is preferable to use a material that forms a resin layer having a pencil hardness of HB or higher when the resin layer having a thickness of 7 μm with no concavo-convex structure is formed on a substrate. A material that forms the layer having a pencil hardness of H or higher is more preferable, and a material that forms the layer having a pencil hardness of 2H or higher is still more preferable. Meanwhile, it is preferable that the material of the substrate film layer 112 has a certain degree of flexibility in order to facilitate handling of the material when the concavo-convex structure layer 111 is formed and to facilitate handling of the multi-layered body 110 after the formation of the multi-layered body 110. Use of a combination of such materials gives a multi-layered body 110 that can easily be handled and has high durability, and therefore facilitates production of the light-emitting device 10 having a high-performance.

Such a combination of materials may be obtained by selecting, as the resins constituting respective materials, appropriate resins from the above-exemplified transparent resins. Specifically, an ultraviolet curable resin such as an acrylate is preferably used as the transparent resin constituting the material of the concavo-convex structure layer 111, and a film made of an alicyclic olefin polymer (such as a ZEONOR Film manufactured by ZEON CORPORATION) or a polyester film is preferably used as the transparent resin constituting the material of the substrate film layer 112.

When the light-emitting surface structure layer 100 includes the concavo-convex structure layer 111 and the substrate film layer 112 as in the present embodiment, the refractive index of the concavo-convex structure layer 111 may be as close as possible to the refractive index of the substrate film layer 112. In this case, the difference in refractive index between the concavo-convex structure layer 111 and the substrate film layer 112 is preferably 0.1 or smaller and more preferably 0.05 or smaller.

As the material for the layers that are the constituent components of the light-emitting surface structure layer 100 such as the concavo-convex structure layer 111 and the substrate film layer 112, a material having a light diffusion property may be used as long as the property does not impair the see-through feature. By using such light-diffusing materials, the light passing through the light-emitting surface structure layer 100 can be diffused while maintaining the see-through feature, and change in the color tone depending on the observation angle can be further reduced.

Examples of the material having a light diffusion property may include particle-containing materials and alloy resins that contain a mixture of two or more resins to have light diffusing ability. Of these, particle-containing materials are preferred from the viewpoint of easy adjustability of the light diffusion property. Particle-containing resin compositions are particularly preferred.

The particles may be either transparent or non-transparent. Examples of the material of the particles may include metals, metal compounds, and resins. Examples of the metal compounds may include metal oxides and nitrides. Specific examples of the metals and metal compounds may include: metals having high reflectance, such as silver and aluminum; and metal compounds such as silicon oxide, aluminum oxide, zirconium oxide, silicon nitride, tin-doped indium oxide, and titanium oxide. Meanwhile, examples of the resins may include methacrylic resins, polyurethane resins, and silicone resins. As the materials of the particles, one species thereof may be solely used or two or more thereof may be used in combination at any ratio.

Examples of the shape of the particles may include a spherical shape, a cylindrical shape, a needle shape, a cubic shape, a rectangular cuboid shape, a pyramidal shape, a conical shape, and a star-like shape.

The particles preferably have a particle diameter of 0.1 μm or larger, and preferably 10 μm or smaller and more preferably 5 μm or smaller. As used herein, the particle diameter refers to a 50% particle diameter in a cumulative distribution that is obtained by adding up the volume-based amount of particles along the horizontal axis representing the particle diameter. The larger the particle diameter is, the higher the ratio of the amount of particles that is necessary to obtain the desired effects is. The smaller the particle diameter is, the lower the necessary amount is. Therefore, the smaller the particle diameter is, the less the amount of particles that is necessary to obtain the desired effects such as a reduction of change in the color tone depending on the observation angle and an improved light extraction efficiency is. When the shape of the particle is other than spherical, a diameter of a sphere having the same volume as that of the particle is used as its particle diameter.

When the particles are transparent particles and are contained in a transparent resin, the difference between the refractive index of the particles and the refractive index of the transparent resin is preferably 0.05 to 0.5, and more preferably 0.07 to 0.5. The refractive index of either the particles or the transparent resin may be larger. If the refractive index of the particles is too close to that of the transparent resin, the diffusion effect may not be obtained and suppression of color tone unevenness may become insufficient. On the contrary, if the difference is too large, although high diffusion may be obtained and color tone unevenness may be suppressed, the light extraction effect may be reduced.

The containing ratio of the particles in terms of the volume ratio relative to the total volume of the particle containing layer is preferably 1% or larger and more preferably 5% or larger and preferably 80% or smaller and more preferably 50% or smaller. By setting the containing ratio of the particles to be not less than such a lower limit, the desired effects such as a reduction of change in the color tone depending on the observation angle can be obtained. By setting the containing ratio to be not more than such an upper limit, particle aggregation can be prevented, and stable distribution of the particles can be achieved.

If necessary, the resin composition may further contain optional components. Examples of the optional components may include additives such as: antidegradants such as phenol-based and amine-based antidegradants; antistatic agents such as surfactant-based and siloxane-based antistatic agents; and light resistant agents such as triazole-based and 2-hydroxybenzophenone-based light resistant agents.

It is preferable that the concavo-convex structure layer 111 has a thickness T of 1 μm to 70 μm, although not limited thereto. In the present embodiment, the thickness T of the concavo-convex structure layer 111 is the distance between its surface facing the substrate film layer 112 with no concavo-convex structure formed thereon and the flat surface portions 113U to 116U of the concavo-convex structure.

It is preferable that the substrate film layer 112 has a thickness of 20 μm to 300 μm.

(Supporting Substrate)

The light-emitting device 10 of the present embodiment includes the supporting substrate 131 between the organic EL element 140 and the multi-layered body 110. The provision of the supporting substrate 131 can give the light-emitting device 10 stiffness for suppressing warpage. The substrate for use as the supporting substrate 131 may be a substrate which has a high ability to seal the organic EL element 140, and may also be a substrate on which sequential formation of layers constituting the organic EL element 140 in the production process can be easily performed. By using such a substrate, the durability of the light-emitting device 10 can be improved, and production process thereof can be facilitated.

The supporting substrate 131 is usually made of a transparent material. Examples of the material may include glass and resins. As the materials of the supporting substrate 131, one species thereof may be solely used or two or more thereof may be used in combination at any ratio.

Although no particular limitation is imposed on the refractive index of the supporting substrate 131, the refractive index is preferably 1.4 to 2.0.

Although no particular limitation is imposed on the thickness of the supporting substrate 131, the thickness is preferably 0.1 mm to 5 mm.

(Bonding Layer)

The light-emitting device 10 of the present embodiment includes the bonding layer 121 between the multi-layered body 110 and the supporting substrate 131. The bonding layer 121 is a layer that is interposed between the substrate film layer 112 of the multi-layered body 110 and the supporting substrate 131 and bonds the two layers.

An adhesive used as the material of the bonding layer 121 is not limited to an adhesive in a narrow sense (a so-called hot-melt adhesive having a shear storage modulus at 23° C. of 1 to 500 MPa and exhibiting no tackiness at room temperature) but includes a tackiness agent having a shear storage modulus at 23° C. of smaller than 1 MPa. Specifically, a transparent adhesive having a refractive index close to that of the supporting substrate 131 or the substrate film layer 112 may be appropriately used. More specifically, acrylic adhesives or tackiness agents may be used. The thickness of the bonding layer is preferably 5 μm to 100 μm.

(Sealing Substrate)

The light-emitting device 10 of the present embodiment includes the sealing substrate 151 on the light-emitting surface 145. The sealing substrate 151 may be provided directly in contact with the light-emitting surface 145. An optional substance such as a filler and an adhesive may be present between the light-emitting surface 145 and the sealing substrate 151, and a gap may be present therebetween. Air or other gases may be present in the gap, so long as a problem such as significant deterioration of the durability of the light-emitting layer 142 does not occur, or the gap may be vacuum.

As the sealing substrate 151, any material that can seal the organic EL element 140 and allow the light emitted from the light-emitting surface 145 to pass may be used. Examples thereof may include materials that are the same as those for the supporting substrate 131.

(Production Method)

The method of producing the light-emitting device 10 is not particularly limited. For example, the light-emitting device 10 may be produced by stacking the respective layers constituting the organic EL element 140 on one surface of the supporting substrate 131, and, before or after these layers are stacked, bonding the multi-layered body 110 including the concavo-convex structure layer 111 and the substrate film layer 112 onto the other surface of the supporting substrate 131 via a bonding layer 121.

The multi-layered body 110 including the concavo-convex structure layer 111 and the substrate film layer 112 may be produced by, e.g., preparing a mold such as a molding die having a desired shape, and transferring the shape to a layer of a material for forming the concavo-convex structure layer 111. Specific examples of the method may include:

(method 1) a method including preparing an unprocessed multi-layered body including a layer of a resin composition A for constituting the substrate film layer 112 and a layer of a resin composition B for constituting the concavo-convex structure layer 111 (concavo-convex structure has not been formed yet at this point) and forming a concavo-convex structure on the surface of the resin composition B in the unprocessed multi-layered body; and (method 2) a method including applying the resin composition B in liquid form onto the substrate film layer 112, placing a mold on the applied resin composition B, and curing the resin composition B keeping that state, to form the concavo-convex structure layer 111.

In the method 1, the unprocessed multi-layered body may be obtained by, e.g., extrusion molding in which the resin composition A and the resin composition B are co-extruded. A mold having a desired surface shape is pressed against the surface of the resin composition B in the unprocessed multi-layered body, whereby the concavo-convex structure may be formed.

More specifically, a long-length unprocessed multi-layered body may be formed in a continuous manner by extrusion molding, and the multi-layered body is then pressed between a transfer roller having the desired surface shape and a nip roller, whereby continuous production can be performed in an efficient manner. The nipping pressure between the transfer roller and the nip roller is preferably several MPa to several tens of MPa. Preferably, the temperature during transfer is equal to or higher than Tg and equal to or lower than (Tg+100° C.), wherein Tg is the glass transition temperature of the resin composition B. The duration of the contact of the unprocessed multi-layered body with the transfer roller may be adjusted by the feeding speed of the film, i.e., the rotation speed of the rollers, and is preferably 5 seconds or longer and 600 seconds or shorter.

In the method 2, it is preferable to use, as the resin composition B for constituting the concavo-convex structure layer 111, a composition that is curable with energy rays such as ultraviolet rays. Such a resin composition B is applied onto the substrate film layer 112. With the mold in contact with the applied layer of the resin composition B, the resin composition B is irradiated with the energy rays such as ultraviolet rays for effecting curing. Upon irradiation, it is preferable that the energy rays are emitted from a light source located on the back side of the applied surface. As used herein, the back side of the applied surface refers to a side of the substrate film that is opposite to the surface onto which the resin composition B has been applied. Subsequently, by removing the mold, the multi-layered body 110 may be obtained with the coating layer of the resin composition B serving as the concavo-convex structure layer 111.

(Main Advantages of Light-Emitting Device)

Since the light-emitting device 10 of the present embodiment is configured as described above, light emitted from the light-emitting surface 144 of the organic EL element 140 passes through the light-emitting surface structure layer 100 and is extracted through the light-emitting surface 10U, whereas light emitted from the light-emitting surface 145 passes through the sealing substrate 151 and is extracted through the light-emitting surface 10D.

The light-emitting surface 10U has the concavo-convex structure including the first to fourth streak arrays 113 to 116 and the concave portions 117. Since light that cannot be extracted from the flat surface portions 113U to 116U and 117B can be extracted from the inclined surface portions 113S to 116S, the extraction efficiency of the light through the light-emitting surface 10U can be improved as compared to an instance wherein there is no concavo-convex structure.

The light-emitting surface 10U has the concavo-convex structure including three or more groups of streak arrays 113 to 116 extending in different directions. This can prevent visual recognition of the streaks of the first to fourth streak arrays 113 to 116 when the light-emitting device 10 is observed. Accordingly, this can prevent grid unevenness resulting from the streak arrays.

Moreover, since the light-emitting device 10 has the first to fourth streak arrays 113 to 116 on the light-emitting surface 10U, visibility usually does not vary much depending on the azimuth angle in which the observer views the light-emitting device.

These effects may be obtained when at least three groups of the streak arrays are provided. However, more remarkable effects may be obtained when more groups of the streak arrays are provided. Therefore, provision of four or more groups of the streak arrays as in the present embodiment is preferred to provision of only three groups of the streak arrays. Since sufficient effects can be obtained without excessively increasing the number of groups of streak arrays, eight or less groups of streak arrays may usually be provided.

The layers that the light-emitting device 10 has are all transparent. Therefore, in the light-emitting device 10, light incident on one light-emitting surface 10U can pass through the light-emitting device 10 and go out through the other light-emitting surface 10D. Light incident on the other light-emitting surface 10D can also pass through the light-emitting device 10 and go out through the one light-emitting surface 10U. Furthermore, in the present embodiment, since the ratio of the projected area of the inclined surface portions 113S to 116S with respect to the total area of the flat surface portions 113U to 116U and 117B is confined within a predetermined range, haze can be suppressed. This realizes clear observation of the other side of the light-emitting device 10 therethrough by the naked eye, whereby a light-emitting device of see-through type can be realized.

Specifically, the light-emitting device 10 as its entirety usually has a total light transmittance of 60% or higher, preferably 70% or higher, and more preferably 80% or higher. The upper limit is ideally 100%, and usually 90% or smaller.

Furthermore, since the shape of the concavo-convex structure of the light-emitting device 10 is appropriately defined, the light-emitting device 10 as its entirety usually has a haze as small a value as 10% or smaller, preferably 8% or smaller, and more preferably 6% or smaller. The lower limit is ideally 0%, and usually 0.1% or larger.

Furthermore, according to the light-emitting device 10 of the present embodiment, the light-emitting surface 10U is prevented from, e.g., being chipped by an external impact, and therefore the mechanical strength of the light-emitting surface 10U can be improved. In general, when a surface has a concavo-convex structure and an impact is applied to the surface, its force tends to concentrate on a part of the concavo-convex structure to cause breakage. In contrast, the light-emitting device 10 of the present embodiment has the flat surface portions 113U to 116U of flat shape at the outermost position in the thickness direction. Therefore, when a force or impact is applied from the outside to the light-emitting surface 10U, the concentration of force on a part of the concavo-convex structure layer 111 can be suppressed, so that the concavo-convex structure layer 111 can be prevented from being broken and the mechanical strength of the light-emitting device 10 can be improved. As a result, breakage of the concavo-convex structure layer 111 can be avoided, and both a favorable light extraction efficiency and a high mechanical strength of the light-emitting surface 10U of the light-emitting device 10 can be achieved.

I.2. Embodiment I-2

In embodiment I-1, the flat surface portions 113U to 116U and 117B on the same light-emitting surface 10U have a constant height difference H. The concavo-convex structure of the light-emitting surface 10U thus has two different heights. In the light-emitting device of the present first invention, however, the height difference H may be made uneven so that the concavo-convex structure of the light-emitting surface has three or more different heights.

In such a case, it is preferable that the difference between any of the heights of the concavo-convex structure is 0.1 μm or larger. When the concavo-convex structure of the light-emitting surface has three or more heights that are different from each other by 0.1 μm or larger, the concavo-convex structure of the light-emitting surface has size differences exceeding the size difference that causes interference of one or both of emission light emitted through the light-emitting surface and reflected light reflected on the light-emitting surface. This can effectively suppress rainbow unevenness resulting from the interference of either or both of the emission light and the reflected light. As used herein, rainbow unevenness refers to rainbow-like color unevenness that is observed when the light-emitting surface is viewed. The differences in height in the concavo-convex structure may be 0.1 μm or larger and may also be, e.g., 0.15 μm or larger or 0.2 μm or larger. No particular limitation is imposed on the upper limit of the differences in height in the concavo-convex structure. However, since too large difference may increase thickness of the light-emitting device, the upper limit of the differences in height in the concavo-convex structure is preferably 50 μm or smaller and may be, e.g., 25 μm or smaller or 10 μm or smaller.

As used herein, The heights in the concavo-convex structure mean positions in the thickness direction of the light-emitting surface other than the inclined surface portions. Usually, the heights are the positions of the most protruding parts of convex portions included in a streak array in the thickness direction and the positions of the bottoms of concave portions provided between the convex portions included in the streak array in the thickness direction. The emission light that goes out through the light-emitting surface includes not only the light emitted from the organic EL element but also light that entered into the light-emitting device through the light-emitting surface, then reflected in the light-emitting device, and then goes out after again passing through the light-emitting surface.

An example thereof will be described hereinbelow with reference to the drawings.

Figure 10:
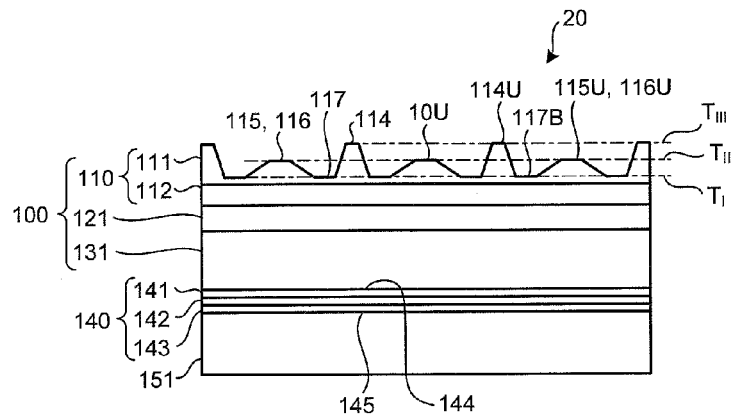
FIG. 10 is a cross-sectional view schematically illustrating a cross section of a light-emitting device according to embodiment I-2 of the present invention, taken along a plane including a line that passes through a point where a third streak array and a fourth streak array intersect and concave portions and is parallel to a direction in which a first streak array extends, the plane being perpendicular to a light-emitting surface.

FIG. 10 is a cross-sectional view schematically illustrating a cross section of a light-emitting device 20 according to embodiment I-2 of the present invention, taken along a plane that includes a line parallel to an extending direction of the first streak array 113 and is perpendicular to the light-emitting surface 10U, the line passing points where the third streak array 115 and the fourth streak array 116 intersect each other and passing concave portions 117. In the second embodiment, the same elements as those of embodiment I-1 will be designated by the same reference symbols as in embodiment I-1.

As shown in FIG. 10, the light-emitting device 20 according to embodiment I-2 of the present invention has the same configuration as that of the light-emitting device 10 according to embodiment I-1 except that the convex portions included in the first streak array 113 (see FIG. 1) and the second streak array 114 have a height different from that of the convex portions included in the third streak array 115 and the fourth streak array 116. Specifically, the height of the convex portions included in the third streak array 115 and the fourth streak array 116 is lower than the height of the convex portions included in the first streak array 113 and the second streak array 114. As a result, the concavo-convex structure of the light-emitting surface 10U has three heights that are the position $T_I$ in the thickness direction of the flat surface portions 117B at the bottoms of the concave portions 117, the position in the thickness direction $T_{II}$ of the flat surface portions 115U of the third streak array 115 and the flat surface portions 116U of the fourth streak array 116, and the position in the thickness direction $T_{III}$ of the flat surface portions 113U of the first streak array 113 and the flat surface portions 114U of the second streak array 114.

The height of the convex portions included in the third streak array 115 and the fourth streak array 116 is set to 0.1 μm or larger. The difference between the height of the convex portions included in the first streak array 113 and the second streak array 114 and the height of the convex portions included in the third streak array 115 and the fourth streak array 116 is also set to 0.1 μm or larger. Therefore, the three heights $T_I$ to $T_{III}$ included in the concavo-convex structure of the light-emitting surface 10U are different from each other by 0.1 μm or larger.

In this case, the differences between the three heights $T_I$ to $T_{III}$ included in the concavo-convex structure of the light-emitting surface 10U are the size differences of the concavo-convex structure exceeding the difference that causes interference of one or both of the emission light and reflected light, and therefore color unevenness due to interference can be suppressed. That is, the interference of the emission light and the reflected light at the flat surface portions 113U and 114U, the flat surface portions 115U and 116U, and the flat surface portions 117B positioned at different heights is suppressed, so that rainbow unevenness can be effectively suppressed. In this case, these effects can be obtained when the size differences $T_{III}-T_{II}$ and $T_{II}-T_I$ are set so as to exceed the difference that causes interference of the emission light. However, usually, the reflected light tends to have a larger influence on rainbow unevenness than the emission light. Therefore, when the size differences are set so as to exceed the difference that causes the interference of the reflected light, more remarkable effects can be obtained.

For example, in the case of interference of the emission light emitted from the organic EL element 140, the size differences exceeding the difference that causes the interference are size differences of usually 0.62 times or more times the center wavelength of the emission light and preferably 1.5 times or more times the center wavelength. When such size differences are provided, the occurrence of rainbow unevenness can be suppressed. The upper limit of these size differences is not particularly limited but is preferably equal to or smaller than 60 times the center wavelength of the emission light.

The aforementioned numerical range has been verified by the following findings. In an instance of a structure layer designed such that all the flat portions have the same depth in the concave portions, suppose that, when the error in the depth of the concave portions is 170 nm or larger, interference occurs and rainbow unevenness is observed. It has been found out that, in such an instance, the occurrence of the rainbow unevenness can be suppressed by intentionally providing a size difference in height 2 times or more times the minimum error that causes the rainbow unevenness. In addition, in an instance of a structure layer designed such that all the flat portions have the same depth in the concave portions, suppose that, when the depth of the concave portions fluctuates with a standard deviation of σ1 nm (≈60 nm), interference occurs and rainbow unevenness is observed. It has been found out that, in such an instance, the occurrence of rainbow unevenness can be suppressed by intentionally providing a size difference in height equal to or larger than 6×σ1 nm (=360 nm). The aforementioned two findings show that the size difference exceeding the difference that causes interference of emission light is 0.62 times or more times the center wavelength of the light emitted from the light-emitting device.

For the same reason, as to the interference of transmission light and reflected light, the size difference exceeding the difference that causes the interference is usually 0.62 times or more times and preferably 1.5 times or more times the center wavelength of the transmission light and reflected light. The size difference is usually equal to or smaller than 60 times the center wavelength. However, usually, the transmission light and reflected light is natural light and can include any wavelength. Therefore, it is difficult to determine the center wavelength of the reflected light. In consideration of the fact that the light that causes rainbow unevenness is visible light, the aforementioned size difference may be usually set by using the center wavelength of visible light, 550 nm, as the center wavelength of the light to be reflected.

When the concavo-convex structure has three or more heights $T_I$, $T_{II}$, and $T_{III}$ differing by 0.1 μm or larger as in the present embodiment, the same advantages as those of embodiment I-1 can also be obtained. When the heights H of all the convex portions included in the streak arrays 113 to 116 are uniform as in embodiment I-1, rainbow unevenness due to interference is unlikely to occur. However, in actual products, it may be difficult to make the heights H of the convex portions included in the streak arrays 113 to 116 highly uniform, because of changing in production conditions such as temperature and humidity. Therefore, by intentionally providing the different heights $T_I$, $T_{II}$, and $T_{III}$ to the concavo-convex structure in the aforementioned manner, rainbow unevenness can be more easily suppressed.

The same effects can also be obtained when the aforementioned size difference is provided for elements other than the height of the concavo-convex structure. For example, if one or more elements in a group of elements including the height, width, and pitch of the streak arrays have the aforementioned size difference, rainbow unevenness can be similarly suppressed.

I.3. Embodiment I-3

In each of the aforementioned embodiments I-1 and I-2, an example wherein the light-emitting surface structure layer is disposed on one of the two light-emitting surfaces of the organic EL element has been described. However, the light-emitting surface structure layer may be disposed on both the light-emitting surfaces. An example thereof will be described hereinbelow with reference to the drawings.

Figure 11:
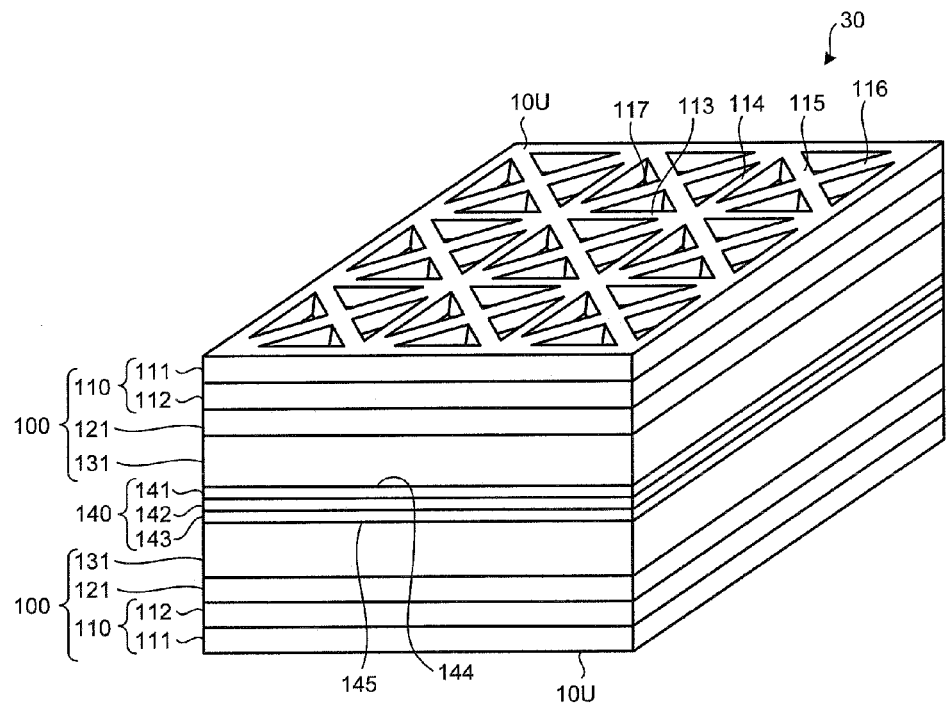
FIG. 11 is a perspective view schematically illustrating a light-emitting device according to embodiment I-3 of the present invention.

FIG. 11 is a perspective view schematically illustrating a light-emitting device according to embodiment I-3 of the present invention. In embodiment I-3, the same elements as those of embodiment I-1 will be designated by the same reference symbols as in embodiment I-1.

As shown in FIG. 11, a light-emitting device 30 according to embodiment I-3 is the same as the light-emitting device 10 according to embodiment I-1 except that a light-emitting surface structure layer 100 is provided in place of the sealing substrate 151. As a result, the light-emitting device 30 has the light-emitting surface structure layers 100 on both of the two light-emitting surfaces 144 and 145 of the organic EL element 140. The light-emitting device 30 thus has the concavo-convex structures on both of the two light-emitting surfaces 10U. In the present embodiment, the concavo-convex structure layers provided on the two light-emitting surfaces have the same shape. However, such a configuration is not restrictive, and the concavo-convex structure on one of the light-emitting surfaces may have a shape different from that of the concavo-convex structure on the other light-emitting surface. Between the second electrode layer 143 and the light-emitting surface structure layer 100 on the lower side in the figure, any optional material such as a filler and an adhesive may be present, and a gap may be present. Air or other gases may be present in the gap, so long as a problem such as significant deterioration of the durability of the light-emitting layer 142 does not occur, or the gap may be vacuum.

Since the light-emitting device 30 of the present embodiment is configured as described above, the light emitted from the light-emitting surface 144 of the organic EL element 140 goes out through the light-emitting surface 10U that is on the upper side in the figure. The light emitted from the light-emitting surface 145 goes out through the lower light-emitting surface 10U in the figure. In this instance, the light can be extracted with high efficiency while maintaining the see-through feature. Moreover, visual recognition of the streaks of the first to fourth streak arrays 113 to 116 can be prevented on both of the two light-emitting surfaces 10U. Furthermore, the same effects as those of embodiment I-1 can be obtained.

I.4. Others

While the embodiments of the first aspect of the invention have been described hereinabove, the first aspect of the invention is not limited to the aforementioned embodiments and may be implemented with further modifications.

For example, in the aforementioned embodiments, the light-emitting surface structure layer 100 is provided directly in contact with the light-emitting surface 144. However, the light-emitting surface structure layer 100 may be provided on the light-emitting surface 144 via any other layers. Examples of such other layers may include a gas barrier layer for protecting the organic EL element 140 from the outside air and humidity, and an ultraviolet-cut layer for shielding ultraviolet rays.

Moreover, for example, in the aforementioned embodiments, the light-emitting surface structure layer 100 includes the concavo-convex structure layer 111, the substrate film layer 112, the bonding layer 121, and the supporting substrate 131. However, the light-emitting surface structure layer 100 may be composed of fewer layers than these layers or may further include an optional layer or layers in addition to these layers. For example, the light-emitting surface structure layer 100 may further have a coating layer on the surface of the concavo-convex structure layer 111, and the coating layer may define the concavo-convex structure of the light-emitting surface 10U.

Figure 12:
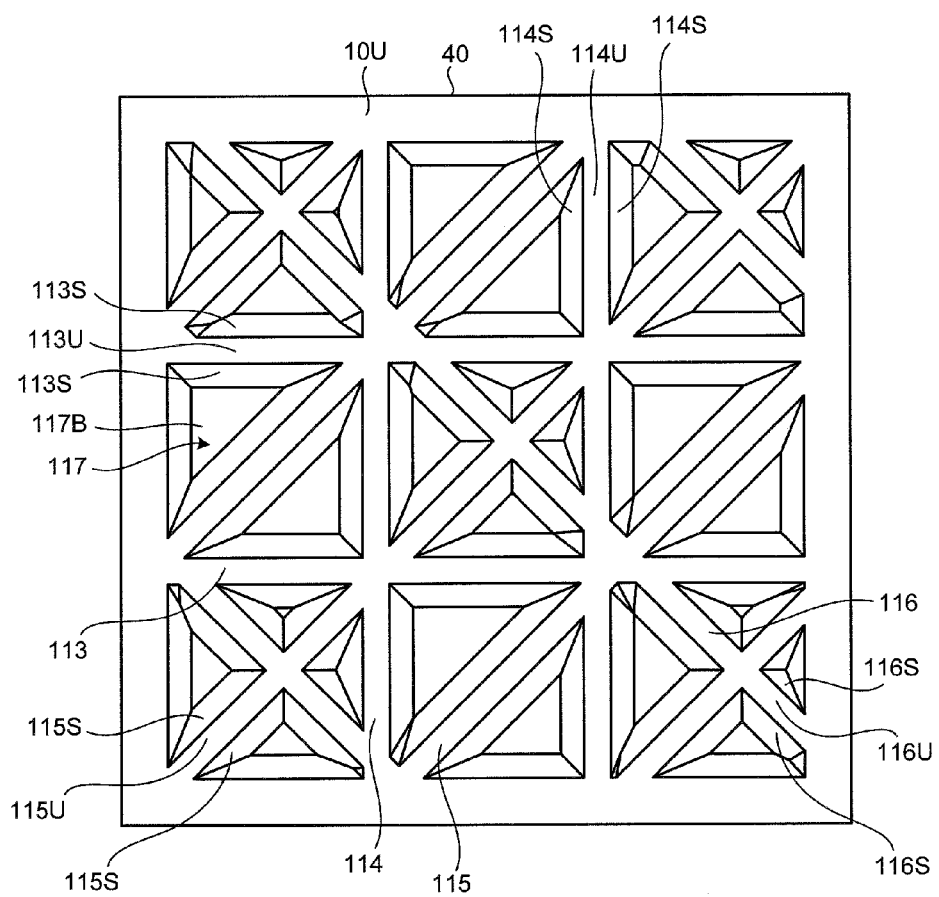
FIG. 12 is an enlarged plan view schematically illustrating a light-emitting surface of a light-emitting device according to a modification example of embodiment I-1 of the present invention as viewed in the thickness direction of the light-emitting device.

Furthermore, for example, in the aforementioned embodiments, the third streak array 115 and the fourth streak array 116 pass the points where the first streak array 113 and the second streak array 114 intersect, so that the first to fourth streak arrays 113 to 116 intersect at single intersections. However, as in a light-emitting device 40 shown in FIG. 12, the first to fourth streak arrays 113 to 116 may be configured not to intersect at single intersections. As specific examples, any one of the streak arrays may have uneven pitches, or positions or extending directions of the streak arrays may be shifted from the aforementioned embodiments. In this manner, the regularity of the light-emitting surface 10U may be further reduced, whereby the visual recognition of the streaks of the first to fourth streak arrays 113 to 116 can be more effectively reduced. FIG. 12 is an enlarged plan view schematically illustrating the appearance of a light-emitting surface 10U of the light-emitting device 40 according to a modification example of embodiment I-1 of the present invention as viewed in the thickness direction of the light-emitting device 40. In FIG. 12, the same elements as those of embodiment I-1 will be designated by the same reference symbols as in embodiment I-1.

Moreover, for example, in the examples shown in the aforementioned embodiments, all the first to fourth streak arrays 113 to 116 include convex portions protruding from their surroundings. However, the first to fourth streak arrays 113 to 116 may include concave portions recessed from their surroundings. A streak array including convex portions and another streak array including concave portions may coexist on a single light-emitting surface. Moreover, for example, the concave portions or convex portions included in the first to fourth streak array may be formed in a shape having round edges.

Moreover, for example, the inclined surface portions may be curved surfaces.

Figure 13:
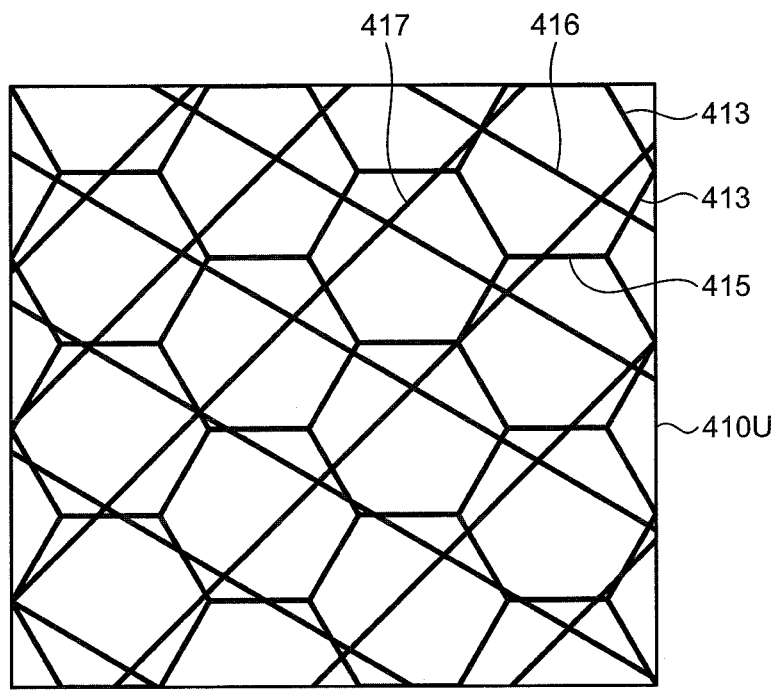
FIG. 13 is a plan view schematically illustrating the appearance of part of a light-emitting surface according to a modification example of the present invention as viewed in the thickness direction of the light-emitting device.
Figure 14:
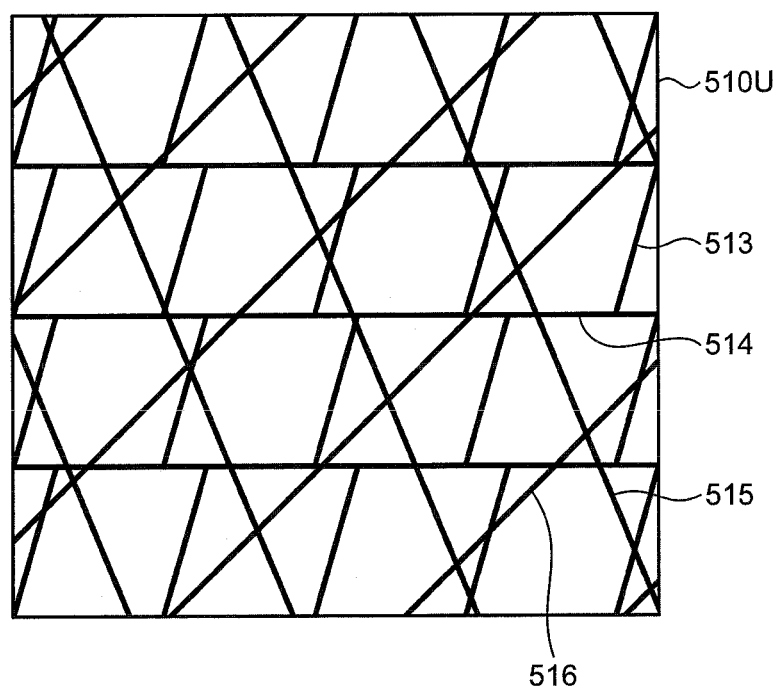
FIG. 14 is a plan view schematically illustrating the appearance of part of a light-emitting surface according to a modification example of the present invention as viewed in the thickness direction of the light-emitting device.
Figure 15:
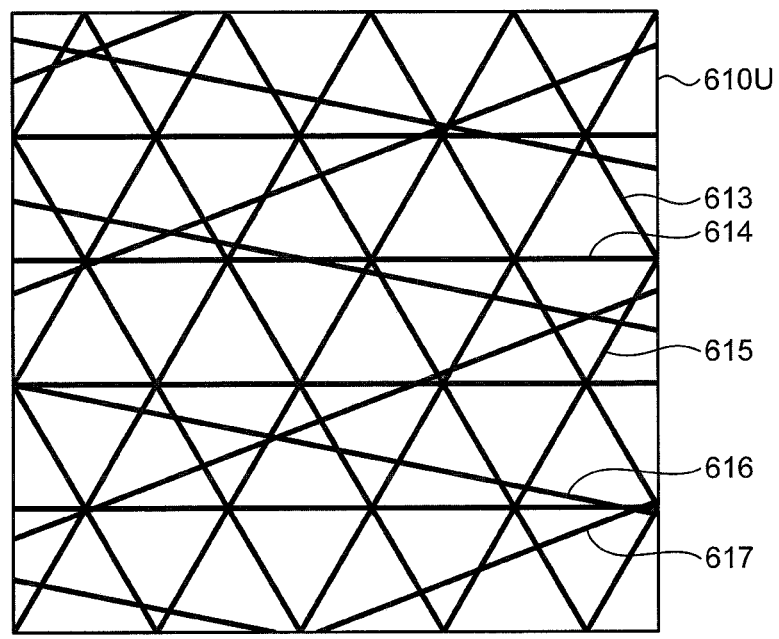
FIG. 15 is a plan view schematically illustrating the appearance of part of a light-emitting surface according to a modification example of the present invention as viewed in the thickness direction of the light-emitting device.

Furthermore, the number, positions, extending directions, and lengths of streak arrays provided on the light-emitting surface and the manner of their combination are not limited to the aforementioned embodiments. For example, as shown in FIG. 13, streak arrays 413, 414, and 415 of equal lengths intersecting at angles of 120° may be provided on a light-emitting surface 410U in a regular hexagonal configuration when viewed in the thickness direction, and streak arrays 416 and 417 may be further provided to intersect these streak arrays 413, 414, and 415. Moreover, for example, as shown in FIG. 14, streak arrays 513 and 514 intersecting at a constant angle may be provided on a light-emitting surface 510U in a parallelogrammic configuration when seen in the thickness direction, and streak arrays 515 and 516 may be further provided to intersect these streak arrays 513 and 514. Moreover, for example, as shown in FIG. 15, streak arrays 613, 614, and 615 of equal lengths intersecting at angles of 60° may be provided on a light-emitting surface 610U in a regular triangle configuration, and streak arrays 616 and 617 may be further provided to intersect these streak arrays 614, 614, and 615. Even if the streak arrays are disposed in such a complicated manner, the streak arrays can be formed by using techniques such as etching.

Moreover, in embodiment I-2, the first streak array 113 and the second streak array 114 are configured to include high convex portions and the third streak array 115 and the fourth streak array 116 are configured to include low convex portions so that the concavo-convex structure of the light-emitting surface 10U has different heights. However, other configurations may be used to give the concavo-convex structure of the light-emitting surface 10U different heights. For example, only the first streak array 113 may be configured to include high convex portions while the second to fourth streak arrays 114 to 116 are configured to include low convex portions. As another example, the positions of the flat surface portions 117B at the bottoms of the concave portions 117 in the thickness direction may be configured to be uneven so that the position of the flat surface portion 117B at the bottom of one concave portion 117 and the position of the flat surface portion 117B at the bottom of another concave portion 117 differ by 0.1 μm or larger in the thickness direction. Further-more, for example, the concavo-convex structure of the light-emitting surface 10U may be given different heights by making the heights of the convex portions belonging to an identical streak array uneven, or by making the height of a single convex portion uneven in the extending direction.

II. Description of Embodiment According to Second Invention

II.1. Embodiment II-1

Figure 16:
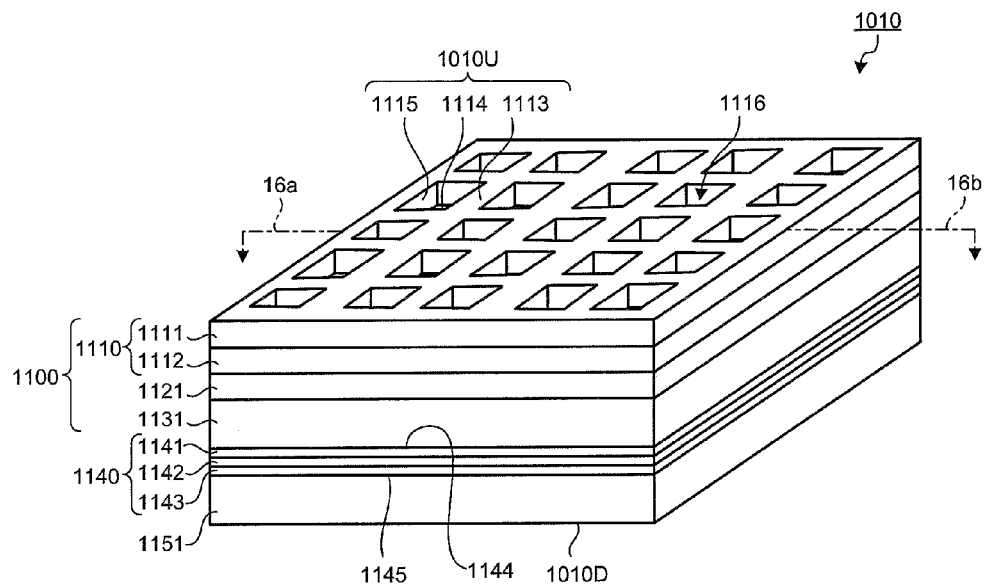
FIG. 16 is a perspective view schematically illustrating a light-emitting device according to embodiment II-1 of the present invention.
Figure 17:
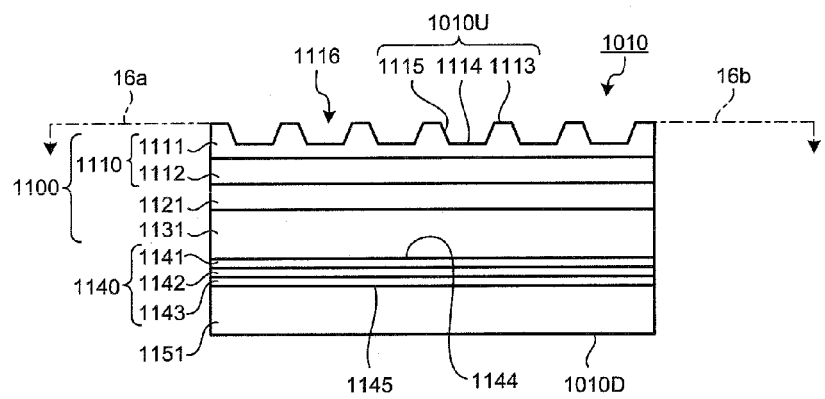
FIG. 17 is a cross-sectional view schematically illustrating a cross section of the light-emitting device shown in FIG. 16, taken along a plane that passes the line 16a-16b and is perpendicular to a light-emitting surface.

FIGS. 16 and 17 are both views for explaining a light-emitting device according to embodiment II-1 of the present invention. FIG. 16 is a perspective view schematically illustrating the light-emitting device. FIG. 17 is a cross-sectional view schematically illustrating a cross-section of the light-emitting device shown in FIG. 16 taken along a plane that passes line 16a-16b and is perpendicular to the light-emitting surface.

As shown in FIG. 16, the light-emitting device 1010 according to embodiment II-1 of the present invention is a device having a rectangular flat plate-shaped structure, and includes an organic EL element 1140 of double side emission type, and a light-emitting surface structure layer 1100 which is directly or indirectly provided on at least one surface of the organic EL element 1140. The organic EL element 1140 includes at least a first transparent electrode layer 1141, a light-emitting layer 1142, and a second transparent electrode layer 1143 in this order, and is configured so that light can be emitted from both the surfaces 1144 and 1145. In the present embodiment, since the first transparent electrode layer 1141 and the second transparent electrode layer 1143 are transparent electrode layers, light from the light-emitting layer 1142 passes through the first electrode layer 1141 and the second electrode layer 1143 and goes out of the organic EL element 1140 through the surfaces 1144 and 1145, respectively. In the following description of the second aspect of the invention, the surfaces 1144 and 1145 will therefore be referred to as "light-emitting surfaces".

As described above, the light-emitting surface structure layer 1100 is provided on the light-emitting surface 1144 of the organic EL element 1140. In the present embodiment, the light-emitting surface structure layer 1100 is provided directly in contact with the light-emitting surface 1144.

The light-emitting device 1010 of the present embodiment may further include constituent components other than the aforementioned members. In the present embodiment, a sealing substrate 1151 is provided on the light-emitting surface 1145 of the organic EL element 1140.

Consequently, the light-emitting device 1010 includes the sealing substrate 1151, the organic EL element 1140, and the light-emitting surface layer 1100 in this order. Such a light-emitting device 1010 emits light through a surface 1010U of the light-emitting surface structure layer 1100 on the side opposite to the organic EL element 1140, and emits light through a surface 1010D of the sealing substrate 1151 on the side opposite to the organic EL element 1140. The surfaces 1010U and 1010D are located at the outermost positions of the light-emitting device 1010, and light is emitted to the outside of the light-emitting device 1010 through the surfaces 1010U and 1010D. The surfaces 1010U and 1010D will thus be referred to as "light-emitting surfaces".

[II.1.1. Organic EL Element]

As exemplified by the organic EL element 1140, an organic EL element usually includes two or more electrode layers, and a light-emitting layer that is provided between these electrode layers and emits light when a voltage is applied thereto from the electrodes.

The organic EL element usually has a structure that is obtained by forming on a substrate the layers constituting the organic EL element, such as the electrodes and the light-emitting layer, and then providing a sealing member covering those layers so that the substrate and the sealing member seal the layers such as the light-emitting layer.

The light-emitting layer is not particularly limited, and a known light-emitting layer may be appropriately selected. The light emitting material in the light-emitting layer is not limited to one species, and two or more species may be used in combination at any ratio. The number of light-emitting layers is not limited to one. One type of layers or a plurality of types of layers may be used in combination in order to be adapted to its use as a light source. This can enable emission of white light or light of a color close to white.

In the second aspect of the invention, the electrode layers constituting the organic EL element are both transparent electrode layers made of transparent material. As used herein, being "transparent" means having a light transmittance suitable for use as an optical member. For example, electrodes having a high light transmittance so that the entire light-emitting device 1010 has a desired total light transmittance, which will be described later, may be used as the transparent electrode layers. Provision of the transparent electrode layers having such high transparency can improve the extraction efficiency of the light generated in the light-emitting layer, and realizes a light-emitting device through which the other side of the device can be clearly observed. As the material for the transparent electrode layers, one species thereof may be solely used. Alternatively two or more species thereof may be used in combination at any ratio. Furthermore, the transparent electrode layer may be a layer having monolayer structure including only one layer, or may be a layer having multilayer structure including two or more layers.

In addition to the light-emitting layer 1142, the organic EL element 1140 may further include other layers (not shown) between the first transparent electrode layer 1141 and the second transparent electrode layer 1143. Examples thereof may include a hole injection layer, a hole transport layer, an electron transport layer, and an electron injection layer. The organic EL element 1140 may further include optional constituent components such as wiring for applying electricity to the first transparent electrode layer 1141 and the second transparent electrode layer 1143 and a peripheral structure for sealing the light-emitting layer 1142.

Materials for constituting the transparent electrode layers and the layer(s) interposed between the transparent electrode layers are not particularly limited. Specific examples of such materials may include the following.

Examples of the material for the transparent electrode layers may include ITO (indium tin oxide).

Examples of the material for the hole injection layer may include starburst type aromatic diamine compounds.

Examples of the material for the hole transport layer may include triphenyl diamine derivatives.

Examples of the host material for a yellow light-emitting layer may include triphenyl diamine derivatives.

Examples of the dopant material for the yellow light-emitting layer may include tetracene derivatives.

Examples of the material for a green light-emitting layer may include pyrazoline derivatives.

Examples of the host material for a blue light-emitting layer may include anthracene derivatives.

Examples of the dopant material for the blue light-emitting layer may include perylene derivatives.

Examples of the material for a red light-emitting layer may include europium complexes.

Examples of the material for the electron transport layer may include aluminum quinoline complexes (Alq).

The aforementioned layers and other light-emitting layers may be suitably combined to form a light-emitting layer which is referred to as multi-layer type or tandem type which emits light having complementary colors. Examples of the combination of complementary colors may include yellow/blue, and green/blue/red.

[II.1.2. Light-Emitting Surface Structure Layer]

The light-emitting surface structure layer 1100 includes the light-emitting surface 1010U which is located at an outermost position of the light-emitting device 1010. The light-emitting surface 1010U is a surface of the light-emitting surface structure layer 1100 on the surface opposite to the organic EL element 1140, and serves as a light-emitting surface of the light-emitting device 1010. That is, the surface serves as a light-emitting surface when light is emitted from the light-emitting device 1010 to the outside of the device.

In a macroscopic view, the light-emitting surface 1010U is a surface parallel to the light-emitting surface 1144 of the organic EL element 1140 and is parallel to the main surface of the light-emitting device 1010. In a microscopic view, however, the light-emitting surface 1010U has a concavo-convex structure, and surfaces on the concave portions or convex portions can form non-parallel angles with respect to the light-emitting surface 1144. In the following description of the second aspect of the invention, unless otherwise specified, being parallel to or perpendicular to the light-emitting surface means being parallel to or perpendicular to the light-emitting surface in a macroscopic view, with the concave portions or convex portion being neglected. In the following explanation, unless otherwise specified, the light-emitting device 1010 will be described as placed with the light-emitting surface 1010U facing upward and in parallel with a horizontal direction.

Furthermore, a constituent component being "parallel" or "perpendicular" may include errors within the range of not impairing the effects of the present invention, e.g., within the range of ±5°.

The light-emitting surface structure layer 1100 includes a multi-layered body 1110 which includes a concavo-convex structure layer 1111 and a substrate film layer 1112, a supporting substrate 1131 which serves as a substrate, and a bonding layer 1121 which bonds the multi-layered body 1110 and the supporting substrate 1131.

The concavo-convex structure layer 1111 is a layer located on one surface of the light-emitting device 1010 (i.e., the outermost layer on the side of one of the light-emitting surfaces of the light-emitting device 1010, and the upper surface of the figure). A concavo-convex structure is formed on the light-emitting surface 1010U which is the surface of the concavo-convex structure layer 1111. The concavo-convex structure will be described in detail later. This concavo-convex structure is configured to include flat surface portions 1113 and 1114 parallel to the light-emitting surface 1144 of the organic EL element 1140, and inclined surface portions 1115 that are inclined with respect to such flat surface portions 1113 and 1114. Specifically, the light-emitting surface 1010U of the concavo-convex structure layer 1111 includes a plurality of concave portions 1116 which have the flat surface portions 1114 as bottom surfaces and the inclined surface portions 1115 as side surfaces, and flat surface portions 1113 corresponding to gap portions between adjacent concave portions 1116. As used herein, that the inclined surface portions are inclined with respect to the flat surface portions refers to that the inclined surface portions are not parallel to the flat surface portions.

The drawings of this specification are schematic representations, and only a small number of concave portions 1116 are shown in the light-emitting surface 1010U. In an actual light-emitting device, the light-emitting surface of a single light-emitting device may include a much larger number of concave portions.

(Description of Concavo-Convex Structure)

The concavo-convex structure of the light-emitting surface 1010U will be described hereinbelow in detail with reference to the drawings.

Figure 18:
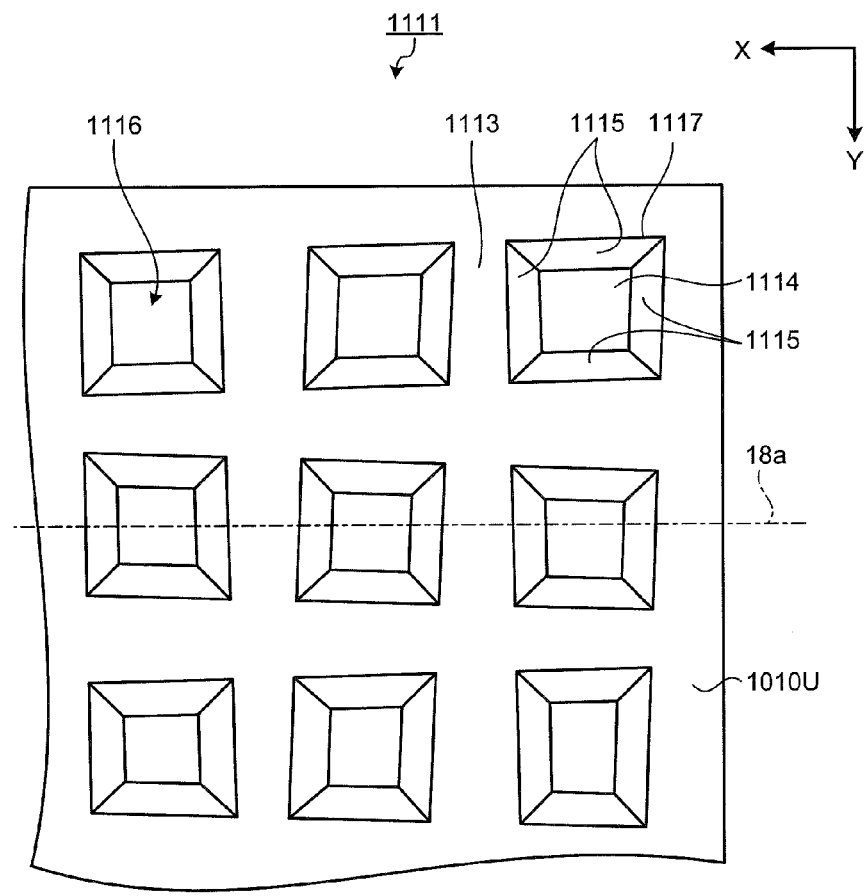
FIG. 18 is an enlarged partial plan view schematically illustrating the appearance of part of the light-emitting surface of the light-emitting device as viewed in the thickness direction of the light-emitting device.
Figure 19:
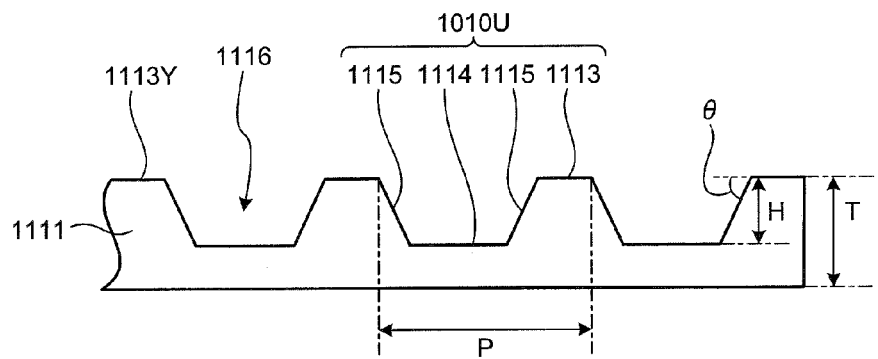
FIG. 19 is a partial cross-sectional view schematically illustrating a cross section of the concavo-convex structure layer taken along a plane that passes the line 18a of FIG. 18 and is perpendicular to the light-emitting surface.

FIG. 18 is an enlarged partial plan view schematically illustrating the appearance of part of the light-emitting surface 1010U of the light-emitting device 1010 as viewed in the thickness direction of the light-emitting device 1010. FIG. 19 is a partial cross-sectional view schematically illustrating a cross section of the concavo-convex structure layer 1111, taken along a plane that passes line 18a of FIG. 18 and is perpendicular to the light-emitting surface 1010U. The aforementioned line 18a passes all the flat surface portions 1114 of a row of concave portions 1116. In the following description according to the second aspect of the invention, the "thickness direction" refers to the thickness direction of the light-emitting device unless otherwise specified.

As shown in FIG. 18, the light-emitting surface 1010U includes a plurality of concave portions 1116 and flat surface portions 1113 which are gap portions between the concave portions 1116. The concave portions 1116 each have the shape formed by truncating a top of a quadrilateral pyramid along a surface that is in parallel with the bottom surface (prismoidal shape). Each concave portion 1116 includes a quadrilateral flat surface portion 1114 corresponding to its bottom portion, and four inclined surface portions 1114 extending from the respective four sides of the quadrilateral. Specifically, each of the four inclined surface portions 1115 constituting the concave portion 1116 has a trapezoidal shape. Boundaries 1117 between the inclined surface portions 1115 and the flat surface portions 1113 form a quadrilateral. That is, in the present embodiment, the concave portions 1116 have a quadrilateral prismoidal shape.

When the light-emitting surface 1010U has the concavo-convex structure including the flat surfaces 1113 and 1114 and the inclined surfaces 1115, the light-emitting device 1010 can improve the extraction efficiency of light through the light-emitting surface 1010U as compared to an instance wherein the light-emitting surface 1010U has no concavo-convex structure. That is, light that has been unable to be extracted because of internal reflection on the flat surface portions 1113 and 1114 can be extracted through the inclined surface portions 1115, whereby the light extraction efficiency can be improved.

The concave portions 1116 are usually disposed in a discretely dispersed manner. In this instance, a plurality of concave portions 1116 are arranged along two directions X and Y that are parallel to the light-emitting surface 1010U and orthogonal to each other. Specifically, the concave portions 1116 are continuously disposed along the two orthogonal directions X and Y at certain intervals. Gaps are formed between adjacent concave portions 1116 in the aforementioned two directions X and Y, and the gaps constitute the flat surface portions 1113. Consequently, in the light-emitting surface 1010U, usually the inclined surface portions 1115 are located around the flat surface portions 1114, and the flat surface portions 1113 are located around the inclined surface portions 1115 (and therefore, around the concave portions 1116).

Figure 20:
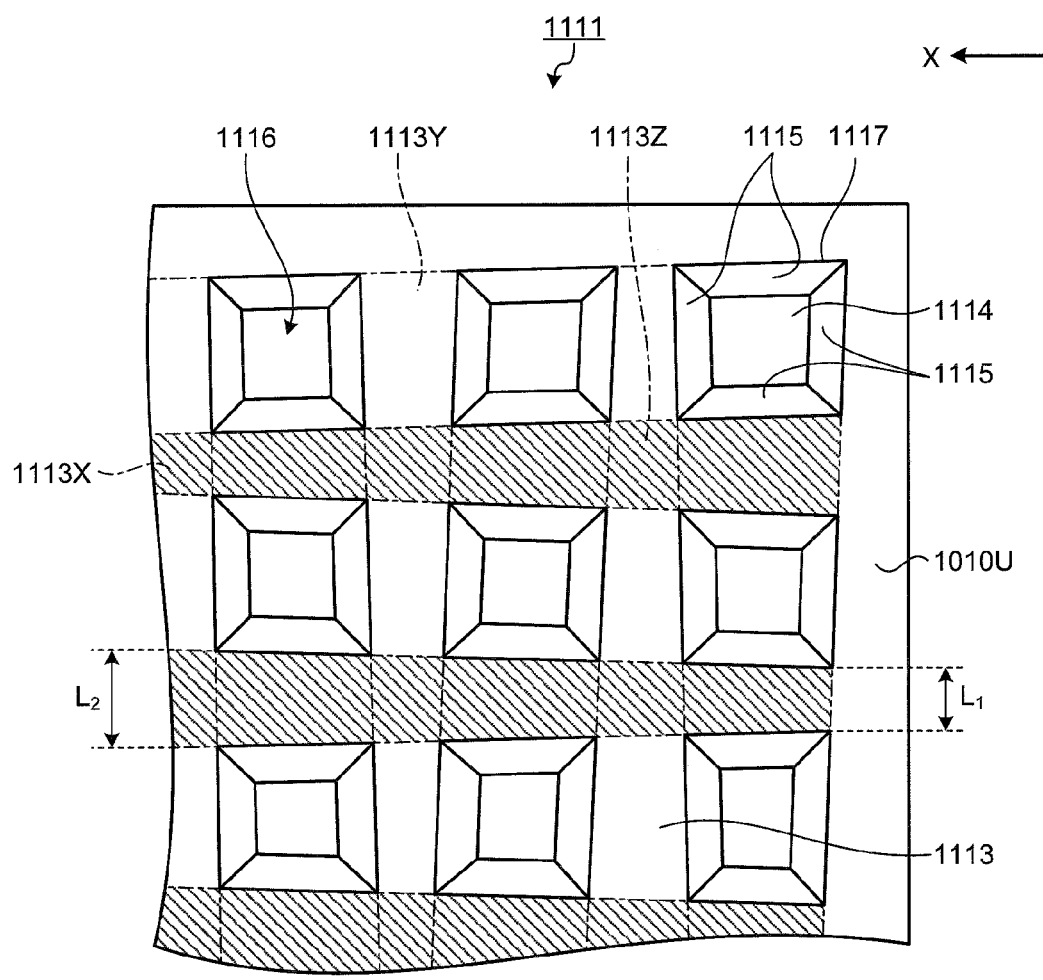
FIG. 20 is an enlarged partial plan view schematically illustrating the appearance of part of the light-emitting surface of the light-emitting device as viewed in the thickness direction of the light-emitting device.
Figure 21:
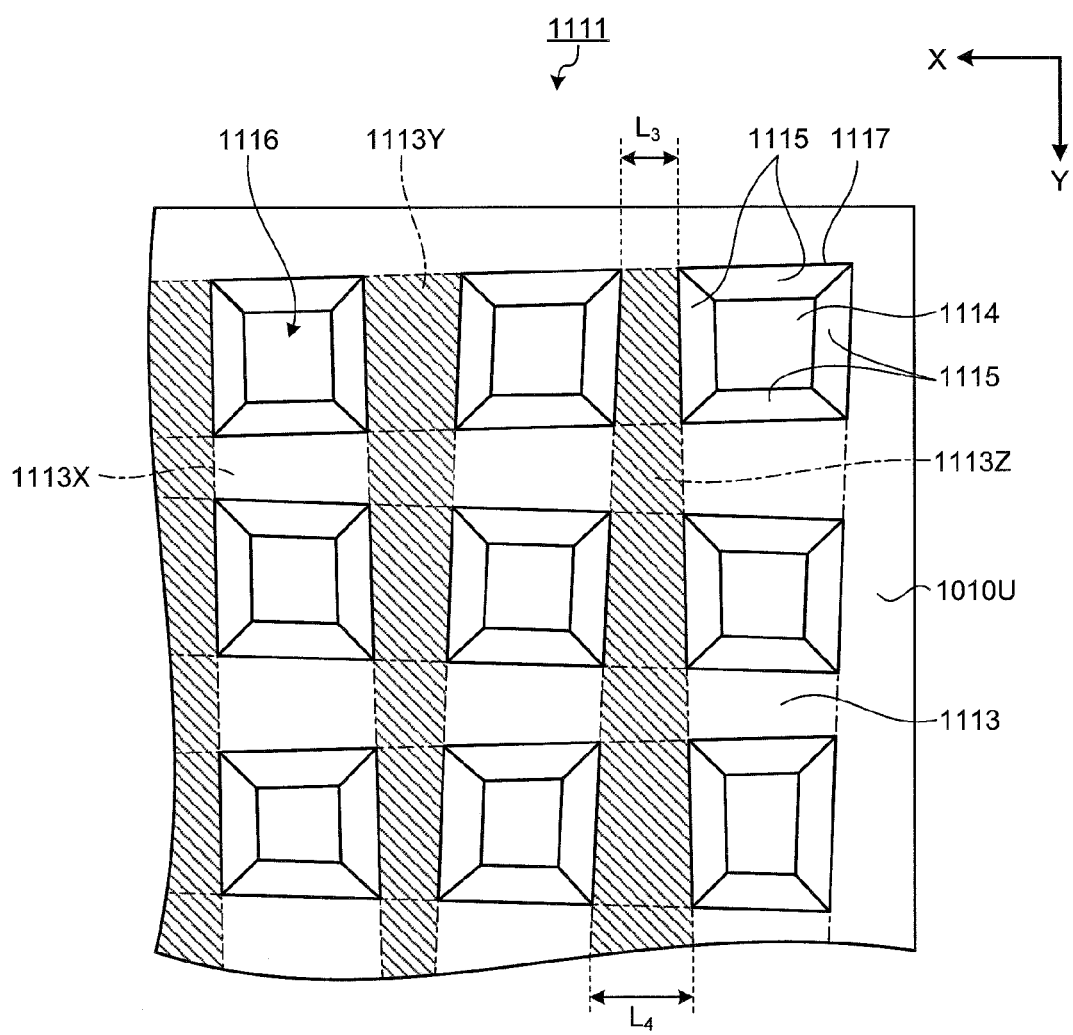
FIG. 21 is an enlarged partial plan view schematically illustrating the appearance of part of the light-emitting surface of the light-emitting device as viewed in the thickness direction of the light-emitting device.

FIGS. 20 and 21 are enlarged partial plan views schematically illustrating the appearance of part of the light-emitting surface 1010U of the light-emitting device 1010 as viewed in the thickness direction of the light-emitting device 1010. In FIG. 20, band-shaped surface portions 1113X extending along the direction X are shown with hatching. In FIG. 21, band-shaped surface portions 1113Y extending along the Y direction are shown with hatching.

As shown in FIGS. 20 and 21, the flat surface portions 1113 include a group of band-shaped surface portions 1113X extending along one direction X and a group of band-shaped surface portions 1113Y extending along another direction Y. Here, both the band-shaped surface portions 1113X and 1113Y are surface portions included in the flat surface portions 1113, and, in the present embodiment, the band-shaped surface portions are located at outer side in the thickness direction than the surrounding inclined surface portions 1115. The band-shaped surface portions 1113X and 1113Y thus constitute surface portions protruding from the surrounding inclined surface portions 1115.

Each of the band-shaped surface portions 1113X and 1113Y are a surface portion having a band shape when seen in the thickness direction. Since the direction X in which the band-shaped surface portions 1113X extend is not parallel to the direction Y in which the band-shaped surface portions 1113Y extend, the band-shaped surface portions 1113X and the band-shaped surface portions 1113Y intersect at a plurality of intersections 1113Z. Consequently, the band-shaped surface portions 1113X and the band-shaped surface portions 1113Y as their entirety have a grid shape when seen in the thickness direction.

Each of the band-shaped surface portions 1113X and 1113Y has a width that varies along each of the directions X and Y in which the band-shaped surface portions 1113X and 1113Y extend. As used herein, "width that varies" refers to that the band-shaped surface portions 1113X and 1113Y have uneven widths in the directions X and Y in which the band-shaped surface portions 1113X and 1113Y extend.

The variation herein in widths of the band-shaped surface portions 1113X and 1113Y may be in a discontinuous manner, although continuous variation is preferred because thereby production is facilitated. Continuous variation in the widths of the band-shaped surface portions 1113X and 1113Y herein means that the band-shaped surface portions 1113X and 1113Y have uneven widths in the directions X and Y such that the widths of the band-shaped surface portions 1113X and 1113Y increase or decrease gradually from one end to the other end in the directions X and Y in which the band-shaped surface portions 1113X and 1113Y extend.

In the present embodiment, the band-shaped surface portions 1113X has a width that varies along the direction X. For example, as shown in FIG. 20, the width $L_1$ of the band-shaped surface portion 1113X at one end in the direction X is different from the width $L_2$ of the band-shaped surface portion 1113X at the other end. Moreover, the band-shaped surface portions 1113Y has a width that varies along the direction Y. For example, as shown in FIG. 21, the width $L_3$ of the band-shaped surface portion 1113Y at one end in the direction Y is different from the width $L_4$ of the band-shaped surface portion 1113Y at the other end.

Since each of the band-shaped surface portions 1113X and 1113Y has a width that varies along each of their extending directions X and Y, it is possible to prevent visual recognition of the streaks of the band-shaped surface portions 1113X and 1113Y, and thereby prevent grid unevenness resulting from the band-shaped surface portions when the light-emitting device 1010 is observed. The reason why the visual recognition of the band-shaped surface portions 1113X and 1113Y can be prevented is not clear. According to an analysis by the present inventor, that might be because regularity of the shape of the band-shaped surface portions 1113X and 1113Y can be reduced by uneven widths of the band-shaped surface portions 1113X and 1113Y. For example, when the band-shaped surface portions have a uniform width as in the prior art, the surface shape of the light-emitting surface has high regularity when viewed in the thickness direction. Due to such high regularity, a constant regularity is also given to the visibility of the reflected light on the light-emitting surface, which is considered to act as the cause of the recognition of the streaks of the band-shaped surface portions. Moreover, when the surface shape of the light-emitting surface has high regularity as in the prior art, periodic structures of the inclined surfaces around the band-shaped surface portions may cause interference and diffraction. Intensification and attenuation of light by such interference and diffraction is also considered to be the cause of the recognition of the streaks of the band-shaped surface portions. On the other hand, when the band-shaped surface portions 1113X and 1113Y have uneven widths, the regularity of the surface shape of the light-emitting surface is reduced, which is considered to contribute to suppression of the visual recognition of the band-shaped surface portions as streaks.

When band-shaped surface portions extending in different directions intersect each other and the intersecting band-shaped surface portions are in different positions in the thickness direction, the widths of such band-shaped surface portions can be easily identified. However, as in the present embodiment, the intersecting band-shaped surface portions 1113X and 1113Y are in the same position in the thickness direction, the widths of the band-shaped surface portions 1113X and 1113Y at the intersections 1113Z might not be clearly identifiable. In such a case, the visual recognition of the band-shaped surface portions 1113X and 1113Y can be prevented if each of the band-shaped surface portions 1113X and 1113Y has a width that varies other than the portions at the intersections 1113Z. This is because it is considered that the visual recognition of the band-shaped surface portions 1113X and 1113Y is the result of observation of light with reflection, diffraction, interference, and the like on the band-shaped surface portions 1113X and 1113Y other than the portions at the intersections 1113Z.

When the band-shaped surface portions 1113X and 1113Y are in a shape whose width gradually increases in width from one end to the other, the directions along which the widths increases may be uniform or non-uniform. For example, FIG. 20 shows an example wherein both band-shaped surface portions 1113X whose width increase from the left end in the figure to the right end in the figure (in FIG. 20, the first band-shaped surface portion 1113X from the top) and band-shaped surface portions whose width increase from the right end in the figure to the left end in the figure (in FIG. 20, the second band-shaped surface portion 1113X from the top) coexist on one light-emitting surface 1010U. However, the directions may be made uniform.

Furthermore, the band-shaped surface portions 1113X and 1113Y may have either the same size or different size.

Specific size of the band-shaped surface portions 1113X and 1113Y may be arbitrary set unless the effects of the present invention are impaired. For example, the band-shaped surface portions 1113X and 1113Y may usually have a width of 5.0 μm or larger, preferably 7.5 μm or larger, and more preferably 10.0 μm or larger, and usually 500 or smaller, preferably 400 μm or smaller, and more preferably 300 μm. By setting the width of the band-shaped surface portions 1113X and 1113Y to not less than the lower limit of the aforementioned range, the light extraction efficiency can be effectively improved. By setting the width to not more than the upper limit, visibility of the other side of the light-emitting device 1010 therethrough with the naked eye can be improved.

The degree of width variation of the band-shaped surface portions 1113X and 1113Y may depend on the width and length of the band-shaped surface portions 1113X and 1113Y. From the viewpoint of providing the effects of the present invention, a preferred range of the ratio between the maximum value and minimum value (maximum value/minimum value) of the width of the band-shaped surface portions 1113X and 1113Y is usually 1.1 or larger, preferably 1.2 or larger, and more preferably 1.5 or larger, and usually 3 or smaller, preferably 2.9 or smaller, and more preferably 2.8 or smaller.

Figure 22:
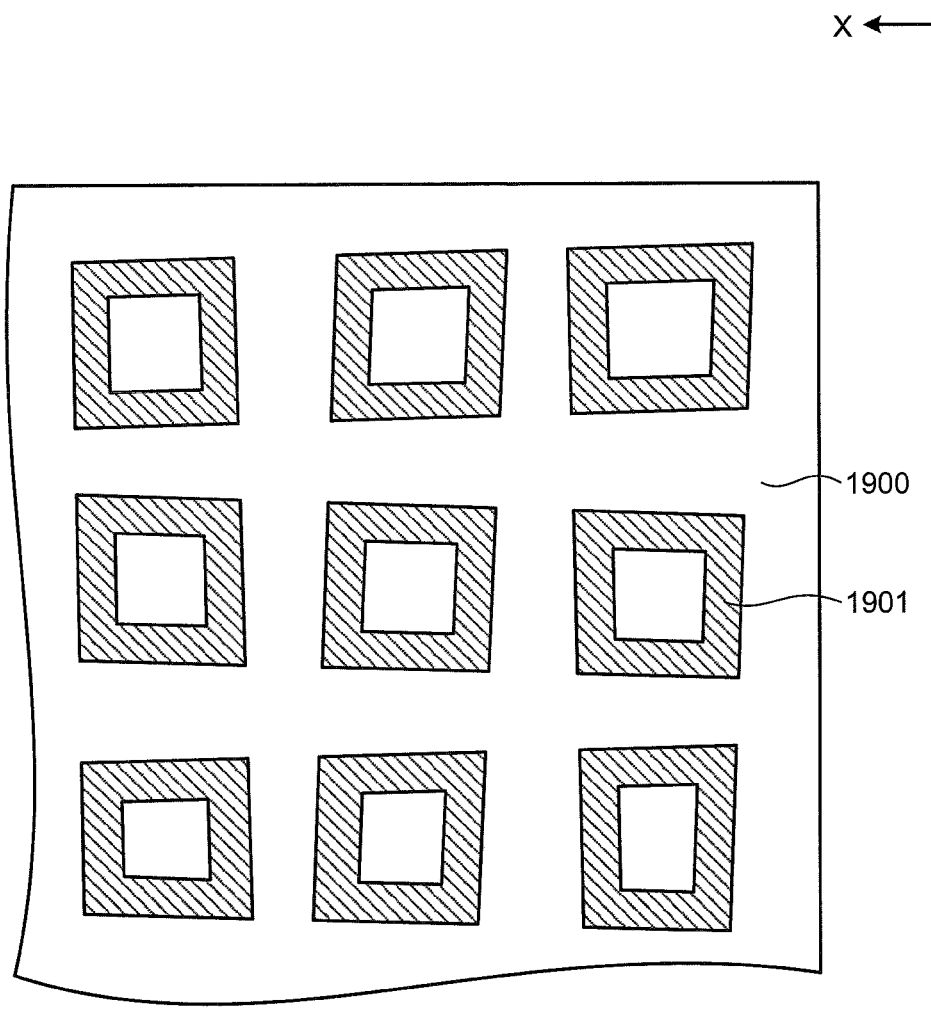
FIG. 22 is a projection view schematically illustrating the appearance of the inclined surface portions of the light-emitting surface of the light-emitting device, projected upon a plane parallel to the flat surface portions in a direction perpendicular to the flat surface portions.

FIG. 22 is a projection view schematically illustrating the appearance of the inclined surface portions 1115 of the light-emitting surface 1010U of the light-emitting device 1010, projected upon a plane 1900 parallel to the flat surface portions 1113 and 1114 in a direction perpendicular to the flat surface portions 1113 and 1114. In the present embodiment, the direction perpendicular to the flat surface portions 1113 and 1114 coincides with the direction perpendicular to the light-emitting surface 1010U and a direction parallel to the thickness direction of the light-emitting device 1010. The plane 1900 parallel to the flat surface portions 1113 and 1114 is a plane parallel to the light-emitting surface 1010U. Note that the aforementioned plane 1900 parallel to the flat surface portions 1113 and 1114 is not a plane that the light-emitting device 1010 has, but is a projection plane that is assumed in order to measure the projected area of the inclined surface portions 1115. In FIG. 22, projection images 1901 of the inclined surface portions 1115 of the light-emitting surface 1010U of the light-emitting device 1010, projected on the plane 1900 parallel to the flat surface portions 1113 and 1114 in the direction perpendicular to the flat surface portions 1113 and 1114 are shown with hatching.

As shown in FIG. 22, in the light-emitting device 1010 according to the present embodiment, the projected area formed by projecting the inclined surface portions 1115 on the plane 1900 parallel to the flat surface portions 1113 and 1114 in the direction perpendicular to the flat surface portions 1113 and 1114 is usually 0.1 times or less times, preferably 0.05 times or less times, and more preferably 0.01 times or less times the total area of the flat surface portions 1113 and 1114. The lower limit of the ratio of the projected area of the inclined surface portions 1115 with respect to the total area of the flat surface portions 1113 and 1114 is usually 0.0001 times or more times, preferably 0.0005 times or more times, and more preferably 0.001 times or more times.

As a result, the other side of the light-emitting device 1010 can be observed therethrough. If a concavo-convex structure provided on a prior-art light-emitting device of single side emission type is applied to a light-emitting device of double side emission type, haze thereof usually increases due to high proportion of the inclined surface portions. As a result, the other side of the light-emitting device can not be observed therethrough. In contrast, by confining the proportion of the projected area of the inclined surface portions 1115 with respect to the total area of the flat surface portions 1113 and 1114 within the aforementioned range, it is possible to suppress increase of haze due to the concavo-convex structure when viewed in the direction perpendicular to the light-emitting surface 1010U. Consequently, according to the light-emitting device 1010 of the present embodiment, the see-through feature is not impaired despite the presence of the concavo-convex structure because increase of haze can be suppressed.

Furthermore, according to the light-emitting device 1010 of the present embodiment, the concavo-convex structure is prevented from, e.g., being chipped by an external impact, and therefore the mechanical strength of the light-emitting surface 1010U can be improved. In general, when a surface has a concavo-convex structure and an impact is applied to the surface, its force tends to concentrate on a part of the concavo-convex structure to cause breakage. In contrast, according to the light-emitting device 1010 of the present embodiment, the flat surface portions 1113 are located at the same position in the thickness direction to form a uniform flat surface. This can suppress the concentration of force on part of the concavo-convex structure layer 111 even when force or an impact is applied from outside to the light-emitting surface 1010U. As a result, breakage of the concavo-convex structure layer 1111 can be avoided, and both a favorable light extraction efficiency and a high mechanical strength of the light-emitting surface 1010U of the light-emitting device 1010 can be achieved.

As shown in FIG. 19, the maximum value of a height difference H between the flat surface portions 1113 and the flat surface portions 1114 of the light-emitting surface 1010U is preferably 22 µm or smaller, and may be 21.5 µm or smaller, or 21.0 µm or smaller. The lower limit is usually 0.1 µm or larger, and may be 0.15 µm or larger, or 0.2 µm or larger. As used herein, the height difference refers to the distance in the thickness direction. The height difference H between the flat surface portions 1113 and the flat surface portions 1114 according to the present embodiment therefore refers to the depth of the concave portions 1116.

By setting the maximum value of the height difference H between the flat surface portions 1113 and the flat surface portions 1114 within such a range, the other side of the light-emitting device 1010 can be observed therethrough even when viewed in a direction (inclined direction) inclined with respect to the normal direction of the light-emitting surface 1010U. Higher area ratio of the inclined surface portions 1115 tends to cause larger haze when the light-emitting surface 1010U is observed in an inclined direction. On the other hand, if the ratio of the projected area of the inclined surface portions 1115 with respect to the total area (entire area) of the flat surface portions 1113 and 1114 falls within the aforementioned range and the maximum value of the height difference H between the flat surface portions 1113 and the flat surface portions 1114 falls within the aforementioned range, it is possible to suppress an increase of the haze when viewed in an inclined direction. This can prevent the see-through feature from being impaired even when the light-emitting device 1010 is viewed in an inclined direction.

As shown in FIG. 19, the inclined surface portions 1115 are preferably inclined at an inclination angle φ of usually 80° or larger, preferably 81° or larger, and more preferably 82° or larger, and usually smaller than 90°, preferably 89° or smaller, and more preferably 88° or smaller with respect to the flat surface portions 1113 and 1114. That is, the inclined surface portions 1115 each are a surface not parallel to the flat surface portions 1113 and 1114. The angles θ formed between the inclined surface portions 1115 and the flat surface portions 1113 and 1114 preferably fall within the aforementioned range. Such large inclination angles θ of the inclined surface portions 1115 can stably enhance the light extraction efficiency. As compared to an instance wherein the inclination angle φ is small, the large inclination angle φ can reduce the projected area per inclined surface portion 1115. Therefore, by having such a feature, the other side of the light-emitting device 1010 can be more clearly observed therethrough when viewed in the direction perpendicular to the light-emitting surface 1010U. The direction perpendicular to the light-emitting surface 1010U is the front direction of the light-emitting device 1010. Since the other side of the light-emitting device 1010 is frequently observed therethrough from such a front direction, the aforementioned advantage is practically useful.

In the present embodiment, all the inclined surface portions 1115 are set to the same inclination angle θ. This is not restrictive, and the inclined surface portions 1115 may have different inclination angles.

The thickness T of the concavo-convex structure layer 1111 is preferably set to an appropriate range in relation to the maximum value of the height difference H between the flat surface portions 1113 and the flat surface portions 1114 described above. For example, when the concavo-convex structure layers 1111 are made of a hard material which is advantageous in maintaining the durability of the concavo-convex structure layer 1111, it is preferable to reduce the thickness T of the concavo-convex structure layer 1111, because thereby the flexibility of the light-emitting device 1010 can be improved, so that the concavo-convex structure layer 1111 can be easily handled in the production process of the light-emitting device 1010. Specifically, the difference between "the maximum value of the height difference H of the flat surface portions 1113 and the flat surface portions 1114" and "the thickness T of the concavo-convex structure layer 1111" is preferably 0 to 30 µm.

In the directions X and Y in which the concave portions 1116 are arranged, the pitch P of the concave portions 1116 is usually 0.1 µm or larger, preferably 0.15 µm or larger, and more preferably 0.2 µm or larger, and usually 500 µm or smaller, preferably 450 µm or smaller, and more preferably 400 µm or smaller. By setting the pitch P to not less than the lower limit of the aforementioned range, the light extraction efficiency can be improved. By setting the pitch P to not more than the upper limit, transparency can be improved.

It is preferable that the concavo-convex structure layer 1111 has a thickness T of 1 µm to 70 µm, although not limited thereto. In the present embodiment, the thickness T of the concavo-convex structure layer 1111 is the distance between its surface facing the substrate film layer 1112 with no concavo-convex structure formed thereon and the flat surface portion 1113.

It is preferable that the substrate film layer 1112 has a thickness of 20 µm to 300 µm.

(Description of Materials for Multi-Layered Body)

The light-emitting surface structure layer 1100 may be composed of a plurality of layers, or may be composed of a single layer. From the viewpoint of easily obtaining a light-emitting surface structure layer 1100 having a desired characteristics, a plurality of layers are preferably included. In the present embodiment, as shown in FIG. 16, the light-emitting surface structure layer 1100 includes the multi-layered body 1110 which is the combination of the concavo-convex structure layer 1111 and the substrate film layer 1112. With such a structure, a light-emitting surface structure layer 1100 having high performance can be easily obtained.

The concavo-convex structure layer 1111 and the substrate film layer 1112 are usually formed from a transparent resin. In the present embodiment, each layer constituting the light-emitting surface structure layer 1100 may have a light transmittance suitable for use as an optical member. For example, the entire light-emitting surface structure layer 1100 may have a total light transmittance of 80% or higher.

The transparent resin is not particularly limited. A variety of resins that can form a transparent layer may be used. Examples thereof may include thermoplastic resins, thermosetting resins, ultraviolet curable resins, and electron beam-curable resins. Of these, thermoplastic resins can be easy deformed by heat, and ultraviolet curable resins have high curability and high efficiency. Therefore, these resins are preferable because therewith the concavo-convex structure layer 1111 can be efficiently formed.

Examples of the thermoplastic resins may include polyester-based, polyacrylate-based, and cycloolefin polymer-based resins. Examples of the ultraviolet curable resins may include epoxy-based, acrylic-based, urethane-based, ene/thiol-based, and isocyanate-based resins. Among such resins, resins having a plurality of polymerizable functional groups may be suitably used. As the aforementioned resins, one species thereof may be solely used, or two or more thereof may be used in combination at any ratio.

Particularly, a material having high hardness after curing is preferable as the material of the concavo-convex structure layer 1111 constituting the multi-layered body 1110, because with such a material the concavo-convex structure of the light-emitting surface 1010U can be easily formed, and abrasion resistance of the concavo-convex structure can be easily achieved. Specifically, it is preferable to use a material that forms a resin layer having a pencil hardness of HB or higher when the resin layer having a thickness of 7 μm with no concavo-convex structure is formed on a substrate. A material that forms the layer having a pencil hardness of H or higher is more preferable, and a material that forms the layer having a pencil hardness of 2H or higher is still more preferable. Meanwhile, it is preferable that the material of the substrate film layer 1112 has a certain degree of flexibility in order to facilitate handling of the material when the concavo-convex structure layer 1111 is formed and to facilitate handling of the multi-layered body 1110 after the formation of the multi-layered body 1110. Use of a combination of such materials gives a multi-layered body 1110 that can easily be handled and has high durability, and therefore facilitates production of the light-emitting device 1010 having a high-performance.

Such a combination of materials may be obtained by selecting, as the resins constituting respective materials, appropriate resins from the above-exemplified transparent resins. Specifically, an ultraviolet curable resin such as an acrylate is preferably used as the transparent resin constituting the material of the concavo-convex structure layer 1111, and a film made of an alicyclic olefin polymer (such as ZEONOR film which will be described later) or a polyester film is preferably used as the transparent resin constituting the material of the substrate film layer 1112.

When the light-emitting surface structure layer 1100 includes the concavo-convex structure layer 1111 and the substrate film layer 1112 as in the present embodiment, the refractive index of the concavo-convex structure layer 1111 may be as close as possible to the refractive index of the substrate film layer 1112. In this case, the difference in refractive index between the concavo-convex structure layer 1111 and the substrate film layer 1112 is preferably 0.1 or smaller and more preferably 0.05 or smaller.

As the material for the layers that are the constituent components of the light-emitting surface structure layer 1100 such as the concavo-convex structure layer 1111 and the substrate film layer 1112, a material having a light diffusion property may be used as long as the property does not impair the see-through feature. By using such light-diffusing materials, the light passing through the light-emitting surface structure layer 1100 can be diffused while maintaining the see-through feature, and change in the color tone depending on the observation angle can be further reduced.

Examples of the material having a light diffusion property may include particle-containing materials and alloy resins that contain a mixture of two or more resins to have light diffusing ability. Of these, particle-containing materials are preferred from the viewpoint of easy adjustability of the light diffusion property. Particle-containing resins are particularly preferred.

The particles may be either transparent or non-transparent. Examples of the material of the particles may include metals, metal compounds, and resins. Examples of the metal compounds may include metal oxides and nitrides. Specific examples of the metals and metal compounds may include: metals having high reflectance, such as silver and aluminum; and metal compounds such as silicon oxide, aluminum oxide, zirconium oxide, silicon nitride, tin-doped indium oxide, and titanium oxide. Meanwhile, examples of the resins may include methacrylic resins, polyurethane resins, and silicone resins. As the materials of the particles, one species thereof may be solely used, or two or more thereof may be used in combination at any ratio.

Examples of the shape of the particles may include a spherical shape, a cylindrical shape, a cubic shape, a rectangular cuboid shape, a pyramidal shape, a conical shape, and a star-like shape.

If necessary, the resin composition may further contain optional components. Examples of the optional components may include additives such as: antidegradants such as phenol-based and amine-based antidegradants; antistatic agents such as surfactant-based and siloxane-based antistatic agents; and light resistant agents such as triazole-based and 2-hydroxy-benzophenone-based light resistant agents.

(Supporting Substrate)

As shown in FIG. 16, the light-emitting device 1010 of the present embodiment includes the supporting substrate 1131 between the organic EL element 1140 and the multi-layered body 1110. The provision of the supporting substrate 1131 can give the light-emitting device 1010 stiffness for suppressing warpage. The substrate for use as the supporting substrate 1131 may be a substrate which has a high ability to seal the organic EL element 1140, and may also be a substrate on which sequential formation of layers constituting the organic EL element 1140 in the production process can be easily performed. By using such a substrate, the durability of the light-emitting device 1010 can be improved, and production process thereof can be facilitated.

The supporting substrate 1131 is usually made of a transparent material. Examples of the material may include glass and resins. As the materials of the supporting substrate 1131, one species thereof may be solely used, or two or more thereof may be used in combination at any ratio.

Although no particular limitation is imposed on the refractive index of the material constituting the supporting substrate 1131, but the refractive index thereof is preferably 1.4 to 2.0.

Although no particular limitation is imposed on the thickness of the supporting substrate 1131, the thickness is preferably 0.1 mm to 5 mm.

(Bonding Layer)

The light-emitting device 1010 of the present embodiment includes the bonding layer 1121 between the multi-layered body 1110 and the supporting substrate 1131. The bonding layer 1121 is a layer that is interposed between the substrate film layer 1112 of the multi-layered body 1110 and the supporting substrate 1131 and bonds the two layers.

An adhesive used as the material of the bonding layer 1121 is not limited to an adhesive in a narrow sense (a so-called hot-melt adhesive having a shear storage modulus at 23° C. of 1 to 500 MPa and exhibiting no tackiness at room temperature) but includes a tackiness agent having a shear storage modulus at 23° C. of smaller than 1 MPa. Specifically, a transparent adhesive having a refractive index close to that of the supporting substrate 1131 or the substrate film layer 1112 may be appropriately used. More specifically, acrylic adhesives or tackiness agents may be used. The thickness of the bonding layer is preferably 5 μm to 100 μm.

[II.1.3. Sealing Substrate]

The light-emitting device 1010 of the present embodiment includes the sealing substrate 1151 on the light-emitting surface 1145. The sealing substrate 1151 may be provided directly in contact with the light-emitting surface 1145. An optional substance such as a filler and an adhesive may be present between the light-emitting surface 1145 and the sealing substrate 1151, and a gap may be present therebetween. Air or other gases may be present in the gap, so long as a problem such as significant deterioration of the durability of the light-emitting layer 1142 does not occur, or the gap may be vacuum.

As the sealing substrate 1151, any material that can seal the organic EL element 1140 and allow the light emitted from the light-emitting surface 1145 to pass may be used. Examples thereof may include materials that are the same as those for the supporting substrate 1131.

[II.1.4. Production Method]

The method of producing the light-emitting device 1010 is not particularly limited. For example, the device may be produced by performing the steps of: stacking the respective layers constituting the organic EL element 1140 on one surface of the supporting substrate 1131; preparing the multi-layered body 1110 including the concavo-convex structure layer 1111 and the substrate film layer 1112; bonding the prepared multi-layered body 1110 onto the other surface of the supporting substrate 1131 via the bonding layer 1121; and providing the sealing substrate 1151 on the surface of the organic EL element 1140 on the side opposite to the supporting substrate 1131. There is no restriction about the order of the aforementioned steps as far as a desired light-emitting device 1010 is obtained.

The multi-layered body 1110 including the concavo-convex structure layer 1111 and the substrate film layer 1112 may be formed by, e.g., preparing a mold such as a molding die having a desired shape, and transferring the shape to a layer of a material for forming the concavo-convex structure layer 1111. Specific examples of the method may include:

(method 1) a method including preparing an unprocessed multi-layered body including a layer of a resin composition A for constituting the substrate film layer 1112 and a layer of a resin composition B for constituting the concavo-convex structure layer 1111 (concavo-convex structure has not been formed yet at this point) and forming a concavo-convex structure on the surface of the resin composition B in the unprocessed multi-layered body; and (method 2) a method including applying the resin composition B in liquid form onto the substrate film layer 1112, placing a mold on the applied resin composition B, and curing the resin composition B keeping that state, to form the concavo-convex structure layer 1111.

In the method 1, the unprocessed multi-layered body may be obtained by, e.g., extrusion molding in which the resin A and the resin B are co-extruded. A mold having a desired surface shape is pressed against the surface of the resin B in the unprocessed multi-layered body, whereby the concavo-convex structure may be formed.

More specifically, a long unprocessed multi-layered body may be formed in a continuous manner by extrusion molding, and the multi-layered body is then pressed between a transfer roller having the desired surface shape and a nip roller, whereby continuous production can be performed in an efficient manner. The nipping pressure between the transfer roller and the nip roller is preferably several MPa to several tens of MPa. Preferably, the temperature during transfer is equal to or higher than Tg and equal to or lower than (Tg 100° C.), wherein Tg is the glass transition temperature of the resin B. The duration of the contact of the unprocessed multi-layered body with the transfer roller may be adjusted by the feeding speed of the film, i.e., the rotation speed of the rollers, and is preferably 5 seconds or longer and 600 seconds or shorter.

In the method 2, it is preferable to use, as the resin B for constituting the concavo-convex structure layer 1111, a composition that is curable with energy rays such as ultraviolet rays. Such a resin B is applied onto the substrate film layer 1112. With the mold in contact, the resin B is irradiated with the energy rays such as ultraviolet rays from a light source located on the back side of the applied surface (the side of the substrate film layer that is opposite to the side onto which the resin B is applied) for curing the resin B. Subsequently, by removing the mold, the multi-layered body 1110 may be obtained with the coating layer of the resin B as the concavo-convex structure layer 1111.

[II.1.5. Description of Main Advantages]

Since the light-emitting device 1010 of the present embodiment is configured as described above, light emitted from the light-emitting surface 1144 of the organic EL element 1140 passes through the light-emitting surface structure layer 1100 and goes out through the light-emitting surface 1010U, whereas light emitted from the light-emitting surface 1145 passes through the sealing substrate 1151 and goes out through the light-emitting surface 1010D.

Since the light-emitting surface 1010U has the concavo-convex structure including the flat surface portions 1113 and 1114 and the inclined surface portions 1115, the light can be extracted through the light-emitting surface 1010U with high efficiency.

Moreover, since each of the band-shaped surface portions 1113X and 1113Y has a width that varies along each of the extending directions X and Y, visual recognition of the band-shaped surface portions 1113X and 1113Y can be prevented. The occurrence of grid unevenness resulting from the band-shaped surface portions can also be prevented.

Furthermore, the layers the light-emitting device 1010 has are all transparent. Therefore, in the light-emitting device 1010, light incident on one light-emitting surface 1010U can pass through the light-emitting device 1010 and go out through the other light-emitting surface 1010D. Light incident on the other light-emitting surface 1010D can also pass through the light-emitting device 1010 and goes out through the one light-emitting surface 1010U. Furthermore, in the present embodiment, since the ratio of the projected area of the inclined surface portions 1115 with respect to the total area of the flat surface portions 1113 and 1114 is confined within a predetermined range, haze can be suppressed. This realizes clear observation of the other side of the light-emitting device 1010 therethrough by the naked eye, whereby a light-emitting device of see-through type can be realized.

Specifically, the light-emitting device 1010 as its entirety usually has a total light transmittance of 60% or higher, preferably 70% or higher, and more preferably 80% or higher. The upper limit is ideally 100%, and usually 90% or smaller.

Furthermore, since the shape of the concavo-convex structure of the light-emitting device 1010 is appropriately defined, the light-emitting device 1010 as its entirety usually has a haze as small a value as 10% or smaller, preferably 8% or smaller, and more preferably 6% or smaller. The lower limit is ideally 0%, and usually 0.1% or larger.

II.2. Embodiment II-2

In embodiment II-1, the concavo-convex structure is disposed on either one of the two light-emitting surfaces of the organic EL element. However, the concavo-convex structure may be disposed on both the light-emitting surfaces. An example thereof will be described hereinbelow with reference to the drawings.

Figure 23:
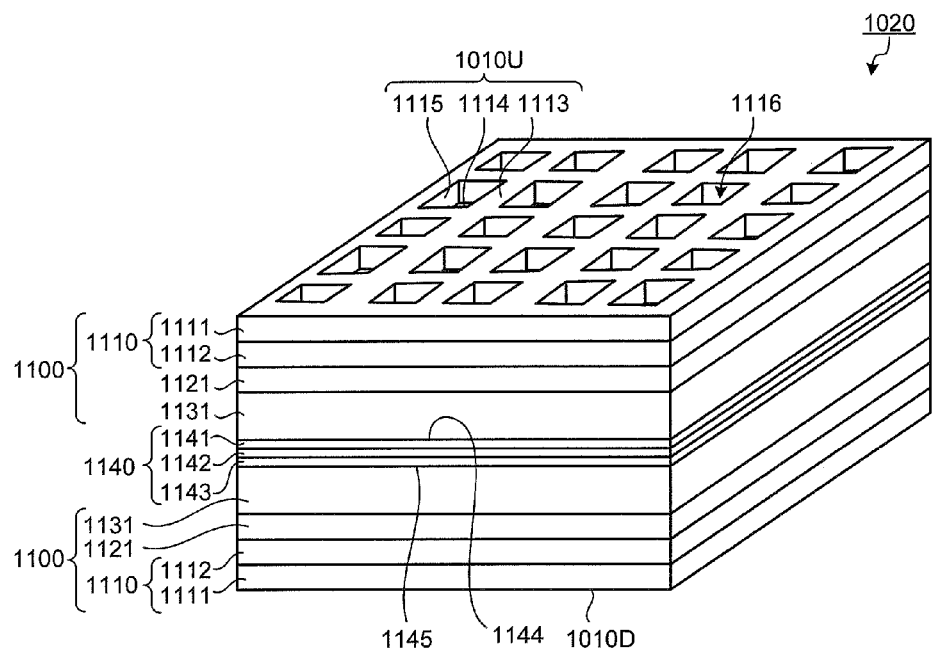
FIG. 23 is a perspective view schematically illustrating a light-emitting device according to embodiment II-2 of the present invention.

FIG. 23 is a perspective view schematically illustrating a light-emitting device according to embodiment II-2 of the present invention. As shown in FIG. 23, the light-emitting device 1020 according to embodiment II-2 of the present invention is the same as the light-emitting device 1010 according to embodiment II-1 except that a light-emitting surface structure layer 1100 is provided in place of the sealing substrate 1151. As a result, the light-emitting device 1020 has the light-emitting surface structure layers 1100 on both of the two light-emitting surfaces 1144 and 1145 of the organic EL element 1140. The light-emitting device 1020 thus has the concavo-convex structure on both of the two light-emitting surfaces 1010U and 1010D. In the present embodiment, the concavo-convex structure layers provided on the two light-emitting surfaces have the same shape. However, such a configuration is not restrictive, and the concavo-convex structure on one of the light-emitting surfaces may have a shape different from that of the concavo-convex structure on the other light-emitting surface.

Since the light-emitting device 1020 of the present embodiment is configured as described above, the light emitted from the light-emitting surface 1144 of the organic EL element 1140 goes out through the light-emitting surface 10U. The light emitted from the light-emitting surface 1145 goes out through the light-emitting surface 1010D. In this instance, the light can be extracted with high efficiency while maintaining the see-through feature. In addition, visual recognition of the band-shaped surface portions 1113X and 1113Y (see FIG. 23) can be prevented on both of the light-emitting surface 1010U and the light-emitting surface 1010D. Furthermore, the same effects as those of embodiment II-1 can be obtained.

II.3. Embodiment II-3

In embodiment II-1 and embodiment II-2, the flat surface portions 1113 and the flat surface portions 1114 on the same light-emitting surface 1010U have a constant height difference H. However, such a height difference H may be made uneven to provide size differences. In particular, when a size difference exceeding a difference that causes interference of either or both of the emission light go out through the light-emitting surface 1010U and the reflected light reflected on the light-emitting surface 1010U is provided, rainbow unevenness resulting from the interference of either or both of the emission light and the reflected light can be suppressed, and such a feature is therefore preferable. As used herein, the emission light that goes out through the light-emitting surface includes not only the light emitted from the organic EL element but also light that entered into the light-emitting device through the side opposite to the light-emitting surface and then passed through the light-emitting device. An example of such a concavo-convex structure will be described hereinbelow with reference to the drawings.

Figure 24:
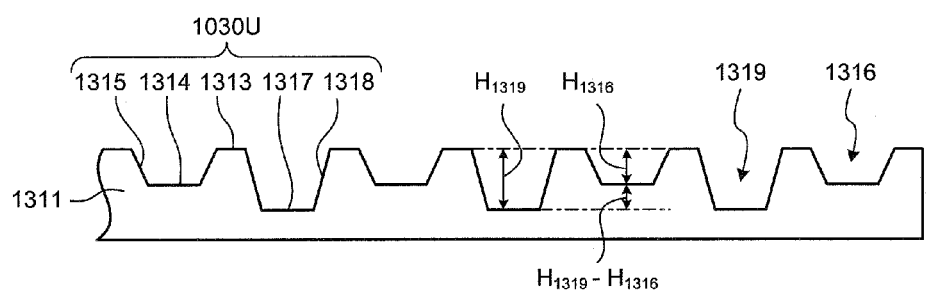
FIG. 24 is a cross-sectional view schematically illustrating a cross section of a concavo-convex structure layer according to embodiment II-3 of the present invention.

FIG. 24 is a cross-sectional view schematically illustrating a cross section of the concavo-convex structure layer according to embodiment II-3 of the present invention. As shown in FIG. 24, on a light-emitting surface 1030U which is the surface of the concavo-convex structure layer 1311 according to embodiment II-3 of the present invention, a plurality of concave portions 1316 having a flat surface portion 1314 as a bottom surface and inclined surface portions 1315 as side surfaces and a plurality of concave portions 1319 having a flat surface portion 1317 as a bottom surface and inclined surface portions 1318 as side surfaces are formed. In addition, gaps are provided between the concave portions 1316 and 1319. The gaps constitute flat surface portions 1313.

Similar to the flat surface portions 1113 of embodiment II-1, in the light-emitting surface 1030U of the present embodiment, the flat surface portions 1313 include two groups of band-shaped surface portions extending along two directions that are parallel to the light-emitting surface 1030U and orthogonal to each other. Each of the band-shaped surface portions has a width that varies along the direction in which the band-shaped surface portion extends. Similar to embodiment II-1, the projected area of the inclined surface portions 1315 and 1318 is usually 0.1 times or less times the total area of the flat surface portions 1313, 1314, and 1317.

The depth $H_{1316}$ of the concave portions 1316 (i.e., height difference between the flat surface portions 1313 and the flat surface portions 1314) is smaller than the depth $H_{1319}$ of the concave portions 1319 (i.e., height difference between the flat surface portions 1313 and the flat surface portions 1317). In this case, if the depth $H_{1316}$ of the concave portions 1316 and the depth $H_{1319}$ of the concave portions 1319 have a size difference $H_{1319}$–$H_{1316}$ exceeding a difference that causes interference of either or both of emission light and reflected light, rainbow unevenness resulting from interference can be suppressed. The aforementioned size difference $H_{1319}$–$H_{1316}$ may be a size difference exceeding a difference that causes the interference of the emission light, but is preferably a size difference exceeding a difference that causes the interference of the reflected light, more preferably a size difference exceeding a difference that causes the interference of both the emission light and the reflected light, since the reflected light tends to have a larger influence on rainbow unevenness than the emission light. More specifically, without the aforementioned size difference, the reflected light from the flat surface portions 1313, 1314, and 1317 of the top surface of the concavo-convex structure layer 1311 and the reflected light from the bottom surface of the concavo-convex structure layer 1311 have caused interference to produce rainbow unevenness. The provision of the aforementioned predetermined size difference for the concavo-convex structure on the surface can suppress interferences between the beams of the reflected light, and can suppress rainbow unevenness on the light-emitting surface 1030U.

For example, in the case of the interference of the emission light emitted from the organic EL element, the aforementioned size difference exceeding a difference that causes the interference is usually a size difference 0.62 times or more times, and preferably 1.5 times or more times, the center wavelength of the emission light. When such size differences are provided, the occurrence of rainbow unevenness can be suppressed. The upper limit of these size differences is not particularly limited but is preferably equal to or smaller than 60 times the center wavelength of the emission light.

The aforementioned numerical range has been verified by the following findings. In an instance of a structure layer designed such that all the flat portions have the same depth in the concave portions, suppose that, when the error in the depth of the concave portions is 170 nm or larger, interference occurs and rainbow unevenness is observed. It has been found out that, in such an instance, the occurrence of the rainbow unevenness can be suppressed by intentionally providing a size difference in height 2 times or more times the minimum error that causes the rainbow unevenness. In addition, in an instance of a structure layer designed such that all the flat portions have the same depth in the concave portions, suppose that, when the depth of the concave portions fluctuates with a standard deviation of σ1 nm (≈60 nm), interference occurs and rainbow unevenness is observed. It has been found out that, in such an instance, the occurrence of rainbow unevenness can be suppressed by intentionally providing a size difference in height equal to or larger than 6×σ1 nm (=360 nm). The aforementioned two findings show that the size difference exceeding the difference that causes interference of emission light is 0.62 times or more times the center wavelength of the light emitted from the light-emitting device.

For the same reason, as to the interference of transmission light and reflected light, the size difference exceeding the difference that causes the interference is usually 0.62 times or more times and preferably 1.5 times or more times the center wavelength of the transmission light and reflected light. The size difference is usually equal to or smaller than 60 times the center wavelength. However, usually, the transmission light and reflected light is natural light and can include any wavelength. Therefore, it is difficult to determine the center wavelength of the reflected light. In consideration of the fact that the light that causes rainbow unevenness is visible light, the aforementioned size difference may be usually set by using the center wavelength of visible light, 550 nm, as the center wavelength of the light to be reflected.

Furthermore, when the concavo-convex structure is configured to have a size difference as in the present embodiment, it is also possible to extract light with high efficiency while maintaining the see-through feature. It is also possible to prevent visual recognition of the band-shaped surface portions on the light-emitting surface 1030U. Furthermore, the same effects as those of embodiment II-1 can be obtained.

The same effects can also be obtained when the aforementioned size difference is provided for elements other than the height difference between the flat surface portions. For example, if one or more elements in a group of elements including the height difference between the flat surface portions, the maximum width of the band-shaped surface portions, and the pitches of repetitive structures such as the concave portions and the convex portions have the aforementioned size difference, rainbow unevenness can be similarly suppressed.

II.4. Embodiment II-4

The light-emitting surface structure layer according to the present invention may be applied to any light-emitting device that includes an organic EL element. Therefore, the aforementioned light-emitting surface structure layer may be provided on a light-emitting device that has a layer structure symmetrical about an organic EL element. The light-emitting surface structure layer may also be provided on a light-emitting device that has a layer structure asymmetrical about an organic EL element. For example, the light-emitting surface structure layer may be applied to a light-emitting device that has a layer structure asymmetrical about an organic EL element. An example thereof will be described hereinbelow with reference to the drawings.

Figure 25:
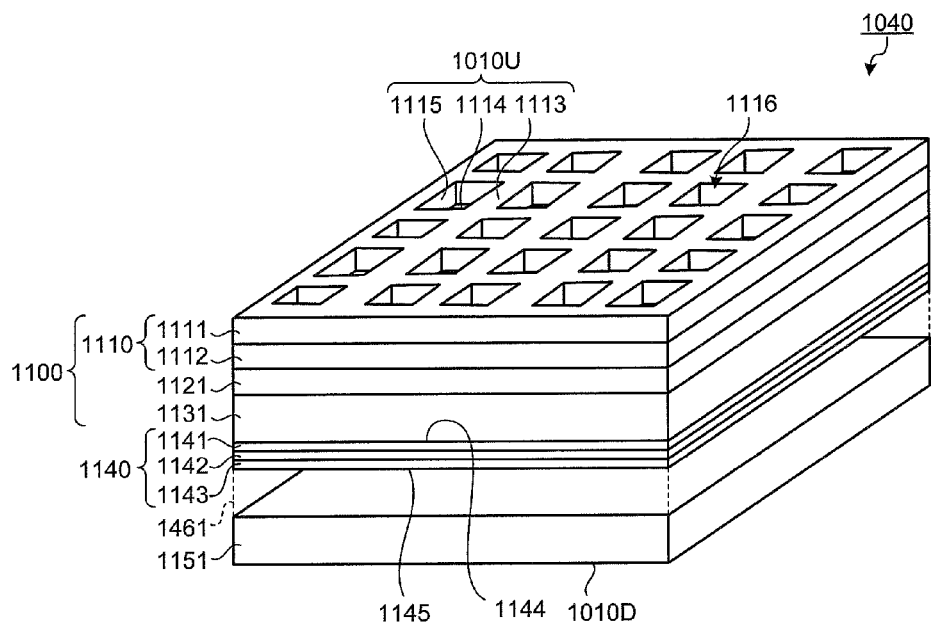
FIG. 25 is a perspective view schematically illustrating a light-emitting device according to embodiment II-4 of the present invention.

FIG. 25 is a perspective view schematically illustrating a light-emitting device according to embodiment II-4 of the present invention. As shown in FIG. 25, a light-emitting device 1040 according to embodiment II-4 of the present invention is the same as the light-emitting device 1010 according to embodiment II-1 except that an inert gas layer 1461 is provided between the second transparent electrode layer 1143 of the organic EL element 1140 and the sealing substrate 1151.

The inert gas layer 1461 is a layer for protecting the organic EL element 1140 from deterioration by oxygen and humidity penetrating from outside. The inert gas layer 1461 is a layer filled with inert gas such as nitrogen gas. The side surfaces of the light-emitting device 1040 are usually sealed with a not-shown sealing member, so that the gas in the inert gas layer 1461 will not leak out.

This light-emitting device 1040 has a layer structure asymmetric about the organic EL element 1140 in that the inert gas layer 1461 is provided only on one side, i.e., the side of the light-emitting surface 1145 of the organic EL element 1140. With such a light-emitting device 1040, light can also be extracted with high efficiency while maintaining the see-through feature. It is also possible to prevent visual recognition of the band-shaped surface portions on the light-emitting surface 1030U. Furthermore, the same effects as those of embodiment II-1 can be obtained.

II.5. Others

While the light-emitting device of the second aspect of the invention has been described with reference to embodiments, the second aspect of the invention may be implemented with further modifications.

For example, the aforementioned embodiments are embodiments wherein all the band-shaped surface portions have widths that vary along each of their extending directions. However, some of the band-shaped surface portions may be uniform in width along their extending directions.

Moreover, for example, in the aforementioned embodiments, the light-emitting surface includes concave portions, and the concave portions constitute a concavo-convex structure including flat surface portions and inclined surface portions. However, convex portions may be provided in place of the concave portions. If convex portions are provided in place of the concave portions, the flat surface portions are usually located at inner position in the thickness direction than the surrounding inclined surface portions (i.e., position closer to the light-emitting device 1144). Consequently, the band-shaped surface portions included in the flat surface portions also constitute surface portions recessed from the surrounding inclined surface portions. In such a case, visual recognition of the band-shaped surface portions can also be prevented by configuring the band-shaped surface portions to have a width that varies along the directions in which the band-shaped surface portions extend. A specific example thereof may be a light-emitting surface that has concavo-convex structure of a shape that is obtained by inverting the concavo-convex structure of the light-emitting surface 1010U described in embodiment II-1. On such a light-emitting surface, convex portions of prismoidal shape that is obtained by inverting the concave portions 1116 are formed in a discretely dispersed manner. When viewed in the thickness direction, this light-emitting surface has the same shape as shown in FIGS. 18, 20, and 21, and can provide the same advantages as those of embodiment II-1. Furthermore, for example, both concave portions and convex portions may coexist on the same light-emitting surface.

Moreover, for example, the concave portions and convex portions formed on the light-emitting surface may have a shape other than the quadrilateral prismoidal shape. Specific examples thereof may include prismoidal shapes whose base has a triangular, pentagonal, hexagonal, or other non-quadrilateral shape. Other shapes such as pyramidal shapes and prismatic shapes may also be employed.

Moreover, in the aforementioned embodiments, only concave portions or convex portions having the same type of shape (specifically, quadrilateral prismoidal shape) are distributed over the entire light-emitting surface. However, concave portions or convex portions of different shapes may coexist on the light-emitting surface. For example, concave portions or convex portions of different sizes may coexist, concave portions or convex portions of triangular prismoidal shape and quadrilateral prismoidal shape may coexist, and inclined surface portions of different inclination angles may coexist.

Moreover, for example, the positions, orientations, shapes, and numbers of the flat surface portions and the inclined surface portions, and the combination thereof are not limited to those of the embodiments, and may be modified unless the effects of the present invention are significantly impaired.

Figure 26:
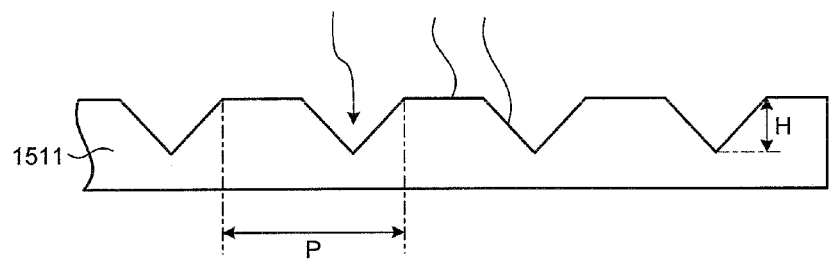
FIG. 26 is a cross-sectional view schematically illustrating a cross section of a concavo-convex structure layer according to another embodiment of the present invention.

As a specific example, unlike the aforementioned embodiments wherein the flat surface portions are aligned at two levels of height positions, the flat surface portions may be aligned at one level as shown in FIG. 26. FIG. 26 is a cross-sectional view schematically illustrating a cross section of a concavo-convex structure layer according to another embodiment of the present invention. In the concavo-convex structure layer 1511 shown in FIG. 26, inclined surface portions 1515 are provided as side surfaces of concave portions 1516 of pyramidal shape. In gaps between adjacent concave portions 1516, flat surface portions 1513 are provided in an aligned manner at the same height position. Even when the flat surface portions are thus aligned at the same one height position, it is possible to extract light with high efficiency while maintaining see-through feature, and to prevent visual recognition of the band-shaped surface portions on the light-emitting surface 1050U. When the flat surface portions are aligned at the same one height position, the height difference between the flat surface portions becomes zero. Even in such a case, a size difference can be given to the height H of the concave portions or convex portions, to thereby suppress rainbow unevenness resulting from the interference of either or both of the emission light and reflected light.

Figure 27:
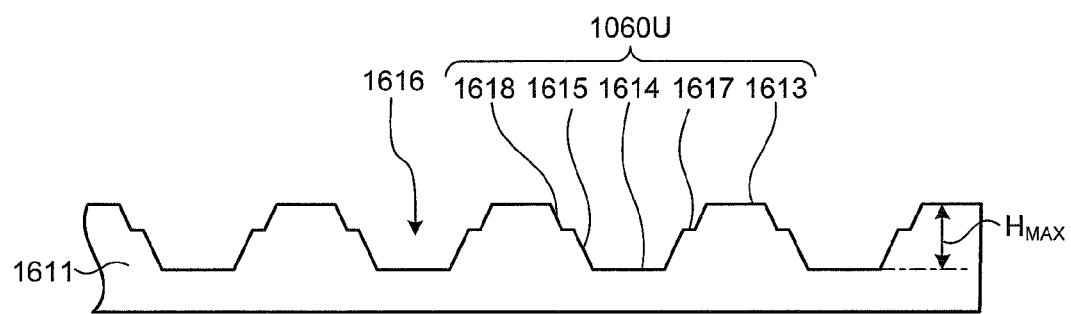
FIG. 27 is a cross-sectional view schematically illustrating a cross section of a concavo-convex structure layer according to another embodiment of the present invention.

Moreover, for example, as shown in FIG. 27, flat surface portions may be aligned at three or more levels of height positions. FIG. 27 is a cross-sectional view illustrating a cross section of a concavo-convex structure layer according to another embodiment of the present invention. In the concavo-convex structure layer 1611 shown in FIG. 27, a concave portion 1616 includes flat surface portions 1614 and 1617 and inclined surface portions 1615 and 1618. The inclined surface portions 1615 are provided around the flat surface portion 1614 serving as the bottom surface. The flat surface portions 1617 are provided around the inclined surface portions 1615. The inclined surface portions 1618 are provided around the flat surface portions 1617. Flat surface portions 1613 are provided in gaps between adjacent concave portions 1616. Even if the flat surface portions are aligned at three or more multiple levels of height positions, it is possible to extract light with high efficiency while maintaining the see-through feature, and to prevent visual recognition of the band-shaped surface portions on the light-emitting surface 1060U. When the flat surface portions are aligned at three or more multiple levels of height positions, the maximum value of the height difference between the flat surface portions in the thickness direction is the size denoted by the reference sign $H_{MAX}$ in FIG. 27.

Figure 28:
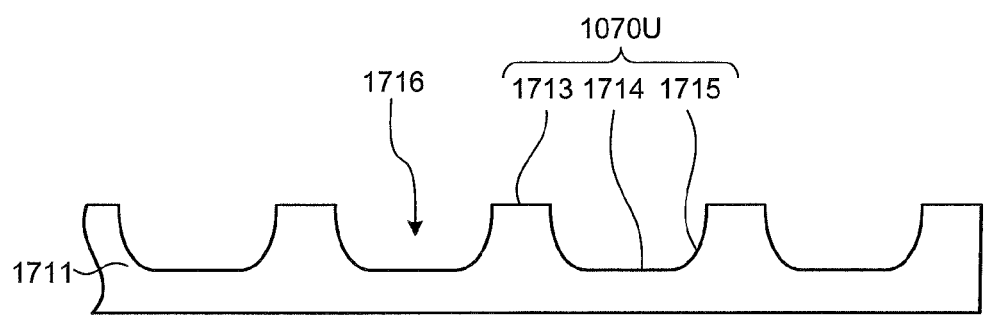
FIG. 28 is a cross-sectional view schematically illustrating a cross section of a structure layer according to another embodiment of the present invention.

Unlike the aforementioned embodiments wherein the inclined surface portions are plain flat surfaces, the inclined surface portions may be formed as curved surfaces as shown in FIG. 28. FIG. 28 is a cross-sectional view schematically illustrating a cross section of a structure layer according to another example of the present invention. In the concavo-convex structure layer 1711 shown in FIG. 28, flat surface portions 1714 are provided as the bottom surfaces of concave portions 1716. Around the flat surface portions 1714, inclined surface portions 1715 of curved surface shape who or decreases with the distance from the flat surface portions 1714 are provided. Flat surface portions 1713 are provided around the inclined surface portions 1715. Even if the inclined surface portions 1715 are thus formed as curved surfaces, it is possible to extract light with high efficiency while maintaining see-through feature, and to prevent visual recognition of the band-shaped surface portions on the light-emitting surface 1070U.

Moreover, for example, in the aforementioned embodiments, there are provided two groups of band-shaped surface portions that are a group along the direction X and a group along the direction Y. However, only one group of band-shaped surface portions along one direction may be provided. Alternatively, three or more groups of band-shaped surface portions along three or more directions may be provided. Furthermore, if a plurality of groups of band-shaped surface portions are provided along different directions, the angles at which the band-shaped surface portions intersect are not limited to 90°. The angles may be set to arbitrary angles such as 60°, or may be at random.

Moreover, for example, in the aforementioned embodiments, the light-emitting surface structure layer is provided directly in contact with the light-emitting surface. However, the light-emitting surface structure layer may be provided on the light-emitting surface via another layer. Examples of such other layers may include a gas barrier layer for protecting the organic EL element from the outside air and humidity, and an ultraviolet-cut layer for shielding ultraviolet rays.

Furthermore, for example, in the aforementioned embodiments, the light-emitting surface structure layer includes the concavo-convex structure layer, the substrate film layer, the bonding layer, and the supporting substrate. However, the light-emitting surface structure layer may be composed of fewer layers than these layers or may further include an optional layer or layers in addition to these layers. For example, the light-emitting surface structure layer may further have a coating layer on the surface of the concavo-convex structure layer, and the coating layer may define the concavo-convex structure of the light-emitting surface.

III. Lighting Apparatus and Backlight Device

The light-emitting devices of the first and second aspect of the inventions may be applicable for uses such as a lighting apparatus, a backlight device, and a display device.

The lighting apparatus includes a light-emitting device of the present invention as a light source and, if necessary, further includes optional components such as a member for holding the light source and a circuit for supplying electric power.

The backlight device includes the light-emitting device of the present invention as a light source and, if necessary, further includes optional components such as an enclosure, a circuit for supplying electric power, a diffusion plate for further improving the uniformity of the emitted light, a diffusion sheet, and a prism sheet. Example of the applications of the backlight device may include display devices, such as liquid crystal display devices, for displaying images by controlling pixels and backlights for display devices, such as signboards, for displaying still images.

Examples of the display device may include an organic EL display device. A liquid crystal display device and the like including the aforementioned also included in the display devices.

EXAMPLES

The present invention will be specifically described hereinbelow by way of Examples. The present invention is not limited to the following Examples, and may be implemented with arbitrary modifications without departing from the scope of claims and equivalents thereto. In the following description, the refractive index of a resin will indicate the refractive index of the resin after being cured. Unless otherwise specified, "parts" and "%" showing an amount are based on weight. The operations that will be described hereinbelow were performed under conditions of room temperature and normal pressure unless otherwise specified. The azimuth direction will refer to a direction parallel to the surface on which the concavo-convex structure is formed.

I. Examples and Comparative Examples Regarding The First Aspect of the Invention

Example I-1

Production of Multi-Layered Body

A UV curable resin (refractive index of 1.54) composed mainly of urethane acrylate was applied onto a roll of film substrate (trade name "ZEONOR film", manufactured by ZEON CORPORATION, a film of alicyclic structure-containing polymer resin, thickness of 100 μm, refractive index of 1.53) to form a coating layer. A metal mold was pressed against the coating layer. Keeping this state, the coating layer was irradiated with 1.5 mJ/cm$^2$ of ultraviolet rays for curing, whereby a concavo-convex structure layer having a concavo-convex structure (thickness of 25 μm) was formed. The metal mold for forming the concavo-convex structure was fabricated by cutting in three azimuth directions by using a cutting tool having a vertex angle of 5° and a tip end width of 50 μm.

The three azimuth directions were a 0° direction, a 45° direction, and a 90° direction. The cutting in the azimuth 0° direction was performed at a cutting pitch of 200 μm and groove-by-groove random groove depths of 19.4 μm, 19.7 μm, 20.0 μm, 20.3 μm, and 20.6 μm.

The cutting in the azimuth 45° direction and 90° direction was performed at a cutting pitch of 400 μm and a constant groove depth of 20.0 μm.

Figure 29:
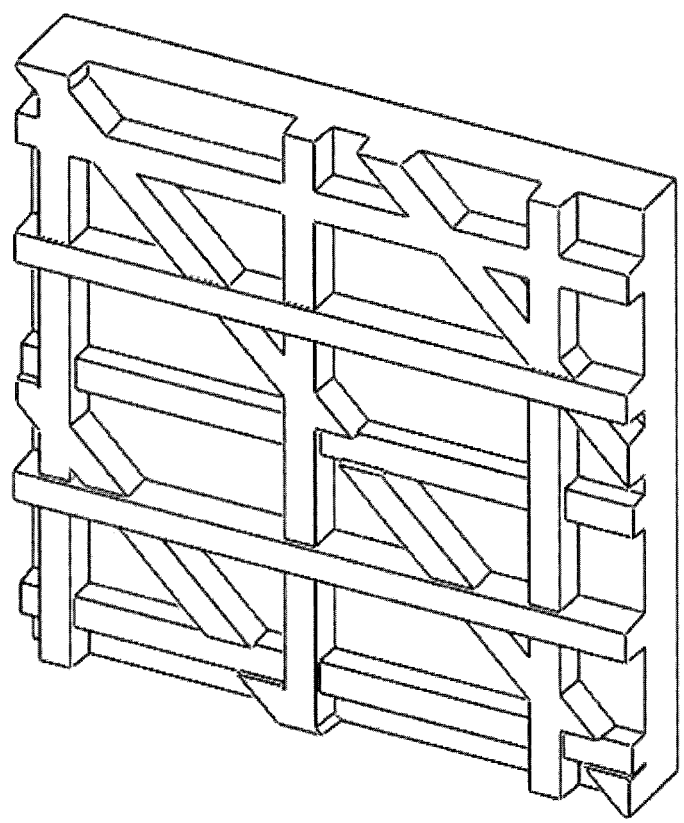
FIG. 29 is a perspective view schematically illustrating the appearance of part of a concavo-convex structure layer obtained in example I-1 as viewed in an inclined direction.
Figure 30:
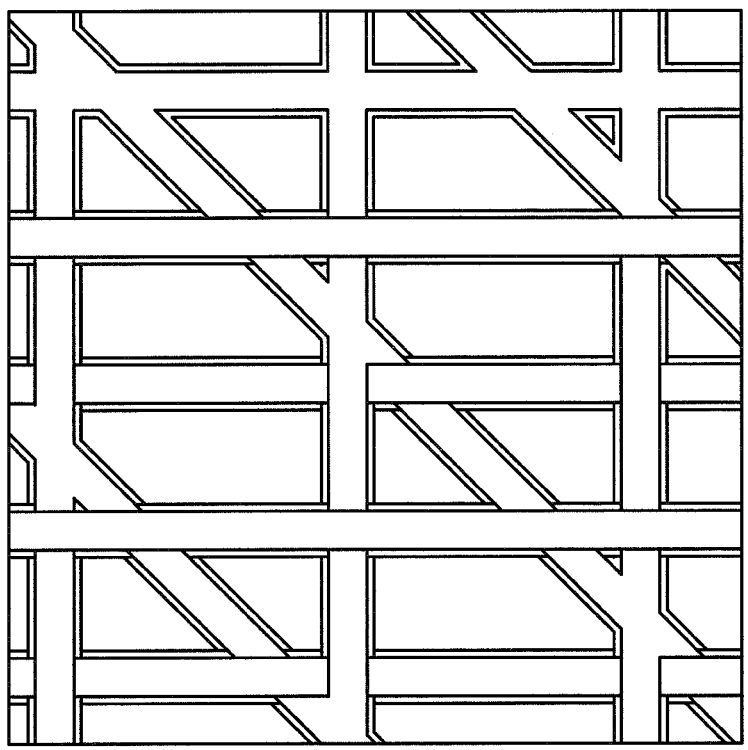
FIG. 30 is a plan view schematically illustrating the appearance of part of the concavo-convex structure layer obtained in example I-1 as viewed in the thickness direction.

FIG. 29 is a perspective view schematically illustrating the appearance of part of the concavo-convex structure layer obtained in Example I-1 as viewed in an inclined direction. FIG. 30 is a plan view schematically illustrating the appearance of the part of the concavo-convex structure layer obtained in Example I-1 as viewed in the thickness direction. As shown in FIGS. 29 and 30, a concavo-convex structure including a large number of convex portions having a trapezoidal cross section corresponding to the grooves formed on the metal mold was formed on the surface of the obtained concavo-convex structure layer. On the surface of this concavo-convex structure layer where the concavo-convex structure was formed, an average inclination angle of the inclined surface portions with respect to the flat surface portions was 87.5°. The ratio of the projected area of the inclined surface portions with respect to the total area (entire area) of the flat surface portions was 0.03. The maximum height difference between the flat surface portions was 20.6 μm.

(Production of Transparent Organic EL Element)

On a glass substrate on the main surface of which a transparent electrode layer was formed, a hole injection layer, a hole transport layer, a light-emitting layer, a hole block layer, a electronic charge generation layer, a metal oxide layer, and a cathode were formed in this order. The materials and thicknesses of the respective layers were as follows:

Transparent electrode layer: ITO, 300 nm

Hole injection layer: molybdenum trioxide ($MoO_3$), 5 nm

Hole transport layer: NS-21 [manufactured by Nippon Steel Chemical Co., Ltd.] and $MoO_3$, 20 nm, and additionally NS-21, 5 nm, a total of 25 nm Light-emitting layer: NS-21 and EY52 (manufactured by e-Ray Optoelectronics Technology (referred to hereinbelow as e-Ray)), 20 nm, and EB43 and EB52 (both manufactured by e-Ray), 30 nm, a total of 50 nm Hole block layer: bis(2-methyl-8-quinolinolate)(p-phenylphenolate)aluminum (BAlq), 5 nm Electronic charge generation layer: Liq and DPB, 35 nm, additionally aluminum, 1.5 nm, and additionally NS-21 and $MoO_3$, 1.0 nm, a total of 37.5 nm Metal oxide layer: $MoO_3$, 5 nm Cathode: ITO, 100 nm The layers from the hole injection layer to the metal oxide layer were formed by placing in a vacuum vapor-deposition system the glass substrate having the transparent electrode layer previously formed thereon, and then the aforementioned materials from the hale transport layer to the metal oxide layer were sequentially vapor-deposited by resistance heating. The vapor deposition was performed at an internal system pressure of $5 \times 10^{-3}$ Pa and an evaporating speed of 0.1 nm/s to 0.2 nm/s. Subsequently, the ITO of the cathode layer was deposited by facing target sputtering. The resultant was sealed with another glass plate using a UV curable resin, to obtain a transparent organic EL element I-1. Electricity was applied to the resulting transparent organic EL element I-1 for driving the element. As a result, favorable white light emission was obtained with excellent transparency in both a front direction and an inclined direction. The front direction herein refers to a direction parallel to the normal direction of the light-emitting surface. The inclined direction refers to a direction 45° inclined with respect to the light-emitting surface.

(Production of Light-Emitting Device I-1)

Onto the obtained transparent organic EL element I-1, a film substrate on which a concavo-convex structure layer was formed was bonded via a tacky layer (acrylic resin, refractive index of 1.49, manufactured by NITTO DENKO CORPORATION, CS9621) to obtain a light-emitting device I-1 having the layer structure of (the transparent organic EL element I-1)/(the tacky layer)/(the film substrate)/(the concavo-convex structure layer). Electricity was applied to the resulting light-emitting device I-1 to emit light, and transparency of the light-emitting device I-1 was visually evaluated. As a result, excellent transparency was observed in the front direction and the inclined direction.

Example I-2

A metal mold was fabricated by cutting in four azimuth directions by using a cutting tool having a vertex angle of 25° and a tip end width of 50 µm and a cutting tool having a vertex angle of 25° and a tip end width of 150 µm. The four azimuth directions were a 0° direction, a 45° direction, a 90° direction, and a 135° direction.

The cutting in the azimuth 0° direction was performed by using the cutting tool having a tip end width of 150 µm at groove-by-groove random cutting pitches of 360 µm, 380 µm, 400 µm, 420 µm, and 440 µm.

The cutting in the azimuth 45° direction and 90° direction was performed by using the cutting tool having a tip end width of 50 µm at a constant cutting pitch of 400

The cutting in the azimuth 135° direction was performed by using the cutting tool having a tip end width of 150 µm at a constant cutting pitch of 400 µm.

The depth of all of the grooves were set to 18.0 µm.

A concavo-convex structure layer (25 µm in thickness) was formed and a light-emitting device I-2 was produced in the same manner as in Example I-1 except that the metal mold fabricated as described above was used.

Figure 31:
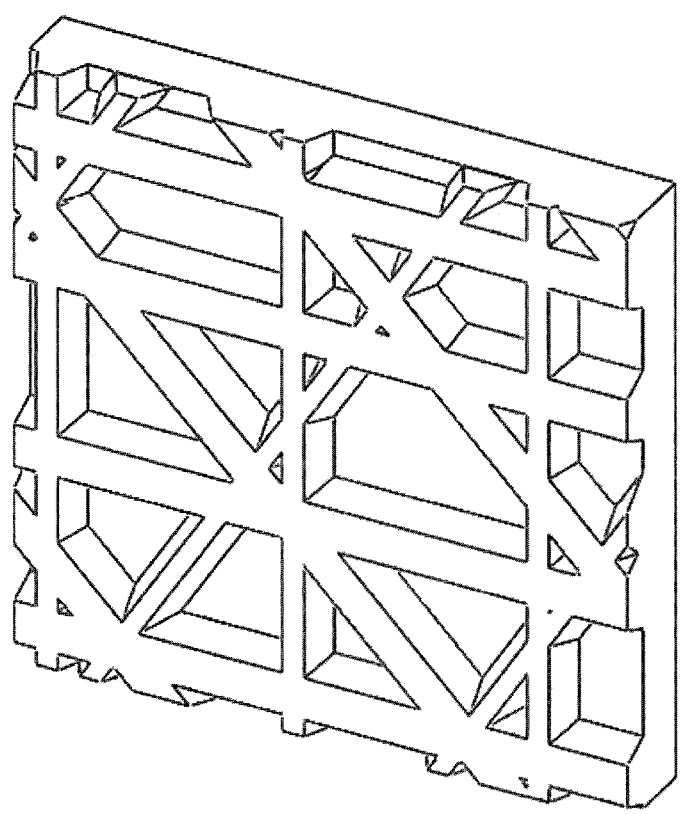
FIG. 31 is a perspective view schematically illustrating the appearance of part of a concavo-convex structure layer obtained in example I-2 as viewed in an inclined direction.
Figure 32:
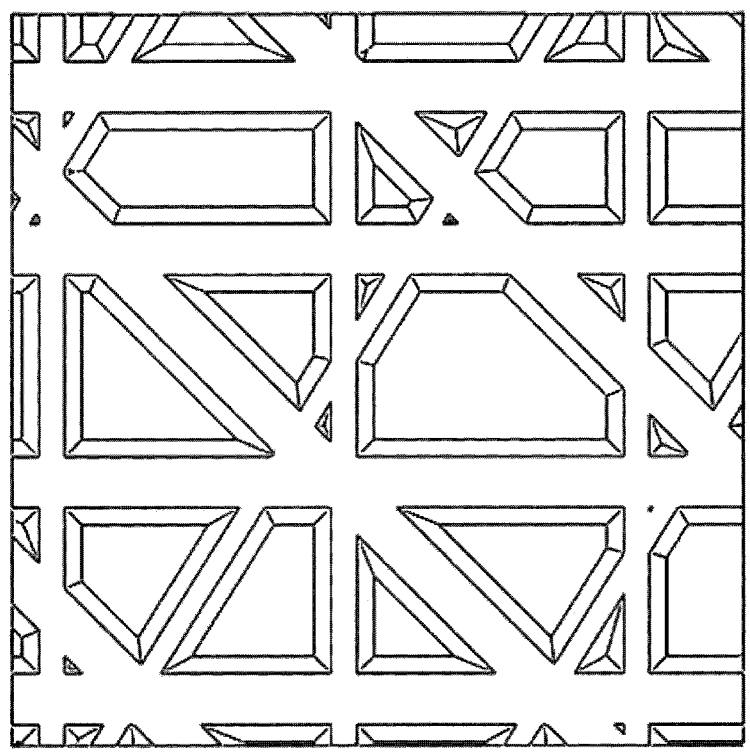
FIG. 32 is a plan view schematically illustrating the appearance of part of the concavo-convex structure layer obtained in example I-2 as viewed in the thickness direction.

FIG. 31 is a perspective view schematically illustrating the appearance of part of the concavo-convex structure layer obtained in Example I-2 as viewed in an inclined direction. FIG. 32 is a plan view schematically illustrating the appearance of the part of the concavo-convex structure layer obtained in Example I-2 as viewed in the thickness direction. As shown in FIGS. 31 and 32, a concavo-convex structure including a large number of convex portions having a trapezoidal cross section corresponding to the grooves formed on the metal mold was formed on the surface of the obtained concavo-convex structure layer. On the surface of this concavo-convex structure layer where the concavo-convex structure was formed, an average inclination angle of the inclined surface portions with respect to the flat surface portions was 77.5°. The ratio of the projected area of the inclined surface portions with respect to the total area of the flat surface portions was 0.08. The maximum height difference between the flat surface portions was 18.1 µm. Electricity was applied to the resulting light-emitting device I-2 to emit light, and transparency of the light-emitting device I-2 was visually evaluated. As a result, excellent transparency was observed in the front direction and the inclined direction.

Example I-3

A metal mold was fabricated by cutting in six azimuth directions by using a cutting tool having a vertex angle of 20° and a tip end width of 75 µm, a cutting tool having a vertex angle of 20° and a tip end width of 100 µm, and a cutting tool having a vertex angle of 20° and a tip end width of 125 µm. The six azimuth directions were a 0° direction, a 45° direction, a 60° direction, a 90° direction, a 120° direction, and a 135° direction.

The cutting in the azimuth 0° direction was performed by using the cutting tool having a tip end width of 100 µm at groove-by-groove random cutting pitches of 360 µm, 380 µm, 400 µm, 420 µm, and 440 µm and groove-by-groove random groove depths of 24.4 µm, 24.7 µm, 25.0 µm, 25.3 µm, and 25.5 µm.

The cutting in the azimuth 45° direction was performed by using the cutting tool having a tip end width of 125 µm at a constant cutting pitch of 800 µm and groove-by-groove random groove depths of 24.4 µm, 24.7 µm, 25.0 µm, 25.3 µm, and 25.6 µm.

The cutting in the azimuth 60° direction was performed by using the cutting tool having a tip end width of 75 µm at groove-by-groove random cutting pitches of 720 µm, 760 µm, 800 µm, 840 µm, and 880 µm and a constant groove depth of 25.0 µm.

The cutting in the azimuth 90° direction was performed by using the cutting tool having a tip end width 100 µm at a constant cutting pitch of 400 µm and groove-by-groove random groove depths of 24.4 µm, 24.7 µm, 25.0 µm, 25.3 µm, and 25.6 µm.

The cutting in the azimuth 120° direction was performed by using the cutting tool having a tip end width of 125 µm at a constant cutting pitch of 800 µm and a groove depth of 25.0 µm.

The cutting in the azimuth 135° direction was performed by using the cutting tool having a tip end width of 75 µm at groove-by-groove random cutting pitches of 720 µm, 760 µm, 800 µm, 840 µm, and 880 µm and a constant groove depth of 25.0 µm.

A concavo-convex structure layer (30 µm in thickness) was formed and a light-emitting device I-3 was produced in the same manner as in Example I-1 except that the metal mold fabricated as described above was used.

On the surface of the produced concavo-convex structure layer where the concavo-convex structure was formed, an average inclination angle of the inclined surface portions with respect to the flat surface portions was 80.0°. The ratio of the projected area of the inclined surface portions with respect to the total area of the flat surface portions was 0.09. The maximum height difference between the flat surface portions was 25.6 µm. Electricity was applied to the resulting light-emitting device I-3 to emit light, and transparency of the light-emitting device I-3 was visually evaluated. As a result, excellent transparency was observed in the front direction and the inclined direction.

Example I-4

A metal mold was formed by cutting in eight azimuth directions by using a cutting tool having a vertex angle of 25° and a tip end width of 40 µm, a cutting tool having a vertex angle of 25° and a tip end width of 80 µm, a cutting tool having a vertex angle of 25° and a tip end width of 120 µm, and a cutting tool having a vertex angle of 25° and a tip end width of 160 µm. The eight azimuth directions were a 0° direction, a 20° direction, a 45° direction, a 60° direction, a 90° direction, a 115° direction, a 135° direction, and a 165° direction.

The cutting in the azimuth 0° direction was performed by using the cutting tool having a tip end width of 160 µm at groove-by-groove random cutting pitches of 720 µm, 760 µm, 800 µm, 840 µm, and 880 µm and a constant groove depth of 25.0 µm.

The cutting in the azimuth 20° direction was performed by using the cutting tool having a tip end width of 120 µm at a constant cutting pitch of 800 µm and groove-by-groove random groove depths of 24.4 µm, 24.7 µm, 25.0 µm, 25.3 µm, and 25.6 µm.

The cutting in the azimuth 45° direction was performed by using the cutting tool having a tip end width of 40 µm at groove-by-groove random cutting pitches of 720 µm, 760 µm, 800 µm, 840 µm, and 880 µm and groove-by-groove random groove depths of 24.4 µm, 24.7 µm, 25.0 µm, 25.3 µm, 25.6 µm.

The cutting in the azimuth 60° direction was performed by using the cutting tool having a tip end width of 160 µm at a constant cutting pitch of 800 µm and groove-by-groove random groove depths of 24.4 µm, 24.7 µm, 25.0 µm, 25.3 µm, and 25.6 µm.

The cutting in the azimuth 90° direction was performed by using the cutting tool having a tip end width of 80 μm at groove-by-groove random cutting pitches of 720 μm, 760 μm, 800 μm, 840 μm, and 880 μm and a constant groove depth of 25.0 μm.

The cutting in the azimuth 115° direction was performed by using the cutting tool having a tip end width of 120 μm at groove-by-groove random cutting pitches of 720 μm, 760 μm, 800 μm, 840 μm, and 880 μm and groove-by-groove random groove depths of 24.4 μm, 24.7 μm, 25.0 μm, 25.3 μm, and 25.6 μm.

The cutting in the azimuth 135° direction was performed by using the cutting tool having a tip end width of 80 μm at groove-by-groove random cutting pitches of 720 μm, 760 μm, 800 μm, 840 μm, and 880 μm and a constant groove depth of 25.0 μm.

The cutting in the azimuth 165° direction was performed by using the cutting tool having a tip end width of 40 μm at a constant cutting pitch of 800 μm and groove-by-groove random groove depths of 24.4 μm, 24.7 μm, 25.0 μm, 25.3 μm, and 25.6 μm.

From this metal mold, a transfer mold having a concavo-convex configuration of reverse shape was fabricated by Ni electrocasting (approximately 300 μm in thickness).

A concavo-convex structure layer (30 μm in thickness) was formed and a light-emitting device I-4 was produced in the same manner as in Example I-1 except that this transfer mold was used as the mold.

On the surface of the produced concavo-convex structure layer where the concavo-convex structure was formed, an average inclination angle of the inclined surface portions with respect to the flat surface portions was 77.5°. The ratio of the projected area of the inclined surface portions with respect to the total area of the flat surface portions was 0.09. The maximum height difference between the flat surface portions was 25.6 μm. Electricity was applied to the resulting light-emitting device I-4 to emit light, and transparency of the light-emitting device I-4 was visually evaluated. As a result, excellent transparency was observed in the front direction and the inclined direction.

Comparative Example I-2

A metal mold was fabricated by cutting in two azimuth directions by using a rutting tool having a vertex angle of 20.0° and a tip end width of 10 μm. The two azimuth directions were a 0° direction and a 90° direction.

The cutting in both azimuth directions was performed at groove-by-groove random cutting pitches of 90.0 μm, 95.0 μm, 100.0 μm, 105.0 μm, and 110.0 μm and a constant groove depth of 20.0 μm.

A concavo-convex structure layer (25 μm in thickness) was formed and a light-emitting device I-5 was produced in the same manner as in Example I-1 except that the metal mold fabricated as described above was used.

On the surface of the produced concavo-convex structure layer where the concavo-convex structure was formed, the ratio of the projected area of the inclined surface portions with respect to the total area of the flat surface portions was 0.32. The maximum height difference between the flat surface portions was 20.1 μm. Electricity was applied to the resulting light-emitting device I-4 to emit light, and transparency of the light-emitting device I-4 was visually evaluated. As a result, poor transparency was observed in the front direction and the inclined direction.

Comparative Example I-3

A metal mold was fabricated by cutting in two azimuth directions by using a cutting tool having a vertex angle of 40.0° and a tip end width of 10.0 μm. The two azimuth directions were a 0° direction and a 90° direction.

The cutting in both azimuth directions was performed at a constant cutting pitch of 35.0 μm and groove-by-groove random groove depths of 4.4 μm, 4.7 μm, 5.0 μm, 5.3 μm, and 5.6 μm.

A concavo-convex structure layer (10 μm in thickness) was formed and a light-emitting device I-6 was produced in the same manner as in Example I-1 except that the metal mold fabricated as described above was used.

On the surface of the produced concavo-convex structure layer where the concavo-convex structure was formed, the ratio of the projected area of the inclined surface portions with respect to the total area of the flat surface portions was 0.40. The maximum height difference between the flat surface portions was 5.6 μm. Electricity was applied to the resulting light-emitting device I-6 to emit light, and transparency of the light-emitting device I-6 was visually evaluated. As a result, poor transparency was observed in the front direction and the inclined direction.

Comparative Example I-4

A metal mold was fabricated by cutting in two azimuth directions by using a cutting tool having a vertex angle 20.0° and a tip end width of 30.0 μm. The two azimuth directions were a 0° direction and a 90° direction.

The cutting in both azimuth directions was performed at groove-by-groove random cutting pitches of 90.0 μm, 95.0 μm, 100.0 μm, 105.0 μm, and 110.0 μm and groove-by-groove random groove depths of 24.4 μm, 24.7 μm, 25.0 μm, 25.3 μm, and 25.6 μm.

A concavo-convex structure layer (30 μm in thickness) was formed and a light-emitting device I-7 was produced in the same manner as in Example I-1 except that the metal mold fabricated as described above was used.

On the surface of the produced concavo-convex structure layer where the concave-convex structure was formed, the ratio of the projected area of the inclined surface portions with respect to the total area of the flat surface portions was 0.28. The maximum height difference between the flat surface portions was 25.6 μm. Electricity was applied to the resulting light-emitting device I-7 to emit light, and transparency of the light-emitting device I-7 was visually evaluated. As a result, poor transparency was observed in the front direction and the inclined direction.

Comparative Example I-5

A metal mold was fabricated by cutting in two azimuth directions by using a cutting tool having a vertex angle 30.0° and a tip end width of 75.0 μm. The two azimuth directions were a 0° direction and a 90° direction.

The cutting in both azimuth directions was performed at groove-by-groove random cutting pitches of 90.0 μm, 95.0 μm, 100.0 μm, 105.0 μm, and 110.0 μm and groove-by-groove random groove depths of 24.4 μm, 24.7 μm, 25.0 μm, 25.3 μm, and 25.6 μm.

A concavo-convex structure layer (30 μm in thickness) was formed and a light-emitting device I-8 was produced in the same manner as in Example I-1 except that the metal mold fabricated as described above was used.

On the surface of the produced concavo-convex structure layer where the concavo-convex structure was formed, the ratio of the projected area of the inclined surface portions with respect to the total area of the flat surface portions was 0.26. The maximum height difference between the flat surface portions was 25.6 μm. Electricity was applied to the resulting light-emitting device I-8 to emit light, and transparency of the light-emitting device I-8 was visually evaluated. As a result, poor transparency was observed in the front direction and the inclined direction.

[Evaluations]

(Amount of Extracted Light)

As to the transparent organic EL element I-1 obtained in Example I-1 and the light-emitting devices I-1 to I-8 obtained in Examples I-1 to I-4 and Comparative Examples I-2 to I-5, the intensity of light emitted from both surfaces was calculated by an optical simulation using a program (program name: ASAP, manufactured by Breault Research) with the light intensity of the light-emitting layer as 1 lm. The resulting values are shown in Tables 1 and 2. In Tables 1 and 2, the numerical values in the "amount of light extracted from the bonded surface" field indicate the amounts of light extracted from the light-emitting surfaces having a concavo-convex structure where a concavo-convex structure layer is provided. The numerical values in the "amount of light extracted from the back surface" field indicate the amounts of light extracted from the glass surfaces without a concavo-convex structure layer. The transparent organic EL element I-1 is regarded as Comparative Example I-1. In Comparative Example I-1, the numerical value in the "amount of light extracted from the bonded surface" field and the numerical value in the "amount of light extracted from the back surface" field indicate the amount of light extracted from a glass surface without a concavo-convex structure layer.

(Transparency of Concavo-Convex Structure Layer)

As to the concavo-convex structure layers obtained in Examples I-1 to I-4 and Comparative Examples I-2 to I-5, parallel light transmittance and diffused light transmittance were calculated by an optical simulation using a program (program name: ASAP, manufactured by Breault Research). As a numerical value expressing the transparency of the concavo-convex structure layers, (diffused light transmittance)/(parallel light transmittance+diffused light transmittance)×100 was calculated. A small numerical value is indicative of superior transparency when viewed in the thickness direction. The resulting values are shown in Tables 1 and 2.

(Grid Unevenness Resulting from the Streak Arrays)

The light-emitting devices I-1 to I-8 obtained in Examples I-1 to I-4 and Comparative Examples I-2 to I-5 were visually observed for checking existence of grid unevenness resulting from the streak arrays. Since the concavo-convex structure layers included three or more groups of streak arrays in Examples I-1 to I-4, almost no grid unevenness resulting from the streak arrays were observed and these Examples were therefore excellent. In Tables 1 and 2, ones that showed almost no grid unevenness resulting from the streak arrays are indicated as "excellent", and ones that showed grid unevenness resulting from the streak arrays as "bad".

(Visibility)

The transparent organic EL element I-1 and the light-emitting devices I-1 to I-8 in a turned-off state were placed at 50 cm in front of a display surface on which characters having a size of 5 mm×5 mm were arrayed. The characters were observed through the transparent organic EL element I-1 and the light-emitting devices I-1 to I-8 in the front direction and the inclined direction. Ones through which the characters were clearly visible without smear or distortion were evaluated as "excellent". Ones through which the characters could be read but with some smear or distortion were "good". Ones through which the characters could not be clearly read were "bad". The results are shown in Tables 1 and 2.

(Rainbow Unevenness)

The light-emitting devices obtained in Examples I-1 to I-4 and Comparative Examples I-2 to I-5 were visually observed for checking existence of rainbow unevenness. In each of Examples I-1 to I-4 and Comparative Examples I-2 to I-5, since size differences were provided by means such as making the height difference of the concavo-convex structure uneven within a predetermined range, almost no rainbow unevenness due to the interference of reflected light on the front and back surfaces of the concavo-convex structure layer were observed, and these were therefore excellent.

TABLE 1

[Results of Example I-1 to Example I-4]

| | Ex. I-1 | Ex. I-2 | Ex. I-3 | Ex. I-4 |
|---|---|---|---|---|
| Ratio of projected area of inclined surface portions with respect to total area of flat surface portions | 0.03 | 0.08 | 0.09 | 0.09 |
| Maximum value of height difference between flat surface portions (μm) | 20.6 | 18.1 | 25.6 | 25.6 |
| Average inclination angle of inclined surface portions (°) | 87.5 | 77.5 | 80 | 77.5 |
| Tip end width of cutting tool (μm) * number of cutting directions | 50 * 3 | 50 * 2<br>150 * 2 | 75 * 2<br>100 * 2<br>125 * 2 | 40 * 2<br>80 * 2<br>120 * 2<br>160 * 2 |
| Reference pitch (μm) * number of cutting directions | 200 * 1<br>400 * 2 | 400 * 3<br>400 (random) * 1 | 400 * 1<br>400 (random) * 1<br>800 * 2<br>800 (random) * 2 | 800 * 3<br>800 (random) * 5 |
| Pitch random | No | Yes | Yes | Yes |
| Height random | Yes | No | Yes | Yes |
| number of cutting directions | 3 | 4 | 6 | 8 |
| Azimuth direction of grooves (°) | 0<br>45<br>90 | 0<br>45<br>90<br>135 | 0<br>45<br>60<br>90<br>120<br>135 | 0<br>20<br>45<br>60<br>90<br>115<br>135<br>165 |
| Grid unevenness resulting from the streak arrays | Excellent | Excellent | Excellent | Excellent |
| Visibility in front direction | Excellent | Excellent | Excellent | Excellent |
| Visibility in inclined direction | Excellent | Good | Good | Good |
| Amount of light extracted from bonded surface (lm) | 0.309 | 0.311 | 0.326 | 0.318 |
| Amount of light extracted from the back surface (lm) | 0.275 | 0.286 | 0.304 | 0.287 |
| Total light extract amount (lm) | 0.584 | 0.597 | 0.63 | 0.605 |
| Transparency of concavo-convex structure layer | 0.36 | 3.71 | 4.13 | 3.90 |

TABLE 2

[Results of Comparative Example I-1 to Comparative Example I-5]

|  | Comp. Ex. I-1 | Comp. Ex. I-2 | Comp. Ex. I-3 | Comp. Ex. I-4 | Comp. Ex. I-5 |
|---|---|---|---|---|---|
| Ratio of projected area of inclined surface portions with respect to total area of flat surface portions | — | 0.32 | 0.40 | 0.28 | 0.26 |
| Maximum value of height difference between flat surface portions (μm) | — | 20.1 | 5.6 | 25.6 | 25.6 |
| Average inclination angle of inclined surface portions (°) | — | 80 | 70 | 80 | 75 |
| Tip end width of cutting tool (μm) | — | 10 | 10 | 30 | 75 |
| Reference pitch (μm) | — | 100 | 35 | 100 | 100 |
| Pitch random | — | Yes | No | Yes | Yes |
| Height random | — | No | Yes | Yes | Yes |
| number of cutting directions | — | 2 | 2 | 2 | 2 |
| Azimuth direction of grooves (°) | — | 0 90 | 0 90 | 0 90 | 0 90 |
| Grid unevenness resulting from the streak arrays | Excellent | Bad | Bad | Bad | Bad |
| Visibility in front direction | Excellent | Bad | Bad | Bad | Bad |
| Visibility in inclined direction | Excellent | Bad | Bad | Bad | Bad |
| Amount of light extracted from bonded surface (lm) | 0.22 | 0.408 | 0.388 | 0.402 | 0.373 |
| Amount of light extracted from the back surface (lm) | 0.22 | 0.27 | 0.326 | 0.332 | 0.337 |
| Total light extract amount (lm) | 0.44 | 0.678 | 0.714 | 0.734 | 0.71 |
| Transparency of concavo-convex structure layer | — | 12.14 | 11.04 | 11.40 | 11.64 |

Example I-5

A metal mold was fabricated by cutting in three azimuth directions by using a cutting tool having a vertex angle of 5° and a tip end width of 50 μm. The three azimuth directions were a 0° direction, a 45° direction, and a 90° direction.

The cutting in the azimuth 0° direction was performed at a constant cutting pitch of 200 μm. The cutting in the azimuth 45° direction and 90° direction were performed at a constant cutting pitch of 400 μm. In all of the azimuth directions, the groove depth was set to a constant value of 20.0 μm.

A concavo-convex structure layer (25 μm in thickness) was formed and a light-emitting device I-9 was produced in the same manner as in Example I-1 except that the metal mold fabricated as described above was used.

On the surface of the produced concavo-convex structure layer where the concavo-convex structure was formed, an average inclination angle of the inclined surface portions with respect to the flat surface portions was 87.5°. The ratio of the projected area of the inclined surface portions with respect to the total area of the flat surface portions was 0.03. The maximum height difference between the flat surface portions was 20.1 μm. Electricity was applied to the resulting light-emitting device I-9 to emit light, and transparency of the light-emitting device I-9 was visually evaluated. As a result, excellent transparency was observed in the front direction and the inclined direction.

Example I-6

A metal mold was fabricated by cutting in four azimuth directions by using a cutting tool having a vertex angle of 25° and a tip end width of 50 μm and a cutting tool having a vertex angle of 25° and a tip end width of 150 μm. The four azimuth directions were a 0° direction, a 45° direction, a 90° direction, and a 135° direction.

The cutting in the azimuth 0° direction and 135° direction was performed by using the cutting tool having a tip end width of 150 μm. The cutting in the azimuth 45° direction and 90° direction was performed by using the cutting tool having a tip end width of 50 μm. All of the grooves were formed at a constant cutting pitch of 400 μm and a constant groove depth of 18.0 μm.

A concavo-convex structure layer (25 μm in thickness) was formed and a light-emitting device I-10 was produced in the same manner as in Example I-1 except that the metal mold fabricated as described above was used.

On the surface of the produced concavo-convex structure layer where the concavo-convex structure was formed, an average inclination angle of the inclined surface portions with respect to the flat surface portions was 77.5°. The ratio of the projected area of the inclined surface portions with respect to the total area of the flat surface portions was 0.08. The maximum height difference between the flat surface portions was 18.1 μm. Electricity was applied to the resulting light-emitting device I-10 to emit light, and transparency of the light-emitting device I-10 was visually evaluated. As a result, excellent transparency was observed in the front direction and the inclined direction.

Example I-7

A metal mold was fabricated by cutting in six azimuth directions by using a cutting tool having a vertex angle of 20° and a tip end width of 75 μm, a cutting tool having a vertex angle of 20° and a tip end width of 100 μm, and a cutting tool having a vertex angle of 20° and a tip end width of 125 μm. The six azimuth directions were a 0° direction, a 45° direction, a 60° direction, a 90° direction, a 120° direction, and a 135° direction.

The cutting in the azimuth 0° direction and 90° direction was performed by using the cutting tool having a tip end width of 100 μm at a constant cutting pitch of 400 μm.

The cutting in the azimuth 45° direction and 120° direction was performed by using the cutting tool having a tip end width of 125 μm at a constant cutting pitch of 800 μm.

The cutting in the azimuth 60° direction and 135° direction was performed by using the cutting tool having a tip end width of 75 μm at a constant cutting pitch of 800 μm.

The groove depth of all of the grooves was set to a constant value of 25.0 μm.

A concavo-convex structure layer (30 μm in thickness) was formed and a light-emitting device I-11 was produced in the same manner as in Example I-1 except that the metal mold fabricated as described above was used.

On the surface of the produced concavo-convex structure layer where the concavo-convex structure was formed, an average inclination angle of the inclined surface portions with respect to the flat surface portions was 80.0°. The ratio of the projected area of the inclined surface portions with respect to the total area of the flat surface portions was 0.09. The maximum height difference between the flat surface portions was 25.1 μm. Electricity was applied to the resulting light-emitting device I-11 to emit light, and transparency of the light-emitting device I-11 was visually evaluated. As a result, excellent transparency was observed in the front direction and the inclined direction.

Example I-8

A metal mold was fabricated by cutting in eight azimuth directions by using a cutting tool having a vertex angle of 25° and a tip end width of 40 µm, a cutting tool having a vertex angle of 25° and a tip end width of 80 µm, a cutting tool having a vertex angle 25° and a tip end width of 120 µm, and a cutting tool having a vertex angle of 25° and a tip end width of 160 µm. The eight azimuth directions were a 0° direction, a 20° direction, a 45° direction, a 60° direction, a 90° direction, a 115° direction, a 135° direction, and a 165° direction.

The cutting in the azimuth 0° direction and the azimuth 60° direction was performed by using the cutting tool having a tip end width of 160 µm. The cutting in the azimuth 20° direction and 115° direction was performed by using the cutting tool having a tip end width of 120 µm. The cutting in the azimuth 45° direction and 165° direction was performed by using the cutting tool having a tip end width of 40 µm. The cutting in the azimuth 90° direction and 135° direction was performed by using the cutting tool having a tip end width of 80 µm. All of the grooves were formed at a constant cutting pitch of 800 µm and a constant groove depth of 25.0 µm.

From this metal mold, a transfer mold having a concavo-convex configuration of reverse shape was fabricated by Ni electrocasting (approximately 300 µm in thickness).

A concavo-convex structure layer (30 µm in thickness) was formed and a light-emitting device I-12 was produced in the same manner as in Example I-1 except that this transfer mold was used as the mold.

On the surface of the produced concavo-convex structure layer where the concavo-convex structure was formed, an average inclination angle of the inclined surface portions with respect to the flat surface portions was 77.5°. The ratio of the projected area of the inclined surface portions with respect to the total area of the flat surface portions was 0.09. The maximum height difference between the flat surface portions was 25.1 µm. Electricity was applied to the resulting light-emitting device I-12 to emit light, and transparency of the light-emitting device I-12 was visually evaluated. As a result, excellent transparency was observed in the front direction and the inclined direction.

Comparative Example I-6

A metal mold was fabricated by cutting in two azimuth directions by using a cutting tool having a vertex angle of 20.0° and a tip end width of 10 µm. The two azimuth directions were a 0° direction and a 90° direction.

The cutting in both azimuth directions was performed at a constant cutting pitch of 100.0 µm and a constant groove depth of 20.0 µm.

A concavo-convex structure layer (25 µm in thickness) was formed and a light-emitting device I-13 was produced in the same manner as in Example I-1 except that the metal mold fabricated as described above was used.

On the surface of the produced concavo-convex structure layer where the concavo-convex structure was formed, the ratio of the projected area of the inclined surface portions with respect to the total area of the flat surface portions was 0.32. The maximum height difference between the flat surface portions was 20.1 µm. Electricity was applied to the resulting light-emitting device I-13 to emit light, and transparency of the light-emitting device I-13 was visually evaluated. As a result, poor transparency was observed in the front direction and the inclined direction.

Comparative Example I-7

A metal mold was fabricated by cutting in two azimuth directions by using a cutting tool having a vertex angle of 40.0° and a tip end width of 10.0 µm. The two azimuth directions were a 0° direction and a 90° direction.

The cutting in both azimuth directions was performed at a constant cutting pitch of 35.0 µm and a constant groove depth of 5.0 µm.

A concavo-convex structure layer (10 µm in thickness) was formed and a light-emitting device I-14 was produced in the same manner as in Example I-1 except that the metal mold fabricated as described above was used.

On the surface of the produced concavo-convex structure layer where the concavo-convex structure was formed, the ratio of the projected area of the inclined surface portions with respect to the area of the flat surface portions was 0.40. The maximum height difference between the flat surface portions was 5.1 µm. Electricity was applied to the resulting light-emitting device I-14 to emit light, and transparency of the light-emitting device I-14 was visually evaluated. As a result, poor transparency was observed in the front direction and the inclined direction.

Comparative Example I-8

A metal mold was fabricated by cutting in two azimuth directions by using a cutting tool having a vertex angle of 20.0° and a tip end width of 30.0 µm. The two azimuth directions were a 0° direction and a 90° direction.

The cutting in both azimuth directions was performed at a constant cutting pitch of 100.0 µm and a constant groove depth of 25.1 µm.

A concavo-convex structure layer (30 µm in thickness) was formed and a light-emitting device I-15 was produced in the same manner as in Example I-1 except that the metal mold fabricated as described above was used.

On the surface of the produced concavo-convex structure layer where the concavo-convex structure was formed, the ratio of the projected area of the inclined surface portions with respect to the area of the flat surface portions was 0.28. The maximum height difference between the flat surface portions was 25.1 µm. Electricity was applied to the resulting light-emitting device I-15 to emit light, and transparency of the light-emitting device I-15 was visually evaluated. As a result, poor transparency was observed in the front direction and the inclined direction.

Comparative Example I-9

A metal mold was fabricated by cutting in two azimuth directions by using a cutting tool having a vertex angle of 30.0° and a tip end width of 50.0 µm. The two azimuth directions were a 0° direction and a 90° direction.

The cutting in both azimuth directions was performed at a constant cutting pitch of 100.0 µm and a constant groove depth of 25.0 µm.

A concavo-convex structure layer (30 µm in thickness) was formed and a light-emitting device I-16 was produced in the same manner as in Example I-1 except the metal mold fabricated as described above was used.

On the surface of the produced concavo-convex structure layer where the concavo-convex structure was formed, the ratio of the projected area of the inclined surface portions with respect to the area of the flat surface portions was 0.26. The maximum height difference between the flat surface portions was 25.1 Electricity was applied to the resulting light-emitting device I-16 to emit light, and transparency of the light-emitting device I-16 was visually evaluated. As a result, poor transparency was observed in the front direction and the inclined direction.

[Evaluations]

The light-emitting devices I-9 to I-16 obtained in Examples I-5 to I-8 and Comparative Examples I-6 to I-9 were evaluated in the aforementioned manner. The results are shown in Tables 3 and 4.

The light-emitting devices obtained in Examples I-5 to I-8 and Comparative Examples I-6 to I-9 were visually observed. As a result, although some rainbow unevenness was observed, the degree of the rainbow unevenness was at the level that is not regarded as a problem in some using mode.

TABLE 3

[Results of Example I-5 to Example I-8]

| | Ex. I-5 | Ex. I-6 | Ex. I-7 | Ex. I-8 |
|---|---|---|---|---|
| Ratio of projected area of inclined surface portions with respect to total area of flat surface portions | 0.03 | 0.08 | 0.09 | 0.09 |
| Maximum value of height difference between flat surface portions (μm) | 20.1 | 18.1 | 5.1 | 25.1 |
| Average inclination angle of inclined surface portions (°) | 87.5 | 77.5 | 80 | 77.5 |
| Tip end width of cutting tool (μm) * number of cutting directions | 50 * 3 | 50 * 2<br>150 * 2 | 75 * 2<br>100 * 2<br>125 * 2 | 40 * 2<br>80 * 2<br>120 * 2<br>160 * 2 |
| Reference pitch (μm) * number of cutting directions | 200 * 1<br>400 * 2 | 400 * 4 | 400 * 2<br>800 * 4 | 800 * 8 |
| Pitch random | No | No | No | No |
| Height random | No | No | No | No |
| number of cutting directions | 3 | 4 | 6 | 8 |
| Azimuth direction of grooves (°) | 0<br>45<br>90 | 0<br>45<br>90<br>135 | 0<br>45<br>60<br>90<br>120<br>135 | 0<br>20<br>45<br>60<br>90<br>115<br>135<br>165 |
| Grid unevenness resulting from the streak arrays | Excellent | Excellent | Excellent | Excellent |
| Visibility in front direction | Excellent | Excellent | Excellent | Excellent |
| Visibility in inclined direction | Excellent | Good | Good | Good |
| Amount of light extracted from bonded surface (lm) | 0.309 | 0.311 | 0.326 | 0.318 |
| Amount of light extracted from the back surface (lm) | 0.275 | 0.286 | 0.304 | 0.287 |
| Total light extract amount (lm) | 0.584 | 0.597 | 0.63 | 0.605 |
| Transparency of concavo-convex structure layer | 0.36 | 3.71 | 4.13 | 3.90 |

TABLE 4

[Results of Comparative Example I-1, and Comparative Example I-6 to Comparative Example I-9]

| | Comp. Ex. I-1 | Comp. Ex. I-6 | Comp. Ex. I-7 | Comp. Ex. I-8 | Comp. Ex. I-9 |
|---|---|---|---|---|---|
| Ratio of projected area of inclined surface portions with respect to total area of flat surface portions | — | 0.32 | 0.40 | 0.28 | 0.26 |
| Maximum value of height difference between flat surface portions (μm) | — | 20.1 | 5.1 | 25.1 | 25.1 |
| Average inclination angle of inclined surface portions (°) | — | 80 | 70 | 80 | 75 |
| Tip end width of cutting tool (μm) | — | 10 | 10 | 30 | 50 |
| Reference pitch (μm) | — | 100 | 35 | 100 | 100 |
| Pitch random | — | No | No | No | No |
| Height random | — | No | No | No | No |
| number of cutting directions | — | 2 | 2 | 2 | 2 |
| Azimuth direction of grooves (°) | — | 0<br>90 | 0<br>90 | 0<br>90 | 0<br>90 |
| Grid unevenness resulting from the streak arrays | Excellent | Bad | Bad | Bad | Bad |
| Visibility in front direction | Excellent | Bad | Bad | Bad | Bad |
| Visibility in inclined direction | Excellent | Bad | Bad | Bad | Bad |
| Amount of light extracted from bonded surface (lm) | 0.22 | 0.408 | 0.388 | 0.402 | 0.373 |
| Amount of light extracted from the back surface (lm) | 0.22 | 0.27 | 0.326 | 0.332 | 0.337 |
| Total light extract amount (lm) | 0.44 | 0.678 | 0.714 | 0.734 | 0.71 |
| Transparency of concavo-convex structure layer | — | 12.14 | 11.04 | 11.40 | 11.64 |

II. Examples and Comparative Examples Regarding the Second Aspect of the Invention Example II-1

Production of Multi-Layered Body

A UV curable resin (refractive index of 1.54) composed mainly of urethane acrylate was applied onto a roll of substrate film (trade name "ZEONOR film", manufactured by ZEON CORPORATION, a film of alicyclic structure-containing polymer resin, thickness of 100 μm, refractive index of 1.53) to form a coating layer. A metal mold was pressed against the coating layer. Keeping this state, the coating layer was irradiated with 1.5 mJ/cm$^2$ of ultraviolet rays for curing, whereby a concavo-convex structure layer having a concavo-convex structure (25 μm in thickness) was formed.

Figure 33:
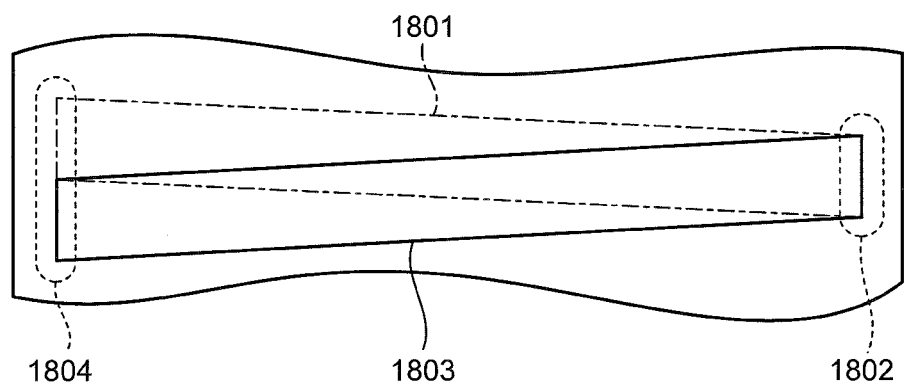
FIG. 33 is a plan view schematically illustrating the appearance of part of a surface of a metal mold to be cut in order to explain how the metal mold used in example II-1 was produced.

FIG. 33 is a plan view schematically illustrating the appearance of part of a surface of a metal mold to be cut in order to explain how the metal mold used in Example II-1 was produced. As shown in FIG. 33, the metal mold for fabricating a concavo-convex structure was fabricated by cutting by using a cutting tool having a vertex angle of 5° and a tip end width of 50 μm according to the following procedure.

(1) On one surface of a metal plate for fabricating the mold, cutting is performed along a certain in-plane direction at a certain cutting pitch P. In FIG. 33, a cut track 1801 formed by the first cutting is shown in dashed and dotted lines.

(2) Cutting is again performed with cutting start positions 1802 and the cutting pitch P that are set to be the same as in the first cutting. The cutting direction of this cutting is such that the previously-formed cut tracks 1801 overlap with cut tracks 1803 formed by this cutting, and the total cutting surface widths at cutting end positions 1804 are smaller than or equal to the tip end width of the cutting tool, multiplied by the number of times of cutting (for example, twice in the second cutting). As an example, in FIG. 33, a cut track 1803 formed by the second cutting is shown in solid lines.

(3) Cutting described in (2) above is repeated as many times as the total cutting surface widths at the cutting end positions 1804 reach a desired cutting surface width. The cutting surface widths at the cutting end positions 1804 are usually the maximum cutting surface width of the grooves formed by the cutting. The maximum cutting surface widths can be arbitrarily changed within three times the tip end width of the cutting tool by adjusting the angle of the cutting direction. As a result, a first group of grooves each of which has groove width that continuously varies along its extending direction are formed on the metal mold.

(4) Cutting is performed in accordance with the aforementioned cutting method (1) to (3) along a direction that crosses the direction of the first cutting that has been performed for forming the first group of grooves at a predetermined crossing angle. This forms a second group of grooves crossing the first group of grooves on the metal mold.

Figure 34:
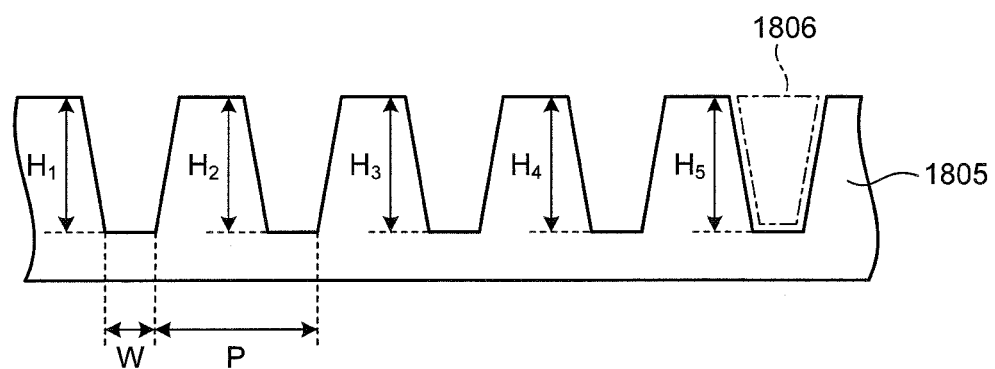
FIG. 34 is a cross-sectional view schematically illustrating a cross section of part of the metal mold used in example II-1, taken along a plane perpendicular to one of cutting directions.

FIG. 34 is a cross-sectional view schematically illustrating a cross section of part of the metal mold used in Example II-1 taken along a plane perpendicular to one of the cutting directions. As shown in FIG. 34, in Example II-1, the cutting pitch P was set to 200 µm, the maximum cutting surface width was set to 150 µm and the crossing angle of the cutting directions of the first group of grooves and the second group of grooves was set to 90°. Each of grooves 1806 formed in the fabricated metal mold 1805 has an in-plane cutting surface width W that continuously varies from 50 µm to 150 µm along the extending direction. The depths of the grooves 1806 formed by the cutting were changed in five levels in the order of $H_1$ to $H_5$. With five grooves 1806 thus formed as a repeating unit, the cutting was repeated. In the present Example, the depths $H_1$ to $H_5$ of the grooves 1806 included in a repeating unit were set so that $H_1$ was 19.4 µm, $H_2$ was 19.7 µm, $H_3$ was 20.0 µm, $H_4$ was 20.3 µm, and $H_5$ was 20.6 µm.

Figure 35:
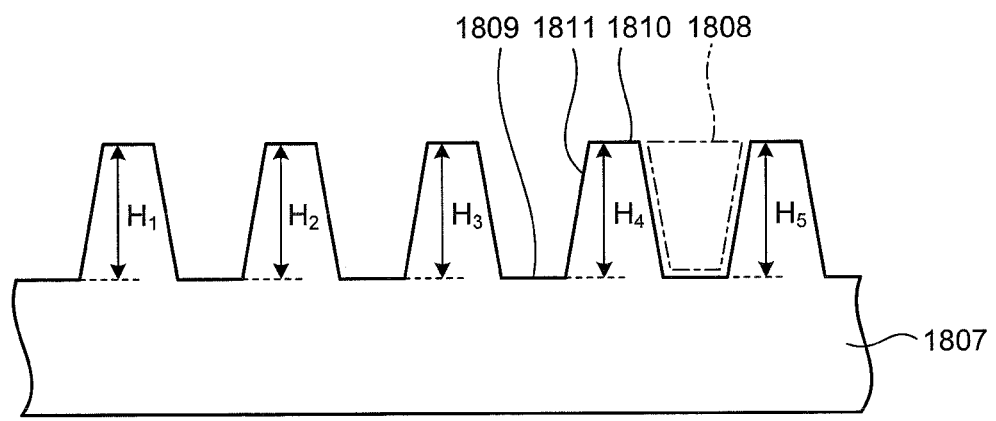
FIG. 35 is a cross-sectional view schematically illustrating a cross section of part of a concavo-convex structure layer obtained in example II-1, taken along a plane perpendicular to one of the cutting directions of the metal mold.

FIG. 35 is a cross-sectional view schematically illustrating a cross section of part of a concavo-convex structure layer obtained in Example II-1, taken along a plane perpendicular to one of the cutting directions of the metal mold. As shown in FIG. 35, a concavo-convex structure including a large number of prismoidal concave portions 1808 corresponding to the grooves formed on the metal mold was formed on the surface of the obtained concavo-convex structure layer 1807, and flat surface portions 1809 were formed at the bottoms of the concave portions 1808. A plurality of flat surface portions 1810 were formed between the concave portions 1808. Of these, the flat surface portions 1810 constituted band-shaped surface portions extending in parallel to the cutting directions of the metal mold.

On this concavo-convex structure layer 1807, an average inclination angle of the inclined surface portions 1811 of the concave portions 1808 with respect to the flat surface portions 1809 and 1810 was 87.5°. The ratio of the projected area of the inclined surface portions 1811 with respect to the total area of the flat surface portions 1809 and 1810 was 0.03. The maximum height difference between the flat surface portions 1809 and the flat surface portions 1810 was 20.6 µm.

(Production of Transparent Organic EL Element)

On a glass substrate on the main surface of which a transparent electrode layer was formed, a hole injection layer, a hole transport layer, a light-emitting layer, a hole block layer, a electronic charge generation layer, a metal oxide layer, and a cathode were formed in this order. The materials and thicknesses of the respective layers were as follows:

Transparent electrode layer: ITO, 300 nm
Hole injection layer: molybdenum trioxide ($MoO_3$), 5 nm
Hole transport layer: NS-21 [manufactured by Nippon Steel Chemical Co., Ltd.] and $MoO_3$, 20 nm, and additionally NS-21, 5 nm, a total of 25 nm
Light-emitting layer: NS-21 and EY52 (manufactured by e-Ray Optoelectronics Technology (referred to as hereinbelow e-Ray)), 20 nm, and EB43 and EB52 (both manufactured by e-Ray), 30 nm, a total of 50 nm
Hole block layer: bis(2-methyl-8-quinolinolate)(p-phenylphenolate)aluminum (BAlq), 5 nm
Electronic charge generation layer: Liq and DPB, 35 nm, additionally aluminum, 1.5 nm, and additionally NS-21 and $MoO_3$, 1.0 nm, a total of 37.5 nm
Metal oxide layer: $MoO_3$, 5 nm
Cathode: ITO, 100 nm The layers from the hole injection layer to the metal oxide layer were formed by placing in a vacuum vapor-deposition system the glass substrate having the transparent electrode layer previously formed thereon, and then the aforementioned materials from the hole transport layer to the metal oxide layer were sequentially vapor-deposited by resistance heating. The vapor deposition was performed at an internal system pressure of $5 \times 10^3$ Pa and an evaporating speed of 0.1 nm/s to 0.2 nm/s. Subsequently, the ITO of the cathode layer was deposited by facing target sputtering. The resultant was sealed with another glass plate using a UV curable resin, to obtain a transparent organic EL element II-1. Electricity was applied to the resulting transparent organic EL element II-1 for driving the element. As a result, favorable white light emission was obtained with excellent transparency in both a front direction and an inclined direction. The front direction herein refers to a direction parallel to the normal direction of the light-emitting surface. The inclined direction refers to a direction 45° inclined with respect to the light-emitting surface.

(Production of Light-Emitting Device II-1)

Onto the obtained transparent organic EL element II-1, a film substrate on which a concavo-convex structure layer was formed was bonded via a tacky layer (acrylic resin, refractive index of 1.49, manufactured by NITTO DENKO CORPORATION, CS9621) to obtain a light-emitting device II-1 having the layer structure of (the transparent organic EL element II-1)/(the tacky layer)/(the film substrate)/(the concavo-convex structure layer). Electricity was applied to the resulting light-emitting device II-1 to emit light, and transparency of the light-emitting device II-1 was visually evaluated. As a result, excellent transparency was observed in the front direction and the inclined direction.

Example II-2

Figure 36:
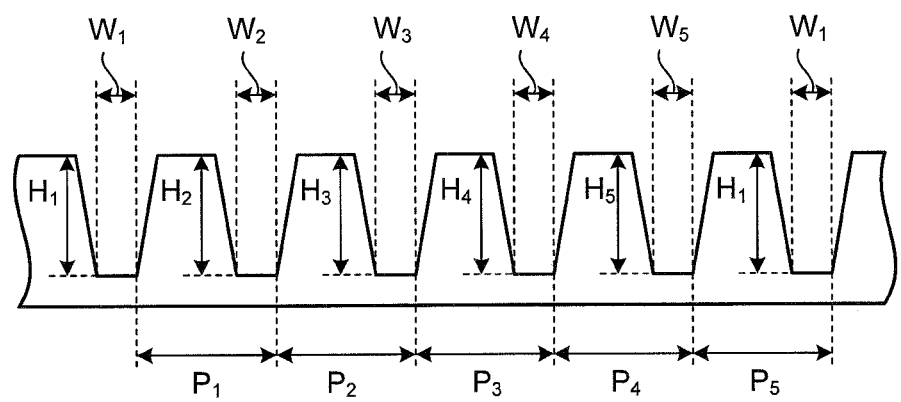
FIG. 36 is a cross-sectional view schematically illustrating a cross section of a metal mold used in examples II-2 to II-9 and comparative examples II-2 to II-5, taken at cutting end positions along a plane perpendicular to one of cutting directions.

FIG. 36 is a cross-sectional view schematically illustrating a cross section of a metal mold used in Example II-2 (and Examples II-3 to II-9 and Comparative Examples II-2 to II-5 to be described later) taken at the cutting end positions along a plane perpendicular to one of the cutting directions.

The cutting tool was changed to one having a vertex angle of 30.0° and a tip end width of 100.0 μm.

Further, as shown in FIG. 36, the heights $H_1$ to $H_5$ of the grooves formed on the metal mold were set to 20.0 μm. Cutting pitches $P_1$ to $P_5$ were set to 400 μm. Furthermore, the cutting surface widths $W_1$ to $W_5$ at the cutting end positions of the grooves were set so that $W_1$ was 100 μm, $W_2$ was 150 μm, $W_3$ was 200 μm, $W_4$ was 250 μm, and $W_5$ was 300 μm. With the five grooves thus formed as a repeating unit, the cutting was repeated.

Except for the aforementioned modification, a metal mold was produced, then a concavo-convex structure layer (25 μm in thickness) was further produced, and a light-emitting device II-2 was produced in the same manner as in Example II-1.

On the surface of the produced concavo-convex structure layer where the concavo-convex structure was formed, an average inclination angle of the inclined surface portions with respect to the flat surface portions was 75.0°. The ratio of the projected area of the inclined surface portions with respect to the total area of the flat surface portions was 0.09. The maximum height difference between the flat surface portions was 20.1 μm. Electricity was applied to the resulting light-emitting device II-2 to emit light, and transparency of the light-emitting device II-2 was visually evaluated. As a result, excellent transparency was observed in the front direction and the inclined direction.

Example II-3

The cutting tool was changed to one having a vertex angle of 20.0° and a tip end width of 100 μm.

Further, as shown in FIG. 36, the heights $H_1$ to $H_5$ of the grooves formed on the metal mold were set to 30.0 μm. The cutting pitches $P_1$ to $P_5$ were set so that $P_1$ was 450 μm, $P_2$ was 475 μm, $P_3$ was 500 μm, $P_4$ was 525 μm, and $P_5$ was 550 μm. Furthermore, the cutting surface widths $W_1$ to $W_5$ at the cutting end positions of the grooves were set to 200 μm. With the five grooves thus formed as a repeating unit, the cutting was repeated.

Except for the aforementioned modification, a metal mold was produced, then a concavo-convex structure layer (35 μm in thickness) was further produced, and a light-emitting device II-3 was produced in the same manner as in Example II-1.

On the surface of the produced concavo-convex structure layer where the concavo-convex structure was formed, an average inclination angle of the inclined surface portions with respect to the flat surface portions was 80.0°. The ratio of the projected area of the inclined surface portions with respect to the total area of the flat surface portions was 0.05. The maximum height difference between the flat surface portions was 30.1 μm. Electricity was applied to the resulting light-emitting device II-3 to emit light, and transparency of the light-emitting device II-3 was visually evaluated. As a result, excellent transparency was observed in the front direction and the inclined direction.

Example II-4

The cutting tool was changed to one having a vertex angle of 30.0° and a tip end width of 150 μm.

Further, as shown in FIG. 36, the depths $H_1$ to $H_5$ of the grooves were set so that $H_1$ was 24.4 μm, $H_2$ was 24.7 μm, $H_3$ was 25.0 μm, $H_4$ was 25.3 μm, and $H_5$ was 25.6 μm. The cutting pitches $P_1$ to $P_5$ were set so that $P_1$ was 360 μm, $P_2$ was 380 μm, $P_3$ was 400 μm, $P_4$ was 420 μm, and $P_5$ was 440 μm. Furthermore, the cutting surface widths $W_1$ to $W_5$ at the cutting end positions of the grooves were set to 300 μm. With the five grooves thus formed as a repeating unit, the cutting was repeated.

Except for the aforementioned modification, a metal mold was produced, then a concavo-convex structure layer (30 μm in thickness) was further produced, and a light-emitting device II-4 was produced in the same manner as in Example II-1.

On the surface of the produced concavo-convex structure layer where the concavo-convex structure was formed, an average inclination angle of the inclined surface portions with respect to the flat surface portions was 75.0°. The ratio of the projected area of the inclined surface portions with respect to the total area of the flat surface portions was 0.09. The maximum height difference between the flat surface portions was 25.6 μm. Electricity was applied to the resulting light-emitting device II-4 to emit light, and transparency of the light-emitting device II-4 was visually evaluated. As a result, excellent transparency was observed in the front direction and the inclined direction.

Example II-5

The cutting tool was changed to one having a vertex angle of 8.0° and a tip end width of 50.0 μm.

Further, as shown in FIG. 36, the heights $H_1$ to $H_5$ of the grooves formed on the metal mold were set to 20.0 μm. The cutting pitches $P_1$ to $P_5$ were set so that $P_1$ was 180 μm, $P_2$ was 190 μm, $P_3$ was 200 μm, $P_4$ was 210 μm, and $P_5$ was 220 μm. Furthermore, the cutting surface widths $W_1$ to $W_5$ at the cutting end positions of the grooves were set so that $W_1$ was 50 μm, $W_2$ was 75 μm, $W_3$ was 100 μm, $W_4$ was 125 and $W_5$ was 150 μm. With the five grooves thus formed as a repeating unit, the cutting was repeated.

Except for the aforementioned modification, a metal mold was produced, then a concavo-convex structure layer (25 μm in thickness) was further produced, and a light-emitting device II-5 was produced in the same manner as in Example II-1.

On the surface of the produced concavo-convex structure layer where the concavo-convex structure was formed, an average inclination angle of the inclined surface portions with respect to the flat surface portions was 86.0°. The ratio of the projected area of the inclined surface portions with respect to the total area of the flat surface portions was 0.04. The maximum height difference between the flat surface portions was 20.1 μm. Electricity was applied to the resulting light-emitting device II-5 to emit light, and transparency of the light-emitting device II-5 was visually evaluated. As a result, excellent transparency was observed in the front direction and the inclined direction.

Example II-6

The cutting tool was changed to one having a vertex angle of 25.0° and a tip end width of 50.0 μm.

Further, as shown in FIG. 36, the heights $H_1$ to $H_5$ of the grooves formed on the metal mold were set so that $H_1$ was 19.4 μm, $H_2$ was 19.7 μm, $H_3$ was 20.0 μm, $H_4$ was 20.3 μm, and $H_5$ was 20.6 μm. The cutting pitches $P_1$ to $P_5$ were set to 400 μm. Furthermore, the cutting surface widths $W_1$ to $W_5$ at the cutting end positions of the grooves were set so that $W_1$ was 50 μm, $W_2$ was 62.5 μm, $W_3$ was 75 $W_4$ was 87.5 μm, and $W_5$ was 100 μm. With the five grooves thus formed as a repeating unit, the cutting was repeated.

Except for the aforementioned modification, a metal mold was produced, then a concavo-convex structure layer (25 μm in thickness) was further produced, and a light-emitting device II-6 was produced in the same manner as in Example II-1.

On the surface of the produced concavo-convex structure layer where the concavo-convex structure was formed, an average inclination angle of the inclined surface portions with respect to the flat surface portions was 77.5°. The ratio of the projected area of the inclined surface portions with respect to the total area of the flat surface portions was 0.09. The maximum height difference between the flat surface portions was 20.6 μm. Electricity was applied to the resulting light-emitting device II-6 to emit light, and transparency of the light-emitting device II-6 was visually evaluated. As a result, excellent transparency was observed in the front direction and the inclined direction.

Example II-7

The cutting tool was changed to one having a vertex angle of 5.0° and a tip end width of 50.0 μm.

Further, as shown in FIG. 36, the heights $H_1$ to $H_5$ of the grooves formed on the metal mold were set so that $H_1$ was 19.4 μm, $H_2$ was 19.7 μm, $H_3$ was 20.0 μm, $H_4$ was 20.3 μm, and $H_5$ was 20.6 μm. The cutting pitches $P_1$ to $P_5$ were set so that $P_1$ was 180 μm, $P_2$ was 190 μm, $P_3$ was 200 μm, $P_4$ was 210 μm, and $P_5$ was 220 μm. The cutting surface widths $W_1$ to $W_5$ at the cutting end positions of the grooves were set so that $W_1$ was 50 μm, $W_2$ was 75 μm, $W_3$ was 100 μm, $W_4$ was 125 μm, and $W_5$ was 150 μm. With the five grooves thus formed as a repeating unit, the cutting was repeated.

Except for the aforementioned modification, a metal mold was produced, then a concavo-convex structure layer (25 μm in thickness) was further produced, and a light-emitting device II-7 was produced in the same manner as in Example II-1.

On the surface of the produced concavo-convex structure layer where the concavo-convex structure was formed, an average inclination angle of the inclined surface portions with respect to the flat surface portions was 87.5°. The ratio of the projected area of the inclined surface portions with respect to the total area of the flat surface portions was 0.03. The maximum height difference between the flat surface portions was 20.6 μm. Electricity was applied to the resulting light-emitting device II-7 to emit light, and transparency of the light-emitting device II-7 was visually evaluated. As a result, excellent transparency was observed in the front direction and the inclined direction.

Example II-8

The cutting tool was changed to one having a vertex angle of 5.0° and a tip end width of 25.0 μm.

Further, as shown in FIG. 36, the heights $H_1$ to $H_5$ of the grooves formed on the metal mold were set so that $H_1$ was 19.4 μm, $H_2$ was 19.7 μm, $H_3$ was 20.0 μm, $H_4$ was 20.3 and $H_5$ was 20.6 μm. The cutting pitches $P_1$ to $P_5$ were set so that $P_1$ was 180 μm, $P_2$ was 190 μm, $P_3$ was 200 μm, $P_4$ was 210 μm, and $P_5$ was 220 μm. The cutting surface widths $W_1$ to $W_5$ at the cutting end positions of the grooves were set so that $W_1$ was 25.0 μm, $W_2$ was 37.5 μm, $W_3$ was 50.0 μm, $W_4$ was 62.5 μm, and $W_5$ was 75.0 μm. The crossing angle between the first group of grooves and the second group of grooves was set to 60°.

Except for the aforementioned modification, a metal mold was produced, then a concavo-convex structure layer (25 μm in thickness) was further produced, and a light-emitting device II-8 was produced in the same manner as in Example II-1.

On the surface of the produced concavo-convex structure layer where the concavo-convex structure was formed, an average inclination angle of the inclined surface portions with respect to the flat surface portions was 87.5°. The ratio of the projected area of the inclined surface portions with respect to the total area of the flat surface portions was 0.03. The maximum height difference between the flat surface portions was 20.6 μm. Electricity was applied to the resulting light-emitting device II-8 to emit light, and transparency of the light-emitting device II-8 was visually evaluated. As a result, excellent transparency was observed in the front direction and the inclined direction.

Example II-9

The cutting tool was changed to one having a vertex angle of 10.0° and a tip end width of 60.0 μm.

Further, as shown in FIG. 36, the heights $H_1$ to $H_5$ of the grooves formed on the metal mold were set so that $H_1$ was 14.4 μm, $H_2$ was 14.7 μm, $H_3$ was 15.0 μm, $H_4$ was 15.3 μm, and $H_5$ was 15.6 μm. The cutting pitches $P_1$ to $P_5$ were set so that $P_1$ was 180 μm, $P_2$ was 190 μm, $P_3$ was 200 μm, $P_4$ was 210 μm, and $P_5$ was 220 μm. The cutting surface widths $W_1$ to $W_5$ at the cutting end positions of the grooves were set so that $W_1$ was 60.0 μm, $W_2$ was 90.0 μm, $W_3$ was 120.0 μm, $W_4$ was 150.0 μm, and $W_5$ was 180.0 μm. The crossing angle between the first group of grooves and the second group of grooves was set to 60°. Except for the aforementioned modification, a metal mold was produced in the same manner as in Example II-1. From this metal mold, a transfer mold having a reverse shape was fabricated by Ni electrocasting (approximately 300 μm in thickness). Except that the mold thus obtained was used as the transfer mold for producing the concavo-convex structure layer, a concavo-convex structure layer (20 μm in thickness) was produced and a light-emitting device II-9 was produced in the same manner as in Example II-1.

On the surface of the produced concavo-convex structure layer where the concavo-convex structure was formed, an average inclination angle of the inclined surface portions with respect to the flat surface portions was 85.0°. The ratio of the projected area of the inclined surface portions with respect to the total area of the flat surface portions was 0.04. The maximum height difference between the flat surface portions was 15.6 μm. Electricity was applied to the resulting light-emitting device II-9 to emit light, and transparency of the light-emitting device II-9 was visually evaluated. As a result, excellent transparency was observed in the front direction and the inclined direction.

Comparative Example II-2

The cutting tool was changed to one having a vertex angle of 20.0° and a tip end width of 10.0 μm.

Further, as shown in FIG. 36, the heights $H_1$ to $H_5$ of the grooves formed on the metal mold were set so that $H_1$ was 19.4 μm, $H_2$ was 19.7 μm, $H_3$ was 20.0 μm, $H_4$ was 20.3 μm, and $H_5$ was 20.6 μm. The cutting pitches $P_1$ to $P_5$ were set to 100.0 μm.

Furthermore, the cutting was performed only once in each direction so that the cutting surface width was uniform in the extending directions of the grooves.

Except for the aforementioned modification, a metal mold was produced, then a concavo-convex structure layer (25 μm in thickness) was further produced, and a light-emitting device II-10 was produced in the same manner as in Example II-1.

On the surface of the produced concavo-convex structure layer where the concavo-convex structure was formed, the ratio of the projected area of the inclined surface portions with respect to the total area of the flat surface portions was 0.32. The maximum height difference between the flat surface portions was 20.6 µm.

Electricity was applied to the resulting light-emitting device II-10 to emit light, and transparency of the light-emitting device II-10 was visually evaluated. As a result, poor transparency was observed in the front direction and the inclined direction.

Comparative Example II-3

The cutting tool was changed to one having a vertex angle of 40.0° and a tip end width of 10.0 µm.

Further, as shown in FIG. 36, the heights $H_1$ to $H_5$ of the grooves formed on the metal mold were set to 5.0 µm. The cutting pitches $P_1$ to $P_5$ were set so that $P_1$ was 31.5 $P_2$ was 33.3 µm, $P_3$ was 35.0 µm, $P_4$ was 36.8 µm, and $P_5$ was 38.5 µm.

Furthermore, the cutting was performed only once in each direction so that the cutting surface width was uniform in the extending directions of the grooves.

Except for the aforementioned modification, a metal mold was produced, then a concavo-convex structure layer (10 µm in thickness) was further produced, and a light-emitting device II-11 was produced in the same manner as in Example II-1.

On the surface of the produced concavo-convex structure layer where the concavo-convex structure was formed, the ratio of the projected area of the inclined surface portions with respect to the total area of the flat surface portions was 0.40. The maximum height difference between the flat surface portions was 5.1 µm.

Electricity was applied to the resulting light-emitting device II-11 to emit light, and transparency of the light-emitting device II-11 was visually evaluated. As a result, poor transparency was observed in the front direction and the inclined direction.

Comparative Example II-4

The cutting tool was changed to one having a vertex angle of 20.0° and a tip end width of 30.0 µm.

Further, as shown in FIG. 36, the heights $H_1$ to $H_5$ of the grooves formed on the metal mold were set so that $H_1$ was 24.4 $W_1$, $H_2$ was 24.7 µm, $H_3$ was 25.0 µm, $H_4$ was 25.3 µm, and $H_5$ was 25.6 µm. The cutting pitches $P_1$ to $P_5$ were set so that $P_1$ was 90.0 µm, $P_2$ was 95.0 µm, $P_3$ was 100.0 µm, $P_4$ was 105.0 µm, and $P_5$ was 110.0 µm.

Furthermore, the cutting was performed only once in each direction so that the cutting surface width was uniform in the extending directions of the grooves.

Except for the aforementioned modification, a metal mold was produced, then a concavo-convex structure layer (30 µm in thickness) was further produced, and a light-emitting device II-12 was produced in the same manner as in Example II-1.

On the surface of the produced concavo-convex structure layer where the concavo-convex structure was formed, the ratio of the projected area of the inclined surface portions with respect to the total area of the flat surface portions was 0.28. The maximum height difference between the flat surface portions was 25.6 µm.

Electricity was applied to the resulting light-emitting device II-12 to emit light, and transparency of the light-emitting device II-12 was visually evaluated. As a result, poor transparency was observed in the front direction and the inclined direction.

Comparative Example II-5

The cutting tool was changed to one having a vertex angle of 30.0° and a tip end width of 50.0 µm. Further, as shown in FIG. 36, the heights $H_1$ to $H_5$ of the grooves formed on the metal mold were set so that $H_1$ was 24.4 µm, $H_2$ was 24.7 µm, $H_3$ was 25.0 µm, $H_4$ was 25.3 µm, and $H_5$ was 25.6 µm. The cutting pitches $P_1$ to $P_5$ were set so that $P_1$ was 90.0 µm, $P_2$ was 95.0 µm, $P_3$ was 100.0 µm, $P_4$ was 105.0 µm, and $P_5$ was 110.0 µm.

Furthermore, the cutting was performed only once in each direction so that the cutting surface width was uniform in the extending directions of the grooves.

Except for the aforementioned modification, a metal mold was produced, then a concavo-convex structure layer (30 µm in thickness) was further produced, and a light-emitting device II-13 was produced in the same manner as in Example II-1.

On the surface of the produced concavo-convex structure layer where the concavo-convex structure was formed, the ratio of the projected area of the inclined surface portions with respect to the total area of the flat surface portions was 0.26. The maximum height difference between the flat surface portions was 25.6 µm.

Electricity was applied to the resulting light-emitting device II-13 to emit light, and transparency of the light-emitting device II-13 was visually evaluated. As a result, poor transparency was observed in the front direction and the inclined direction.

[Evaluations]
(Amount of Extracted Light)

As to the transparent organic EL element II-1 obtained in Example II-1 and the light-emitting devices II-1 to II-13 obtained in Examples II-1 to II-9 and Comparative Examples II-2 to II-5, the intensity of light emitted from both surfaces was calculated by an optical simulation using a program (program name "ASAP", manufactured by Breault Reserch) with the light intensity of the light-emitting layer as 1 lm. The resulting values are shown in Tables 5 to 7. In Tables 5 to 7, the numerical values in the "bonded surface" field indicate the amounts of light extracted from the light-emitting surfaces having a concavo-convex structure where a concavo-convex structure layer is provided. The numerical values in the "back surface" field indicate the amounts of light extracted from the glass surfaces without a concavo-convex structure layer. The transparent organic EL element II-1 is regarded as Comparative Example II-1. In Comparative Example II-1, the numerical value in the "bonded surface" field and the numerical value in the "back surface" field indicate the amount of light extracted from a glass surface without a concavo-convex structure layer.

(Transparency of Concavo-Convex Structure Layer)

As to the concavo-convex structure layers obtained in Examples II-1 to II-9 and Comparative Examples II-2 to II-5, parallel light transmittance and diffused light transmittance were calculated by an optical simulation using a program (program name "ASAP", manufactured by Breault Reserch). As a numerical value expressing the transparency of the concavo-convex structure layers, (diffused light transmittance)/(parallel light transmittance+diffused light transmittance)×100 was calculated. A small numerical value is indicative of superior transparency when viewed in the thickness direction. The resulting values are shown in Tables 5 to 7.

(Grid Unevenness)

The light-emitting devices II-1 to II-13 obtained in Examples II-1 to II-9 and Comparative Examples II-2 to II-5 were visually observed for checking existence of grid unevenness. Since the concavo-convex structure layer has the flat surface portions each of which has a width that varies in Examples II-1 to II-9, almost no grid unevenness were observed and these Examples were therefore excellent.

(Visibility)

The transparent organic EL element II-1 and the light-emitting devices II-1 to II-13 in a turned-off state were placed at 50 cm in front of a display surface on which characters having a size of 5 mm×5 mm were arrayed. The characters were observed through the transparent organic EL element II-1 and the light-emitting devices II-1 to II-13 in the front direction and the inclined direction. Ones through which the characters were clearly visible without smear or distortion were evaluated as "excellent". Ones through which the characters could be read though with some smear or distortion were "good". Ones through which the characters could not be clearly read were "bad". The results are shown in Tables 5 to 7.

(Rainbow Unevenness)

The light-emitting devices obtained in Examples II-1 to II-9 and Comparative Examples II-2 to II-5 were visually observed for checking existence of rainbow unevenness. In each of Examples II-1 to II-4 and Comparative Examples II-2 to II-5, since size differences were provided by such means as making the height difference of the concavo-convex structure uneven within a predetermined range, almost no rainbow unevenness based on the interference of reflected light on the front and back surfaces of the concavo-convex structure layer were observed, and these were therefore excellent.

TABLE 5

[Results of Example II-1 to Example II-5]

|  | Ex. II-1 | Ex. II-2 | Ex. II-3 | Ex. II-4 | Ex. II-5 |
|---|---|---|---|---|---|
| Ratio of projected area of inclined surface portions with respect to total area of flat surface portions | 0.03 | 0.09 | 0.05 | 0.09 | 0.04 |
| Width variation of band-shaped surface portions | Yes | Yes | Yes | Yes | Yes |
| Maximum value of height difference between flat surface portions (μm) | 20.6 | 20.1 | 30.1 | 25.6 | 20.1 |
| Average inclination angle of inclined surface portions (°) | 87.5 | 75 | 80 | 75 | 86 |
| Tip end width of cutting tool (μm) | 50 | 100 | 100 | 150 | 50 |
| Reference pitch (μm) | 200 | 400 | 500 | 400 | 200 |
| Reference pitch randomize | No | No | Yes | Yes | Yes |
| Range of flat surface portion (μm) and randomize | 50-150 | 100-300 (random) | 100-200 | 150-300 | 50-150 (random) |
| Height randomize | Yes | No | No | Yes | No |

TABLE 5-continued

[Results of Example II-1 to Example II-5]

|  | Ex. II-1 | Ex. II-2 | Ex. II-3 | Ex. II-4 | Ex. II-5 |
|---|---|---|---|---|---|
| Crossing angle (°) | 90 | 90 | 90 | 90 | 90 |
| Concave/convex | Concave | Concave | Concave | Concave | Concave |
| Grid unevenness | Excellent | Excellent | Excellent | Excellent | Excellent |
| Visibility (see-through feature) | Excellent | Good | Good | Good | Excellent |
| Amount of light extracted from bonded surface (lm) | 0.309 | 0.307 | 0.316 | 0.304 | 0.318 |
| Amount of light extracted from the back surface (lm) | 0.275 | 0.279 | 0.285 | 0.286 | 0.282 |
| Total light extract amount (lm) | 0.584 | 0.586 | 0.601 | 0.59 | 0.6 |
| Transparency of concavo-convex structure layer | 0.36 | 3.72 | 3.44 | 4.15 | 0.93 |

TABLE 6

[Results of Example II-6 to Example II-9]

|  | Ex. II-6 | Ex. II-7 | Ex. II-8 | Ex. II-9 |
|---|---|---|---|---|
| Ratio of projected area of inclined surface portions with respect to total area of flat surface portions | 0.09 | 0.03 | 0.03 | 0.04 |
| Width variation of band-shaped surface portions | Yes | Yes | Yes | Yes |
| Maximum value of height difference between flat surface portions (μm) | 20.6 | 20.6 | 20.6 | 15.6 |
| Average inclination angle of inclined surface portions (°) | 77.5 | 87.5 | 87.5 | 85 |
| Tip end width of cutting tool (μm) | 50 | 50 | 25 | 60 |
| Reference pitch (μm) | 400 | 200 | 200 | 200 |
| Reference pitch randomize | No | Yes | Yes | Yes |
| Range of flat surface portion(μm) and randomize | 50-100 (random) | 50-150 (random) | 25-75 (random) | 60-180 (random) |
| Height randomize | Yes | Yes | Yes | Yes |
| Crossing angle (°) | 90 | 90 | 60 | 60 |
| Concave/convex | Concave | Concave | Concave | Convex |
| Grid unevenness | Excellent | Excellent | Excellent | Excellent |
| Visibility (see-through feature) | Good | Excellent | Excellent | Excellent |
| Amount of light extracted from bonded surface (lm) | 0.309 | 0.309 | 0.304 | 0.301 |
| Amount of light extracted from the back surface (lm) | 0.281 | 0.275 | 0.247 | 0.28 |
| Total light extract amount (lm) | 0.59 | 0.584 | 0.551 | 0.581 |
| Transparency of concavo-convex structure layer | 3.75 | 0.36 | 0.38 | 0.98 |

TABLE 7

[Results of Comparative Example II-1 to Comparative Example II-5]

| | Comp. Ex. II-1 | Comp. Ex. II-2 | Comp. Ex. II-3 | Comp. Ex. II-4 | Comp. Ex. II-5 |
|---|---|---|---|---|---|
| Ratio of projected area of inclined surface portions with respect to total area of flat surface portions | — | 0.32 | 0.40 | 0.28 | 0.26 |
| Width variation of band-shaped surface portions | — | No | No | No | No |
| Maximum value of height difference between flat surface portions (μm) | — | 20.6 | 5.1 | 25.6 | 25.6 |
| Average inclination angle of inclined surface portions (°) | — | 80 | 70 | 80 | 75 |
| Tip end width of cutting tool (μm) | — | 10 | 10 | 30 | 50 |
| Reference pitch (μm) | — | 100 | 35 | 100 | 100 |
| Reference pitch randomize | — | No | Yes | Yes | Yes |
| Range of flat surface portion(μm) and randomize | — | 10 | 10 | 30 | 50 |
| Height randomize | — | Yes | No | Yes | Yes |
| Crossing angle (°) | — | 90 | 90 | 90 | 90 |
| Concave/convex | — | Concave | Concave | Concave | Concave |
| Grid unevenness | Excellent | Bad | Bad | Bad | Bad |
| Visibility (see-through feature) | Excellent | Bad | Bad | Bad | Bad |
| Amount of light extracted from bonded surface (lm) | 0.22 | 0.408 | 0.388 | 0.402 | 0.373 |
| Amount of light extracted from the back surface (lm) | 0.22 | 0.27 | 0.326 | 0.332 | 0.337 |
| Total light extract amount (lm) | 0.44 | 0.678 | 0.714 | 0.734 | 0.71 |
| Transparency of concavo-convex structure layer | — | 12.14 | 11.04 | 11.40 | 11.64 |

Example II-10

As shown in FIG. 34, the cutting tool was changed to one having a vertex angle of 5.0° and a tip end width of 50.0 μm. The heights $H_1$ to $H_5$ of the grooves formed on the metal mold were set to 20.0 μm. The cutting surface width W at the cutting end positions of the grooves was set to 100.0 μm. The cutting pitch P was set to 200.0 μm. Except for the aforementioned modification, a metal mold was produced, then a concavo-convex structure layer (25 μm in thickness) was further produced, and a light-emitting device II-14 was produced in the same manner as in Example II-1.

On the surface of the produced concavo-convex structure layer where the concavo-convex structure was formed, an average inclination angle of the inclined surface portions with respect to the flat surface portions was 87.5°. The ratio of the projected area of the inclined surface portions with respect to the total area of the flat surface portions was 0.03. The maximum height difference between the flat surface portions was 20.1 μm.

Electricity was applied to the resulting light-emitting device II-14 to emit light, and transparency of the light-emitting device II-14 was visually evaluated. As a result, excellent transparency was observed in the front direction and the inclined direction.

Example II-11

As shown in FIG. 34, the cutting tool was changed to one having a vertex angle of 40.0° and a tip end width of 100.0 μm. The heights $H_1$ to $H_5$ of the grooves formed on the metal mold were set to 10.0 μm. The cutting surface width W at the cutting end positions of the grooves was set to 200.0 μm. The cutting pitch P was set to be 300.0 μl. Except for the aforementioned modification, a metal mold was produced, then a concavo-convex structure layer (15 μm in thickness) was further produced, and a light-emitting device II-15 was produced in the same manner as in Example II-1.

On the surface of the produced concavo-convex structure layer where the concavo-convex structure was formed, an average inclination angle of the inclined surface portions with respect to the flat surface portions was 70.0°. The ratio of the projected area of the inclined surface portions with respect to the total area of the flat surface portions was 0.08. The maximum height difference between the flat surface portions was 10.1 μm.

Electricity was applied to the resulting light-emitting device II-15 to emit light, and transparency of the light-emitting device II-15 was visually evaluated. As a result, excellent transparency was observed in the front direction and the inclined direction.

Example II-12

As shown in FIG. 34, the cutting tool was changed to one having a vertex angle of 15.0° and a tip end width of 100.0 μm. The heights $H_1$ to $H_5$ of the grooves formed on the metal mold were set to 27.0 μm. The cutting surface width W at the cutting end positions was set to 300.0 μm. The cutting pitch P was set to 400.0 μm. Except for the aforementioned modification, a metal mold was produced, then a concavo-convex structure layer (32.0 μm in thickness) was further produced, and a light-emitting device II-16 was produced in the same manner as in Example II-1.

On the surface of the produced concavo-convex structure layer where the concavo-convex structure was formed, an average inclination angle of the inclined surface portions with respect to the flat surface portions was 82.5°. The ratio of the projected area of the inclined surface portions with respect to the total area of the flat surface portions was 0.04. The maximum height difference between the flat surface portions was 27.1 μm.

Electricity was applied to the resulting light-emitting device II-16 to emit light, and transparency of the light-emitting device II-16 was visually evaluated. As a result, excellent transparency was observed in the front direction and the inclined direction.

Example II-13

As shown in FIG. 34, the cutting tool was changed to one having a vertex angle of 30.0° and a tip end width of 200.0 μm. The heights $H_1$ to $H_5$ of the grooves formed on the metal mold were set to 25.0 μm. The cutting surface width W at the cutting end positions was set to 400.0 μm. The cutting pitch P was set to 500.0 μm. Except for the aforementioned modification, a metal mold was produced, then a concavo-convex structure layer (30.0 μm in thickness) was further produced, and a light-emitting device II-17 was produced in the same manner as in Example On the surface of the produced concavo-convex structure layer where the concavo-convex structure was formed, an average inclination angle of the inclined surface portions with respect to the flat surface portions was 75.0°. The ratio of the projected area of the inclined surface portions with respect to the total area of the flat surface portions was 0.07. The maximum height difference between the flat surface portions was 25.1 μm.

Electricity was applied to the resulting light-emitting device II-17 to emit light, and transparency of the light-emitting device II-17 was visually evaluated. As a result, excellent transparency was observed in the front direction and the inclined direction.

Comparative Example II-6

As shown in FIG. 34, the cutting tool was changed to one having a vertex angle of 20.0° and a tip end width of 10.0 μm. The heights $H_1$ to $H_5$ of the grooves formed on the metal mold were set to 20.0 μm. The cutting pitch P was set to 100.0 μm. The cutting was performed only once in each direction so that the cutting surface width was uniform in the extending directions of the grooves. Except for the aforementioned modification, a metal mold was produced, then a concavo-convex structure layer (25 μm in thickness) was further produced, and a light-emitting device II-18 was produced in the same manner as in Example II-1.

On the surface of the produced concavo-convex structure layer where the concavo-convex structure was formed, the ratio of the projected area of the inclined surface portions with respect to the total area of the flat surface portions was 0.32. The maximum height difference between the flat surface portions was 20.1 μm.

Electricity was applied to the resulting light-emitting device II-18 to emit light, and transparency of the light-emitting device II-18 was visually evaluated. As a result, poor transparency was observed in the front direction and the inclined direction.

Comparative Example II-7

As shown in FIG. 34, the cutting tool was changed to one having a vertex angle of 40.0° and a tip end width of 10.0 μm. The heights $H_1$ to $H_5$ of the grooves formed on the metal mold were set to 5.0 μl. The cutting pitch P was set to 35.0 μm. The cutting was performed only once in each direction so that the cutting surface width was uniform in the extending directions of the grooves. Except for the aforementioned modification, a metal mold was produced, then a concavo-convex structure layer (10 μm in thickness) was further produced, and a light-emitting device II-19 was produced in the same manner as in Example II-1.

On the surface of the produced concavo-convex structure layer where the concavo-convex structure was formed, the ratio of the projected area of the inclined surface portions with respect to the area of the flat surface portions was 0.40. The maximum height difference between the flat surface portions was 5.1 μm.

Electricity was applied to the resulting light-emitting device II-19 to emit light, and transparency of the light-emitting device II-19 was visually evaluated. As a result, poor transparency was observed in the front direction and the inclined direction.

Comparative Example II-8

As shown in FIG. 34, the cutting tool was changed to one having a vertex angle of 20.0° and a tip end width of 30.0 μm. The heights $H_1$ to $H_5$ of the grooves formed on the metal mold were set to 25.0 μm. The cutting pitch P was set to 100.0 μm. The cutting was performed only once in each direction so that the cutting surface width was uniform in the extending directions of the grooves. Except for the aforementioned modification, a metal mold was produced, then a concavo-convex structure layer (30 μm in thickness) was further produced, and a light-emitting device II-20 was produced in the same manner as in Example II-1.

On the surface of the produced concavo-convex structure layer where the concavo-convex structure was formed, the ratio of the projected area of the inclined surface portions with respect to the area of the flat surface portions was 0.28. The maximum height difference between the flat surface portions was 25.1 μm.

Electricity was applied to the resulting light-emitting device II-20 to emit light, and transparency of the light-emitting device II-20 was visually evaluated. As a result, poor transparency was observed in the front direction and the inclined direction.

Comparative Example II-9

As shown in FIG. 34, the cutting tool was changed to one having a vertex angle of 30.0° and a tip end width of 50.0 μm. The heights $H_1$ to $H_5$ of the grooves formed on the metal mold were set to 25.0 μm. The cutting pitch P was set to 100.0 μm. The cutting was performed only once in each direction so that the cutting surface width was uniform in the extending directions of the grooves. Except for the aforementioned modification, a metal mold was produced, then a concavo-convex structure layer (30 μm in thickness) was further produced, and a light-emitting device II-21 was produced in the same manner as in Example II-1.

On the surface of the produced concavo-convex structure layer where the concavo-convex structure was formed, the ratio of the projected area of the inclined surface portions with respect to the area of the flat surface portions was 0.26. The maximum height difference between the flat surface portions was 25.1 μm.

Electricity was applied to the resulting light-emitting device II-21 to emit light, and transparency of the light-emitting device II-21 was visually evaluated. As a result, poor transparency was observed in the front direction and the inclined direction.

[Evaluations]

The light-emitting devices II-14 to II-21 obtained in Examples II-10 to II-13 and Comparative Examples II-6 to II-9 were evaluated for the amount of extracted light and transparency in the aforementioned manner. The results are shown in Tables 8 and 9.

The light-emitting devices II-14 to II-21 obtained in Examples II-10 to II-13 and Comparative Examples II-6 to II-9 were visually observed. As a result, although some rainbow unevenness was observed, the degree of the rainbow unevenness was at the level that is not regarded as a problem in some use mode.

TABLE 8

[Results of Example II-10 to Example II-13]

|  | Ex. II-10 | Ex. II-11 | Ex. II-12 | Ex. II-13 |
|---|---|---|---|---|
| Ratio of projected area of inclined surface portions with respect to total area of flat surface portions | 0.03 | 0.08 | 0.04 | 0.07 |
| Width variation of band-shaped surface portions | Yes | Yes | Yes | Yes |
| Maximum value of height difference between flat surface portions (μm) | 20.1 | 10.1 | 27.1 | 25.1 |
| Average inclination angle of inclined surface portions (°) | 87.5 | 70 | 82.5 | 75 |
| Tip end width of cutting tool (μm) | 50 | 100 | 100 | 200 |
| Reference pitch (μm) | 200 | 300 | 400 | 500 |
| Reference pitch randomize | No | No | No | No |
| Range of flat surface portion(μm) and randomize | 50-100 | 100-200 | 100-300 | 200-400 |
| Height randomize | No | No | No | No |
| Crossing angle (°) | 90 | 90 | 90 | 90 |
| Concave/convex | Concave | Concave | Concave | Concave |
| Grid unevenness | Excellent | Excellent | Excellent | Excellent |
| Visibility (see-through feature) | Excellent | Good | Good | Good |
| Amount of light extracted from bonded surface (lm) | 0.309 | 0.282 | 0.31 | 0.29 |
| Amount of light extracted from the back surface (lm) | 0.275 | 0.257 | 0.282 | 0.271 |
| Total light extract amount (lm) | 0.584 | 0.539 | 0.592 | 0.561 |
| Transparency of concavo-convex structure layer | 0.36 | 2.50 | 2.14 | 3.13 |

TABLE 9

[Results of Comparative Example II-1 and Comparative Example II-6 to Comparative Example II-9]

|  | Comp. Ex. II-1 | Comp. Ex. II-6 | Comp. Ex. II-7 | Comp. Ex. II-8 | Comp. Ex. II-9 |
|---|---|---|---|---|---|
| Ratio of projected area of inclined surface portions with respect to total area of flat surface portions | — | 0.32 | 0.40 | 0.28 | 0.26 |
| Width variation of band-shaped surface portions | — | No | No | No | No |
| Maximum value of height difference between flat surface portions (μm) | — | 20.1 | 5.1 | 25.1 | 25.1 |
| Average inclination angle of inclined surface portions (°) | — | 80 | 70 | 80 | 75 |
| Tip end width of cutting tool (μm) | — | 10 | 10 | 30 | 50 |
| Reference pitch (μm) | — | 100 | 35 | 100 | 100 |
| Reference pitch randomize | — | No | No | No | No |
| Range of flat surface portion(μm) and randomize | — | 10 | 10 | 30 | 50 |
| Height randomize | — | No | No | No | No |
| Crossing angle (°) | — | 90 | 90 | 90 | 90 |
| Concave/convex | — | 90 | 90 | 90 | 90 |
| Grid unevenness | Excellent | Bad | Bad | Bad | Bad |
| Visibility (see-through feature) | Excellent | Bad | Bad | Bad | Bad |
| Amount of light extracted from bonded surface (lm) | 0.22 | 0.408 | 0.388 | 0.402 | 0.373 |
| Amount of light extracted from the back surface (lm) | 0.22 | 0.27 | 0.326 | 0.332 | 0.337 |
| Total light extract amount (lm) | 0.44 | 0.678 | 0.714 | 0.734 | 0.71 |
| Transparency of concavo-convex structure layer | — | 12.14 | 11.04 | 11.40 | 11.64 |

DESCRIPTION OF NUMERALS

10 Light-emitting device
20 Light-emitting device
30 Light-emitting device
40 Light-emitting device
10U Light-emitting surface
10D Light-emitting surface
100 Light-emitting surface structure layer
110 Multi-layered body
111 Concavo-convex structure layer
112 Substrate film layer
113 First streak array
113U Flat surface portion
113S Inclined surface portion
114 Second streak array
114U Flat surface portion
114S Inclined surface portion
115 Third streak array
115U Flat surface portion
115S Inclined surface portion
116 Fourth streak array
116U Flat surface portion
116S Inclined surface portion
117 Concave portion
117B Flat surface portion
121 Bonding layer
131 Supporting substrate 140 Organic EL element
141 First electrode layer
142 Light-emitting layer
143 Second electrode layer
144 Light-emitting surface
145 Light-emitting surface
151 Sealing substrate
410U Light-emitting surface
413, 414, 415, 416 and 417 Streak array
510U Light-emitting surface
513, 514, 515 and 516 Streak array
610U Light-emitting surface
613, 614, 615, 616 and 617 Streak array
901 Projection plane
902 Projection image
1010 Light-emitting device
1010U, 1010D Light-emitting surface
1020 Light-emitting device
1030U Light-emitting surface
1040 Light-emitting device
1050U Light-emitting surface
1060U Light-emitting surface
1070U Light-emitting surface
1100 Light-emitting surface structure layer
1110 Multi-layered body
1111 Concavo-convex structure layer
1112 Substrate film layer
1113 Flat surface portion
1113X Band-shaped surface portion
1113Y Band-shaped surface portion
1113Z Intersection of band-shaped surface portion
1114 Flat surface portion
1115 Inclined surface portion
1116 Concave portion
1117 Boundary between inclined surface portion 1115 and flat surface portion 1113
1121 Bonding layer
1131 Supporting substrate
1140 Organic EL element
1141 First transparent electrode layer
1142 Light-emitting layer
1143 Second transparent electrode layer
1144, 1145 Light-emitting surface
1151 Sealing substrate
1311 Concavo-convex structure layer
1313 Flat surface portion
1314 Flat surface portion
1315 Inclined surface portion
1316 Concave portion
1317 Flat surface portion
1318 Inclined surface portion
1319 Concave portion
1461 Inert gas layer
1511 Concavo-convex structure layer
1513 Flat surface portion
1515 Inclined surface portion
1516 Concave portion
1611 Concavo-convex structure layer
1613 Flat surface portion
1614 Flat surface portion
1615 Inclined surface portion
1616 Concave portion
1617 Flat surface portion
1618 Inclined surface portion
1711 Concavo-convex structure layer
1713 Flat surface portion
1714 Flat surface portion
1715 Inclined surface portion
1716 Concave portion
1801 Cut track
1802 Cutting start position
1803 Cut track
1804 Cutting end position
1805 Metal mold
1806 Groove
1807 Concavo-convex structure layer
1808 Concave portion
1809 Flat surface portion
1810 Flat surface portion
1811 Inclined surface portion
1900 Plane parallel to flat surface portion
1901 Projection image of inclined surface

The invention claimed is:

1. A light-emitting device comprising: an organic electroluminescence element that has a light-emitting surface and emits light from the light-emitting surface; and a structure layer that is provided directly or indirectly on the light-emitting surface of the organic electroluminescence element, wherein
the structure layer has a concavo-convex structure on a surface of the structure layer, the surface of the structure layer being opposite to the organic electroluminescence element, the concavo-convex structure including a first streak array extending in a first direction that is parallel to the surface of the structure layer, a second streak array extending in a second direction that is parallel to the surface of the structure layer and intersects the first direction, and a third streak array extending in a third direction that is parallel to the surface of the structure layer and intersects the first direction and the second direction,
the concavo-convex structure includes flat surface portions parallel to the light-emitting surface and an inclined surface portion that is inclined with respect to the light-emitting surface, and
a projected area, formed by projecting the inclined surface portion upon a plane parallel to the flat surface portions in a direction perpendicular to the flat surface portions is 0.1 times or less times a total area of the flat surface portions.

2. The light-emitting device according to claim 1, wherein a maximum value of a height difference among the flat surface portions of the concavo-convex structure is 22 μm or smaller.

3. The light-emitting device according to claim 1, wherein the inclined surface portion is inclined at an inclination angle of 80° or larger and smaller than 90° with respect to the flat surface portions.

4. The light-emitting device according to claim 1, wherein a maximum value of a height difference among the flat surface portions is 0.1 μm or larger.

5. A lighting apparatus comprising the light-emitting device according to claim 1.

6. A light-emitting device comprising: an organic electroluminescence element of double side emission type that includes a first transparent electrode layer, a light-emitting layer, and a second transparent electrode layer in this order; and a light-emitting surface structure layer that is provided directly or indirectly on at least one surface of the organic electroluminescence element, wherein
the light-emitting surface structure layer has a concavo-convex structure on a surface opposite to the organic electroluminescence element, the concavo-convex structure including flat surface portions parallel to the at least one surface of the electroluminescence element and an inclined surface portion inclined with respect to the flat surface portions, the flat surface portions include a band-shaped surface portion extending in one direction, the band-shaped surface portion has a width that varies along a direction in which the band-shaped surface portion extends, and a projected area, formed by projecting the inclined surface portion upon a plane parallel to the flat surface portions in a direction perpendicular to the flat surface portions, is 0.1 times or less times a total area of the flat surface portions.

7. The light-emitting device according to claim 6, wherein a maximum value of a height difference among between the flat surface portions of the concavo-convex structure is 22 μm or smaller.

8. The light-emitting device according to claim 6, wherein the inclined surface portion is inclined at an inclination angle of 80° or larger and smaller than 90° with respect to the flat surface portions.

9. The light-emitting device according to claim 6, wherein a maximum value of a height difference among the flat surface portions is 0.1 μm or larger.

10. A lighting apparatus comprising the light-emitting device according to claim 6.

* * * * *